(12) United States Patent
Ichinose et al.

(10) Patent No.: US 11,274,919 B2
(45) Date of Patent: Mar. 15, 2022

(54) MEASUREMENT SYSTEM, SUBSTRATE PROCESSING SYSTEM, AND DEVICE MANUFACTURING METHOD

(71) Applicant: NIKON CORPORATION, Tokyo (JP)

(72) Inventors: Go Ichinose, Fukaya (JP); Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/279,639

(22) Filed: Feb. 19, 2019

(65) Prior Publication Data

US 2019/0257647 A1    Aug. 22, 2019

Related U.S. Application Data

(63) Continuation of application No. PCT/JP2017/029854, filed on Aug. 22, 2017.

(30) Foreign Application Priority Data

Aug. 24, 2016    (JP) .............................. JP2016-164168

(51) Int. Cl.
*G03F 7/20* (2006.01)
*G03F 9/00* (2006.01)
(Continued)

(52) U.S. Cl.
CPC .............. *G01B 11/272* (2013.01); *G03F 1/42* (2013.01); *G03F 7/2022* (2013.01);
(Continued)

(58) Field of Classification Search
CPC .. G03F 9/00; G03F 9/70; G03F 9/7003–7034; G03F 9/708; G03F 9/7084;
(Continued)

(56) References Cited

U.S. PATENT DOCUMENTS 5,448,332 A    9/1995   Sakakibara et al.
5,684,565 A    11/1997  Oshida et al.
(Continued)

FOREIGN PATENT DOCUMENTS

CN    102549501 A    7/2012
EP       1420298 A2    5/2004
(Continued)

OTHER PUBLICATIONS

Oct. 24, 2017 International Search Report issued in International Patent Application PCT/JP2017/029854.
(Continued)

*Primary Examiner* — Christina A Riddle
(74) *Attorney, Agent, or Firm* — Oliff PLC

(57) ABSTRACT

A measurement system to be used in a micro-device manufacturing line is equipped with: a plurality of measurement devices which performs measurement processing on each substrate; and a controller that can control the plurality of measurement devices, and the plurality of measurement devices includes at least one first measurement device which acquires position information of a plurality of marks formed on a substrate.

37 Claims, 16 Drawing Sheets

(51) Int. Cl.
*G01B 11/27* (2006.01)
*G03F 1/42* (2012.01)
*G03F 7/16* (2006.01)
*G03F 7/30* (2006.01)

(52) U.S. Cl.
CPC ........ *G03F 7/2041* (2013.01); *G03F 7/70633* (2013.01); *G03F 7/70775* (2013.01); *G03F 9/7011* (2013.01); *G01B 2210/56* (2013.01); *G03F 7/16* (2013.01); *G03F 7/30* (2013.01)

(58) Field of Classification Search
CPC ............. G03F 7/70483; G03F 7/70491; G03F 7/70508; G03F 7/70525; G03F 7/70533; G03F 7/70616; G03F 7/70641; G03F 7/70666–70683; G03F 7/70716; G03F 7/70725; G03F 7/70758; G03F 7/70775; G03F 7/7085; G03F 7/70991; G03F 7/70633; G03F 7/2041; G03F 7/2022; G03F 7/30; G03F 7/16; G03F 7/70258; G03F 1/42; G03F 1/80; G03F 9/7011; G01B 11/272; G01B 2210/56; G01B 21/00; G01B 21/30; H01L 21/68; H01L 21/682
USPC ..... 355/52, 53–55, 67–77; 250/492.1, 492.2, 250/492.22, 492.23, 493.1; 356/399–401, 356/600, 601–612, 614, 624, 625, 630
See application file for complete search history.

(56) References Cited

U.S. PATENT DOCUMENTS

| | | | |
|---|---|---|---|
| 5,969,441 A | 10/1999 | Loopstra et al. | |
| 6,208,407 B1 | 3/2001 | Loopstra | |
| 6,590,634 B1* | 7/2003 | Nishi | G03F 7/70216 355/53 |
| 6,838,686 B2* | 1/2005 | Kataoka | G03F 9/7003 250/492.22 |
| 6,876,946 B2 | 4/2005 | Yasuda et al. | |
| 6,952,253 B2 | 10/2005 | Lof et al. | |
| 7,238,931 B2 | 7/2007 | Nabeshima et al. | |
| 7,561,280 B2 | 7/2009 | Schluchter et al. | |
| 7,728,953 B2 | 6/2010 | Suzuki et al. | |
| 9,158,212 B2 | 10/2015 | Ishigo | |
| 2002/0034831 A1 | 3/2002 | Kataoka | |
| 2002/0042664 A1 | 4/2002 | Kikuchi | |
| 2002/0165636 A1* | 11/2002 | Hasan | G05B 23/0216 700/121 |
| 2003/0025890 A1 | 2/2003 | Nishinaga | |
| 2005/0280791 A1 | 12/2005 | Nagasaka et al. | |
| 2006/0209414 A1 | 9/2006 | Van Santen et al. | |
| 2006/0231206 A1 | 10/2006 | Nagasaka et al. | |
| 2006/0261288 A1 | 11/2006 | Van Santen | |
| 2007/0159632 A1 | 7/2007 | Shibazaki | |
| 2007/0288121 A1 | 12/2007 | Shibazaki | |
| 2008/0013089 A1 | 1/2008 | Ishii et al. | |
| 2008/0088843 A1* | 4/2008 | Shibazaki | G03F 9/7003 356/399 |
| 2008/0286885 A1 | 11/2008 | Izikson et al. | |
| 2009/0009741 A1* | 1/2009 | Okita | G03F 7/70516 355/53 |
| 2009/0153825 A1 | 6/2009 | Edart et al. | |
| 2009/0225331 A1 | 9/2009 | Van Haren | |
| 2010/0073652 A1 | 3/2010 | Shibazaki | |
| 2010/0073653 A1 | 3/2010 | Shibazaki | |
| 2010/0123886 A1* | 5/2010 | Bijnen | G03F 9/7003 355/53 |
| 2010/0245848 A1 | 9/2010 | Sakamoto | |
| 2011/0007295 A1* | 1/2011 | Ichinose | G03F 7/70725 355/72 |
| 2011/0053061 A1 | 3/2011 | Shibazaki | |
| 2012/0154823 A1 | 6/2012 | Sakamoto | |
| 2012/0208301 A1 | 8/2012 | Izikson et al. | |
| 2012/0244461 A1* | 9/2012 | Nagai | G03F 7/70633 430/30 |
| 2013/0044307 A1 | 2/2013 | Shibazaki | |
| 2013/0222777 A1* | 8/2013 | Ishigo | G03F 9/7019 355/52 |
| 2013/0230375 A1* | 9/2013 | Tung | H01L 21/67706 414/592 |
| 2014/0132940 A1 | 5/2014 | Yoda | |
| 2018/0039191 A1* | 2/2018 | Shibazaki | G01B 11/00 |
| 2018/0046096 A1 | 2/2018 | Shibazaki | |

FOREIGN PATENT DOCUMENTS

| | | |
|---|---|---|
| EP | 3264179 A1 | 1/2018 |
| JP | H07-086126 A | 3/1995 |
| JP | H10-284396 A | 10/1998 |
| JP | 2001-274073 A | 10/2001 |
| JP | 2006-245030 A | 9/2006 |
| JP | 2007-184343 A | 7/2007 |
| JP | 2008-004581 A | 1/2008 |
| JP | 2009-147317 A | 7/2009 |
| JP | 2009-212518 A | 9/2009 |
| JP | 2010-225940 A | 10/2010 |
| JP | 2011-258987 A | 12/2011 |
| JP | 2012-099850 A | 5/2012 |
| JP | 2012-227551 A | 11/2012 |
| JP | 2013-153167 A | 8/2013 |
| JP | 2013-175500 A | 9/2013 |
| JP | 2013-239721 A | 11/2013 |
| JP | 2014-192400 A | 10/2014 |
| JP | 2015-535615 A | 12/2015 |
| WO | 2004/055803 A1 | 7/2004 |
| WO | 2004/057590 A1 | 7/2004 |
| WO | 2007/102484 A1 | 9/2007 |
| WO | 2011/024985 A1 | 3/2011 |
| WO | WO-2016136689 A1 * | 9/2016 ............. G01B 11/00 |

OTHER PUBLICATIONS

Oct. 24, 2017 Written Opinion issued in International Patent Application PCT/JP2017/029854.
Mar. 12, 2020 Extended Search Report issued in European Patent Application No. 17843551.7.
Jan. 23, 2020 Office Action issued in Japanese Patent Application No. 2018-535674.
Aug. 21, 2020 Office Action issued in Chinese Patent Application No. 201780065873.2.
Sep. 10, 2020 Office Action issued in Japanese Patent Application No. 2018-535674.
May 27, 2021 Office Action issued in Chinese Patent Application No. 201780065873.2.
Feb. 16, 2021 Office Action issued in Japanese Patent Application No. 2018-535674.
Oct. 14, 2021 Office Action issued in Taiwan Patent Application No. 106128770.
Jan. 4, 2022 Decision of Rejection issued in Chinese Patent Application No. 201780065873.2.

* cited by examiner

MEASUREMENT SYSTEM, SUBSTRATE PROCESSING SYSTEM, AND DEVICE MANUFACTURING METHOD

CROSS-REFERENCE TO RELATED APPLICATIONS

This application is a continuation of International Application PCT/JP2017/029854, with an international filing date of Aug. 22, 2017, the disclosure of which is hereby incorporated herein by reference in its entirety, which was not published in English.

BACKGROUND OF THE INVENTION

Field of the Invention

The present invention relates to a measurement system, a substrate processing system, and a device manufacturing method, and more particularly to a measurement system used in a micro-device manufacturing line, a substrate processing system that includes the measurement system, and a device manufacturing method that uses an exposure apparatus structuring a part of the substrate processing system.

Description of the Background Art

In a lithography process to manufacture micro-devices such as semiconductors, the devices are formed by overlaying multiple layers of circuit patterns on a substrate (hereinafter generally referred to as a wafer) such as wafer or a glass plate, however when the overlay accuracy between the layers is poor, the micro-devices will not be able to exhibit predetermined circuit characteristics and in some cases may be a defective product. Therefore, normally, a mark (an alignment mark) is formed in advance on each of a plurality of shot areas on the wafer, and position of the mark (coordinate value) on a stage coordinate system of an exposure apparatus is detected. After this, based on the mark position information and position information which is known of a pattern (e.g., a reticle pattern) to be newly formed, wafer alignment in which position of one shot area on the wafer is set with respect to the pattern is performed.

As a method of wafer alignment, to keep balance with throughput, enhanced global alignment (EGA), in which alignment marks of only some shot areas (also called a sample shot area or an alignment shot area) on the wafer are detected and a statistical method is used to calculate an arrangement of the shot areas on the wafer, has become mainstream.

However, in the lithography process, when overlay exposure is performed on the wafer, in the wafer that has gone through processing processes such as resist coating, developing, etching, CVD (Chemical Vapor Deposition), and CMP (Chemical Mechanical Polishing), distortion may occur due to the processes in the arrangement of the shot areas on the previous layer, and the distortion may cause a decrease in the overlay accuracy. Taking such a point into consideration, recent exposure apparatuses have a grid correction function and the like for correcting not only a primary component of wafer deformation, but also a non-linear component and the like of the shot arrangement that occurs due to the processes (for example, refer to U.S. Patent Application Publication No. 2002/0042664).

However, requirements on overlay accuracy is becoming more and more severe due to finer integrated circuits, therefore, it is essential to increase the number of sample shot areas, that is, to increase the number of marks that should be detected to perform correction of higher accuracy.

Also, in a twin-stage type exposure apparatus equipped with two stages where the wafer is mounted, since exposure on the wafer can be performed concurrently on one stage while detection of marks and the like on the wafer can be executed on the other stage, it is possible to increase the number of sample shot areas, without lowering the throughput as much as possible.

However, requirements on overlay accuracy now is tighter than before, and it is becoming difficult, even in a twin-stage type exposure apparatus, to detect enough number of marks to achieve the overlay accuracy that is required, without decreasing the throughput.

SUMMARY OF THE INVENTION

According to a first aspect, there is provided a measurement system used in a manufacturing line for micro-devices, comprising: a plurality of measurement devices, each of which performs measurement processing on a substrate; and a controller which can control the plurality of measurement devices, wherein the plurality of measurement devices includes at least one first measurement device which acquires position information of a plurality of marks formed on the substrate.

According to a second aspect, there is provided a measurement system used in a manufacturing line for micro-devices, comprising: a first measurement device which acquires position information of a plurality of marks formed on a substrate; and a controller which can control the first measurement device, wherein the first measurement device acquires position information of a plurality of marks formed on a substrate on which exposure and developing processing have been applied.

According to a third aspect, there is provided a measurement system used in a manufacturing line for micro-devices, comprising: a first measurement device which acquires position information of a plurality of marks formed on a substrate; and a controller which can control the first measurement device, wherein the first measurement device acquires position information of a plurality of marks formed on a substrate before coating of a sensitive agent, after etching processing and film deposition processing are performed.

According to a fourth aspect, there is provided a substrate processing system, comprising: the measurement system relating to the third aspect; and an exposure apparatus that has a substrate stage on which the substrate that has completed measurement of position information of the plurality of marks by the first measurement device included in the measurement system is mounted, and to the substrate mounted on the substrate stage, performs alignment measurement in which position information of a part of marks selected from a plurality of marks on the substrate is acquired and exposure in which the substrate is exposed with an energy beam.

According to a fifth aspect, there is provided a substrate processing system, comprising: the measurement system that is one of the measurement system relating to the first aspect and the measurement system relating to the second aspect; and an exposure apparatus that has a substrate stage on which the substrate that has completed measurement of position information of the plurality of marks by the first measurement device included in the measurement system is mounted, and to the substrate mounted on the substrate stage, performs alignment measurement in which position information of a part of marks selected from a plurality of marks on the substrate is acquired and exposure in which the substrate is exposed with an energy beam.

According to a sixth aspect, there is provided a device manufacturing method, comprising: exposing a substrate using an exposure apparatus which structures a part of one of the substrate processing system relating to the fourth aspect and the substrate processing system relating to the fifth aspect, and developing the substrate which has been exposed.

BRIEF DESCRIPTION OF DRAWINGS

In the accompanying drawings;

FIG. 2 is a perspective view of an external appearance showing a measurement system that the substrate processing system in FIG. 1 is equipped with;

FIG. 12 is a block diagram showing an input output relation of an exposure controller that the exposure apparatus is equipped with;

DESCRIPTION OF EMBODIMENTS

First Embodiment

Figure 1:
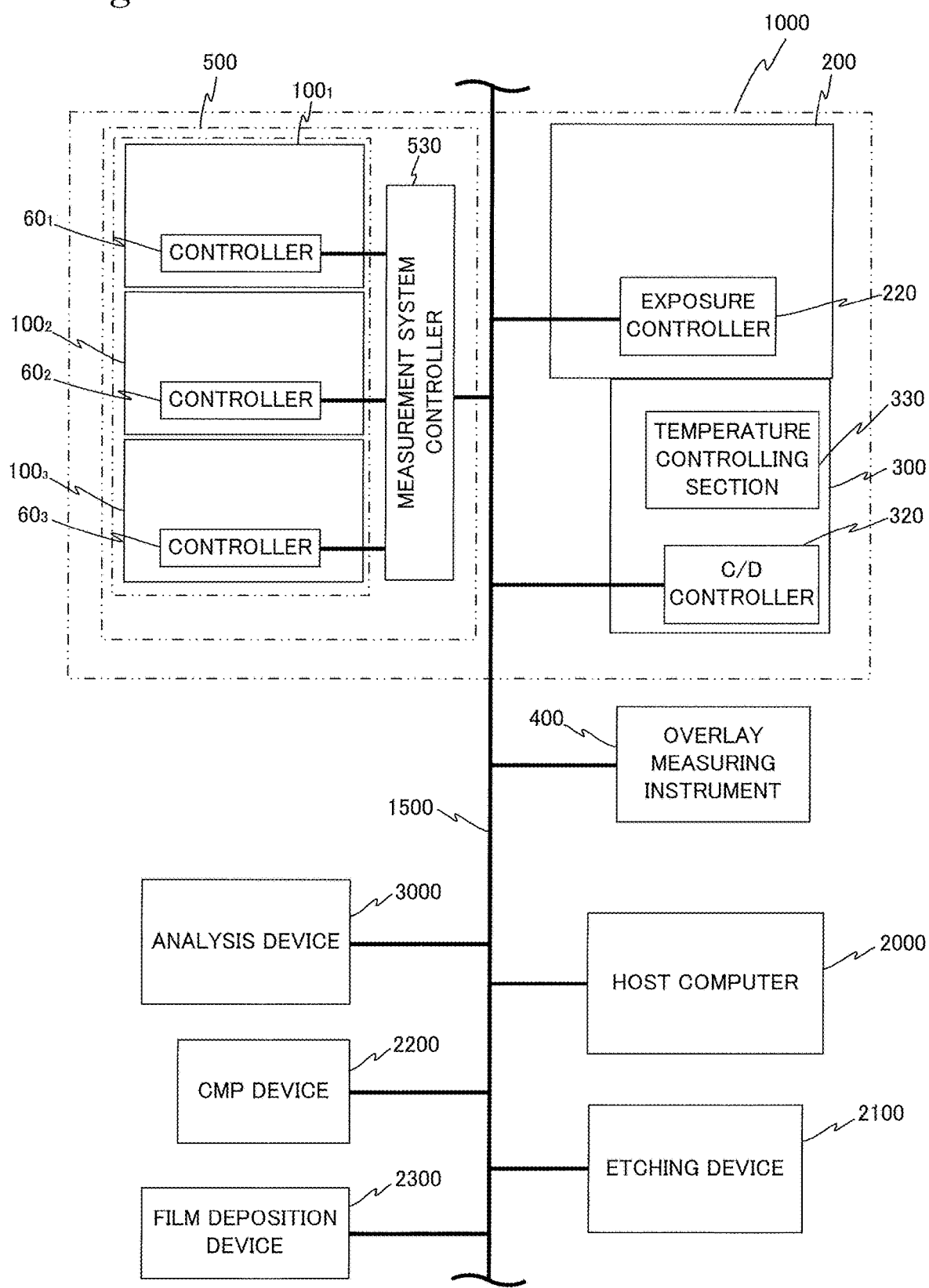
FIG. 1 is a block diagram showing a substrate processing system according to a first embodiment, along with other apparatuses to be used in a micro-device manufacturing line.

Hereinafter, a first embodiment will be described, based on FIGS. 1 to 13B. FIG. 1 is a block diagram, showing a substrate processing system 1000 according to a first embodiment used in a manufacturing line for manufacturing micro-devices (e.g., semiconductor devices), along with other devices used in the manufacturing line.

Substrate processing system 1000, as is shown in FIG. 1, is equipped with an exposure apparatus 200 and a coater/developer 300 (resist coating/developing apparatus) that are connected in-line with each other. Also, substrate processing system 1000, as is shown in FIG. 1, is equipped with a measurement system 500. Hereinafter, coater/developer 300 will be expressed shortly referred to as C/D 300. Note that connected in-line means that different apparatuses are connected so that a carrying route of a wafer (substrate) is substantially connected, and in the description, terms such as "connected in-line" and "in-line connection" will be used in such a meaning. For example, in the case two different apparatuses are connected in-line, a wafer (substrate) that has finished processing in one apparatus can be sequentially carried to the other apparatus using a carrier mechanism such as a robot arm. Note that the case in which the different apparatuses are connected via an interface section may also be called an "in-line connection."

Measurement system 500, here, is equipped with three measurement devices $100_1$ to $100_3$ placed adjacent to one another in a predetermined direction inside a same chamber 502 (refer to FIG. 2), a measurement system controller 530 which generally controls the entire measurement system 500, and the like. Each of the three measurement devices $100_1$ to $100_3$ has a controller $60_i$ (i=1 to 3), and each of the controllers $60_i$ is connected to measurement system controller 530. Note that each of the three measurement devices $100_1$ to $100_3$ may be controlled by measurement system controller 530, without being equipped with controller $60_i$ (i=1 to 3).

Exposure apparatus 200 and C/D 300 that substrate processing system 1000 is equipped with both have a chamber, and the chambers are disposed adjacent to each other.

An exposure controller 220 that exposure apparatus 200 has, a C/D controller 320 that C/D 300 has, and measurement system controller 530 are connected to one another via a local area network (LAN) 1500. To LAN 1500, a host computer (HOST) 2000 that controls the entire manufacturing line, an analysis device 3000, and a group of devices performing various types of processing (processing of a pre-process in a wafer process) under the control of host computer 2000 are also connected. Of the group of devices, FIG. 1 representatively shows an overlay measuring instrument 400, an etching device 2100, a CMP device 2200, and a film deposition device 2300 such as a CVD device. Other than these apparatuses, a cleaning device, an oxidation/diffusion device, an ion implantation device and the like are connected to LAN 1500.

Note that substrate processing system 1000 may include at least one of host computer 2000, analysis device 3000, overlay measuring instrument 400, etching device 2100, CMP device 2200, and film deposition device 2300.

Figure 2:
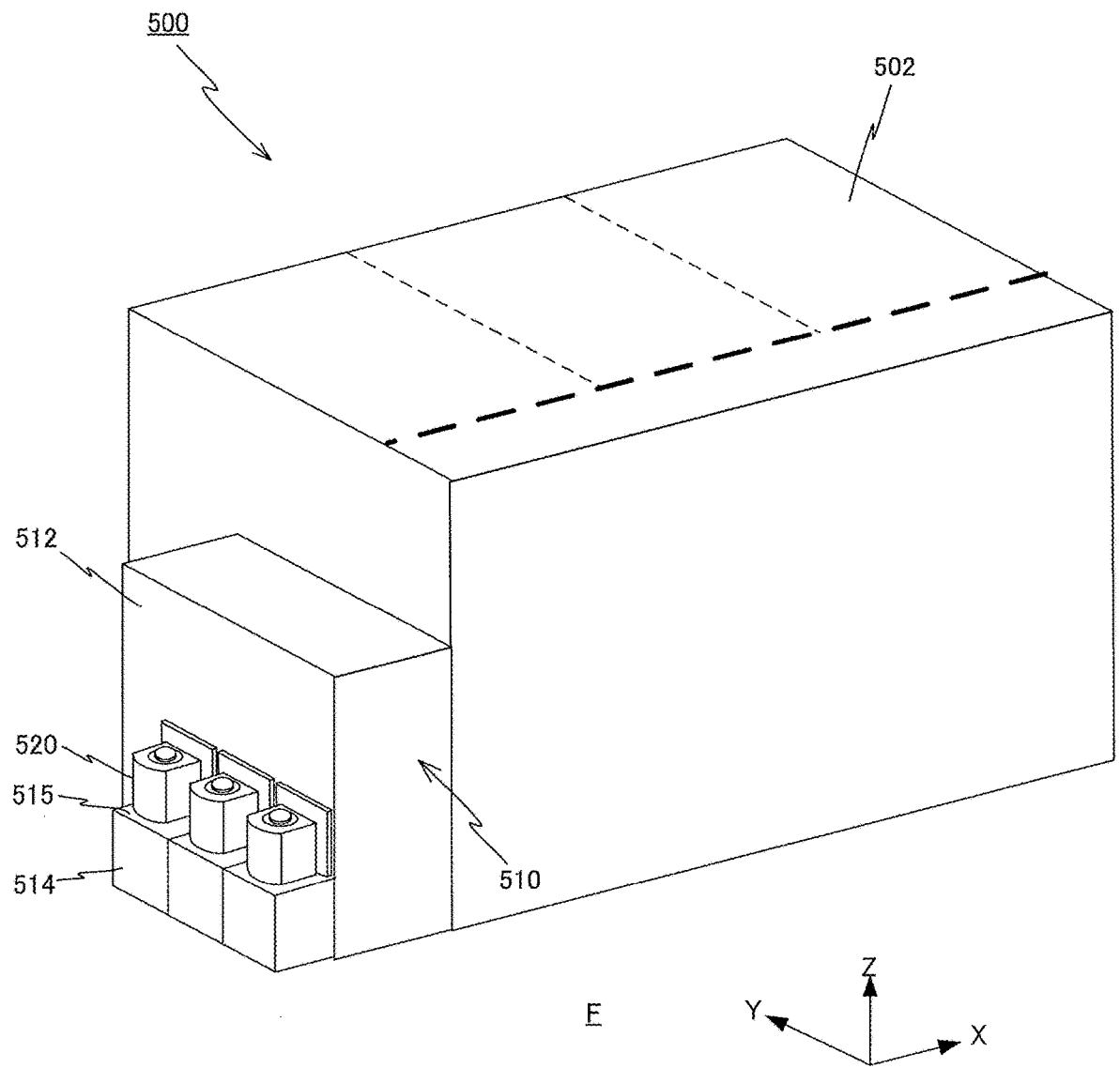

First of all, measurement system 500 will be described. FIG. 2 shows a perspective view of an external appearance of measurement system 500. Measurement system 500 is installed on a floor F of a clean room apart from other devices that structure substrate processing system 1000. That is, measurement system 500 is not connected in-line with exposure apparatus 200 and C/D 300.

Measurement system 500 is equipped with chamber 502 where the three measurement devices $100_1$ to $100_3$ are arranged, and a carrier system 510 arranged at one side of chamber 502. In the embodiment, carrier system 510 is an EFEM (Equipment Front End Module) system. Hereinafter, carrier system 510 may be called EFEM system 510.

Note that as it will be described later on, while carrier system 510 of the embodiment is for FOUP (Front-Opening Unified Pod), the carrier is not limited to FOUP, and other types of carriers (e.g., SMIF pod) that can house one or a plurality of wafers may be handled in carrier system 510.

In the description below, a direction in which chamber 502 and EFEM system 510 are arranged will be described as an X-axis direction, a direction perpendicular to the X-axis within a plane parallel to floor surface F will be described as a Y-axis direction, and a direction orthogonal to the X-axis and the Y-axis will be described as a Z-axis direction.

Figure 3:
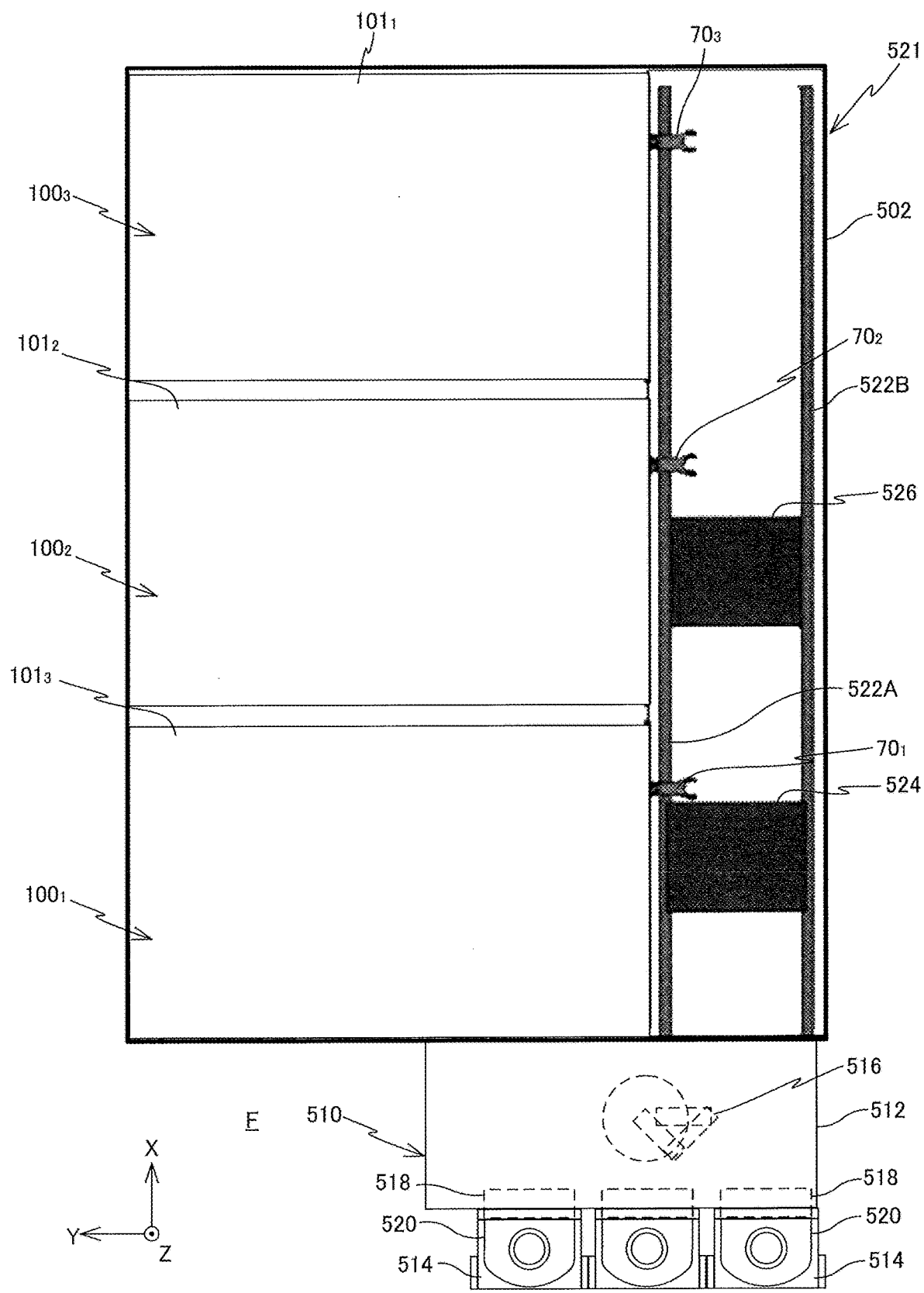
FIG. 3 is a planar view showing the measurement system in FIG. 1 with the ceiling section of a chamber removed.

As is shown in FIG. 2, chamber 502 has a rectangular parallelepiped shape, and in a first space therein, as is shown in FIG. 3, measurement devices $100_1$ to $100_3$ are housed arranged in the X-axis direction. FIG. 3 shows a planar view of measurement system 500 with the ceiling section of chamber 502 removed, and in FIG. 3, a chamber $101_i$ ($i=1$ to 3) that each of measurement devices $100_1$ to $100_3$ has is shown. Note that each of measurement devices $100_1$ to $100_3$ does not have to be equipped with chamber $101_i$.

Since the plurality of measurement devices $100_1$ to $100_3$ are arranged in the X-axis direction, measurement system 500 can be equipped with the plurality of measurement devices $100_1$ to $100_3$ without increasing the width in the Y-axis direction of measurement system 500. In a factory where measurement system 500 and the like is installed, a pathway for operators extends in the Y-axis direction, and devices that perform various types of processing described above (such as etching device 2100 and CMP device 2200) are arranged along the pathway. Consequently, to effectively use floor surface F of the factory, it is important to suppress the width in the Y-axis direction of measurement system 500.

Also, on the −Y side of the first space in chamber 502, a carrying system 521 is arranged that can deliver/receive a wafer to/from each of measurement devices $100_1$ to $100_3$. Note that in the description below, for the sake of convenience, a space on the −Y side of the first space where carrying system 521 is installed is to be called a second space. In FIG. 2, the bold broken line shows a virtual partition between the first space and the second space.

Adjacent to chamber 502 on the −X side (front surface side), EFEM system 510 is installed on floor surface F. EFEM system 510 is a module equipment equipped with an EFEM main body 512 in which a robot for carrying wafers is installed inside, and a loading port attached to the −X side (front surface side) of EFEM main body 512. To EFEM main body 512 at the front surface side, a plurality of loading ports 514 (may also be called a carrier mounting device) for FOUP is provided arranged in the Y-axis direction. Note that in the embodiment, while EFEM main body 512 has three loading ports 514, the number of loading ports is not limited to three, and may be one, two, four, or more than four. Here, FOUP is a carrier that is aimed to carry and store a wafer used in a semiconductor factory of a mini-environment method specified in SEMI standard E47.1, and is a front opening type cassette integrated carriage/storage box. In FIGS. 2 and 3, a FOUP 520 is installed on each of the three loading ports 514, and in the FOUP, at least one wafer is housed as a measurement target.

In the embodiment, although it is omitted in the drawings, a track rail for OHT (Overhead Hoist Transport) is provided near the ceiling of the clean room directly above the three loading ports 514. OHT is an unmanned carrier that travels in a space of a ceiling level, and by this OHT, FOUP 520 is delivered to loading port 514.

Each of the three loading ports 514 has a mounting section 515 and an open/close mechanism 518 that opens/closes the cover of FOUP 520 mounted on mounting section 515. Open/close mechanism 518 is provided in the front part of EFEM main body 512 that faces FOUP 520 mounted on mounting section 515 of loading port 514, and can open/close the cover of FOUP 50 while maintaining the air-tight state inside FOUP 520 with respect to the outside. Since this type of open/close mechanism is known, description on the structure and the like of open/close mechanism 518 will be omitted.

Inside EFEM main body 512, a wafer carrier robot 516 (refer to FIG. 3) is provided that can have access to the inside of the three FOUPs in a state where the cover is open to put in and take out the wafer. Note that to the upper part of EFEM main body 512, a FFU (Fan Filter Unit, not shown) may be provided to keep the degree of cleanliness inside EFEM main body 512, and temperature controlled air from an air conditioner may be sent to the inside of EFEM main body 512, via FFU. Note that a buffer for stabilizing the temperature of the wafer using the temperature controlled air from the air conditioner may be provided within EFEM main body 512.

To the part on the back surface side of EFEM main body 512 facing the second space of chamber 502, an opening is formed which is opened/closed by an open/close member.

Each part (such as robot 516 and open/close mechanism 518) structuring EFEM system 510 is controlled by measurement system controller 530 (refer to FIG. 1).

Inside the second space of chamber 502, as is shown in FIG. 3, carrying system 521 is installed. Provided in the carrying system are; guides 522A and 522B that cover almost the whole length of chamber 502 extending in the X-axis direction on each of one side and the other side in the Y-axis direction within the second space, a carrier member 524 used for loading that can move back and forth along guide 522A, and a carrier member 526 used for unloading that can move back and forth along guide 522B.

Carrier member 524 for loading can be moved along guide 522A by a linear motor (will be written as linear motor 522A using the same reference code as the guide in which the stator is incorporated) that has a stator incorporated in guide 522A and a mover provided in carrier member 524. Also, carrier member 526 for unloading can be moved along guide 522B by a linear motor (will be written as linear motor 522B using the same reference code as the guide in which the stator is incorporated) that has a stator incorporated in guide 522B and a mover provided in carrier member 526. Linear motors 522A and 522B are controlled by measurement system controller 530. Note that carrier members 524 and 526 may be made to move in a non-contact manner using an air slider or the like. Also, the drive mechanism to move carrier members 524 and 526 is not limited to the linear motors (522A and 522B) described above, and may be a structure using a rotation motor and a ball screw mechanism.

Guide 522A is arranged at a position higher than that of guide 522B. Therefore, carrier member 524 for loading moves in the space above carrier member 526 for unloading.

Note that in carrying system 521 described above, carrier member 524 and guide 522A may be used for loading/ unloading a wafer, and carrier member 526 and guide 522B may be used for loading/unloading a wafer.

Also, while carrying system 521 described above can deliver/receive a wafer to/from each of the plurality of measurement devices $100_1$ to $100_3$, carrying system 521 may have a carrier device (including the guide and the carrier member) that delivers/receives a wafer only to/from measurement device $100_1$, a carrier device (including the guide and the carrier member) that delivers/receives a wafer only to/from measurement device $100_2$, and a carrier device (including the guide and the carrier member) that delivers/ receives a wafer only to/from measurement device $100_3$. In this case, each of the carrier devices may have a guide for loading and a carrier member, and a guide for unloading and a carrier member, or a guide used for both loading and unloading and a carrier member.

As is shown in FIG. 3, in measurement device $100_i$, a wafer carrying system $70_i$ (i=1 to 3) is provided that has a multi-joint type robot which performs delivery/receiving of a wafer to/from carrier member 524 and carrier member 526. Wafer carrying system $70_i$ (i=1 to 3) performs delivery/ receiving of a wafer to/from carrier member 524 and carrier member 526 via an opening of chamber $101_i$.

Carrier member 524 receives a wafer subject to measurement processing inside FOUP 520 from robot 516 at a wafer delivery position (loading side wafer delivery position) set near the dividing line between main body 512 and chamber 502, and carries the wafer to the wafer delivery position between wafer carrying system $70_i$ (i=one of 1 to 3) and measurement device $100_i$. The wafer subject to measurement processing described above, in the embodiment, is a wafer on which at least exposure of a first layer has been completed, and after development has been completed, necessary treatment of the pre-process processing in the wafer process such as etching, oxidation/diffusion, ion implantation, and flattening (CMP) has been applied, and is a wafer prior to carriage into C/D 300 for resist coating.

Carrier member 526 receives the wafer on which measurement has been completed from wafer carrying system $70_i$ (i=one of 1 to 3), and carries the wafer to an unloading side wafer delivery position (a position below the loading side wafer delivery position described earlier) set near the dividing line between EFEM main body 512 and chamber 502.

Robot 516 carries (returns) the wafer that has undergone measurement processing carried to the unloading side wafer delivery position by carrier member 526 into FOUP 520.

Referring back to FIG. 1, as each of measurement devices $100_1$ to $100_3$, in the embodiment, a measurement device of a similar structure is used.

Note that in the embodiment, while an example was shown of a case in which by carrying system 521 that performs delivery of the wafer between measurement device $100_i$ such as carrier member 524 and carrier member 526 being arranged in the second space of chamber 502, the space in which the wafer is carried by carrier member 524 and carrier member 526 is consequently an air-tight space, the embodiment is not limited to this, and the three measurement devices $100_1$ to $100_3$ may be arranged on floor surface F, and along with these measurement devices $100_1$ to $100_3$ (whether housed in the same chamber or not), another chamber may be provided in which an air-tight chamber where carrying system 521 is housed inside is formed.

Also, instead of carrier members 524 and 526, a multi-joint type robot that can move back and forth along a guide may be used. In this case, wafer carrying system $70_i$ does not have to be equipped with the multi-joint type robot, and only has to be equipped with a wafer holding section for loading and a wafer holding section for unloading where delivery of the wafer is performed with the multi-joint type robot of carrying system 521.

Also, in the case the multi-joint type robot is used instead of carrier members 524 and 526, EFEM system 510 does not have to be equipped with robot 516. In this case, the multi-joint type robot of carrying system 521 may take out the wafer from FOUP 520, or return the wafer to FOUP 520.

Figure 4:
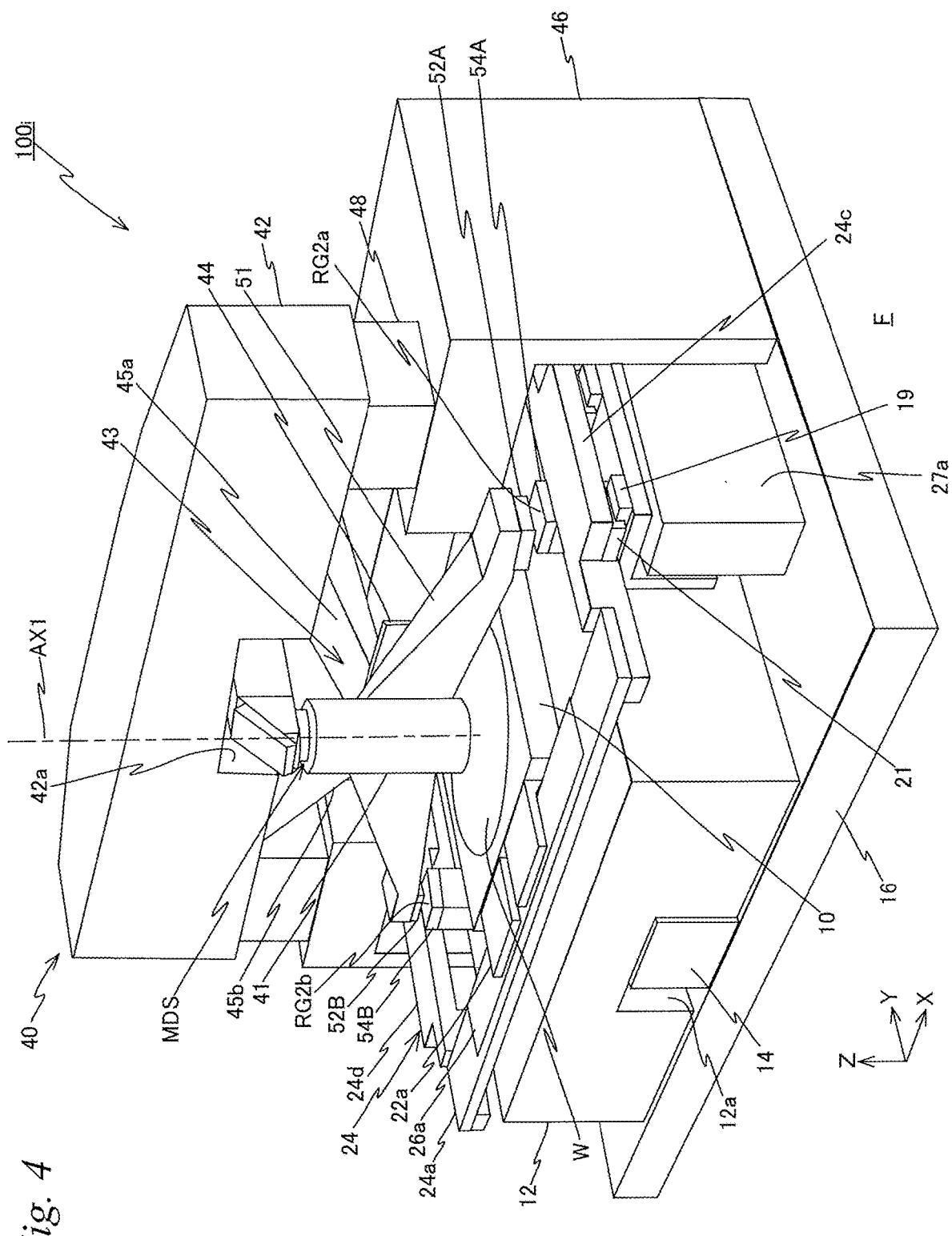
FIG. 4 is a perspective view schematically showing a structure of a measurement device that structures a part of the measurement system.

Here, measurement device $100_i$ will be described in detail. FIG. 4 schematically shows a perspective view of a structure of measurement device $100_i$. Note that while measurement device $100_i$ shown in FIG. 4 is actually structured by chamber $101_i$ described earlier and the structure part housed inside chamber $101_i$, in the description below, the description related to chamber $101_i$ will be omitted. In measurement device $100_i$ according to the embodiment, a mark detection system MDS is provided as is will be described later on, and in the description below, a direction in an optical axis AX1 of mark detection system MDS is to coincide with the Z-axis direction described earlier, a direction in which a movable stage to be described later on moves in long strokes within an XY plane orthogonal to the Z-axis direction is to coincide with the Y-axis direction described earlier, and rotation (tilt) directions around the X-axis, the Y-axis, and the Z-axis will be described as θx, θy, and θz directions, respectively. Here, mark detection system MDS has a cylindrical barrel section 41 provided at its lower end (tip), and inside barrel section 41, an optical system (dioptric system) is housed, consisting of a plurality of lens elements having a common optical axis AX1 in the Z-axis direction. In the description, for the sake of convenience, optical axis AX1 of the dioptric system inside barrel section 41 is to be referred to as optical axis AX1 of mark detection system MDS.

Figure 5A:
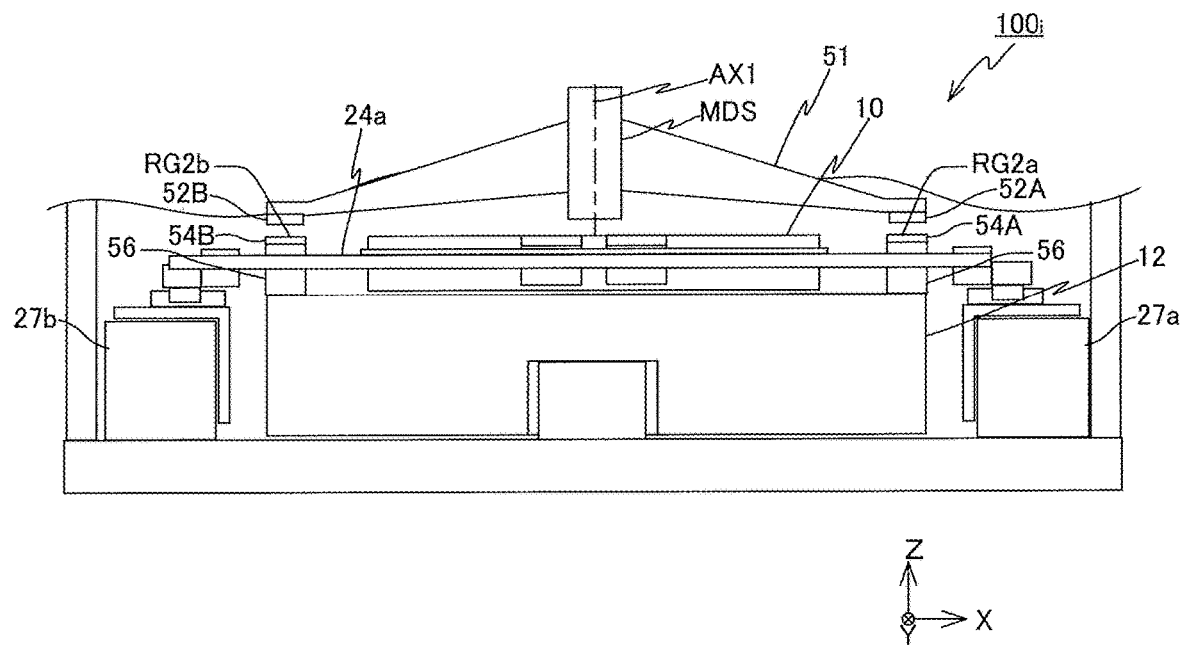
FIG. 5A is a partly omitted front view (a view when viewed from the −Y direction) of the measurement device in FIG. 4.
Figure 5B:
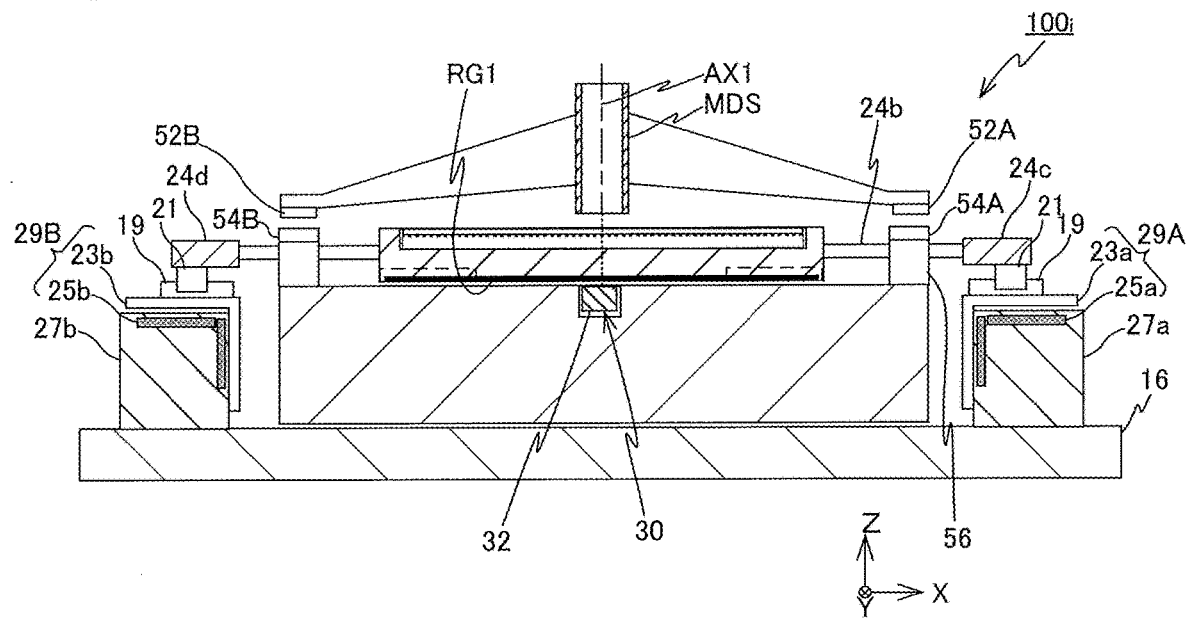
FIG. 5B is a partly omitted cross-sectional view of the measurement device when a cross-section is taken in the XZ plane that passes through an optical axis AX1 of a mark detection system.
Figure 6:
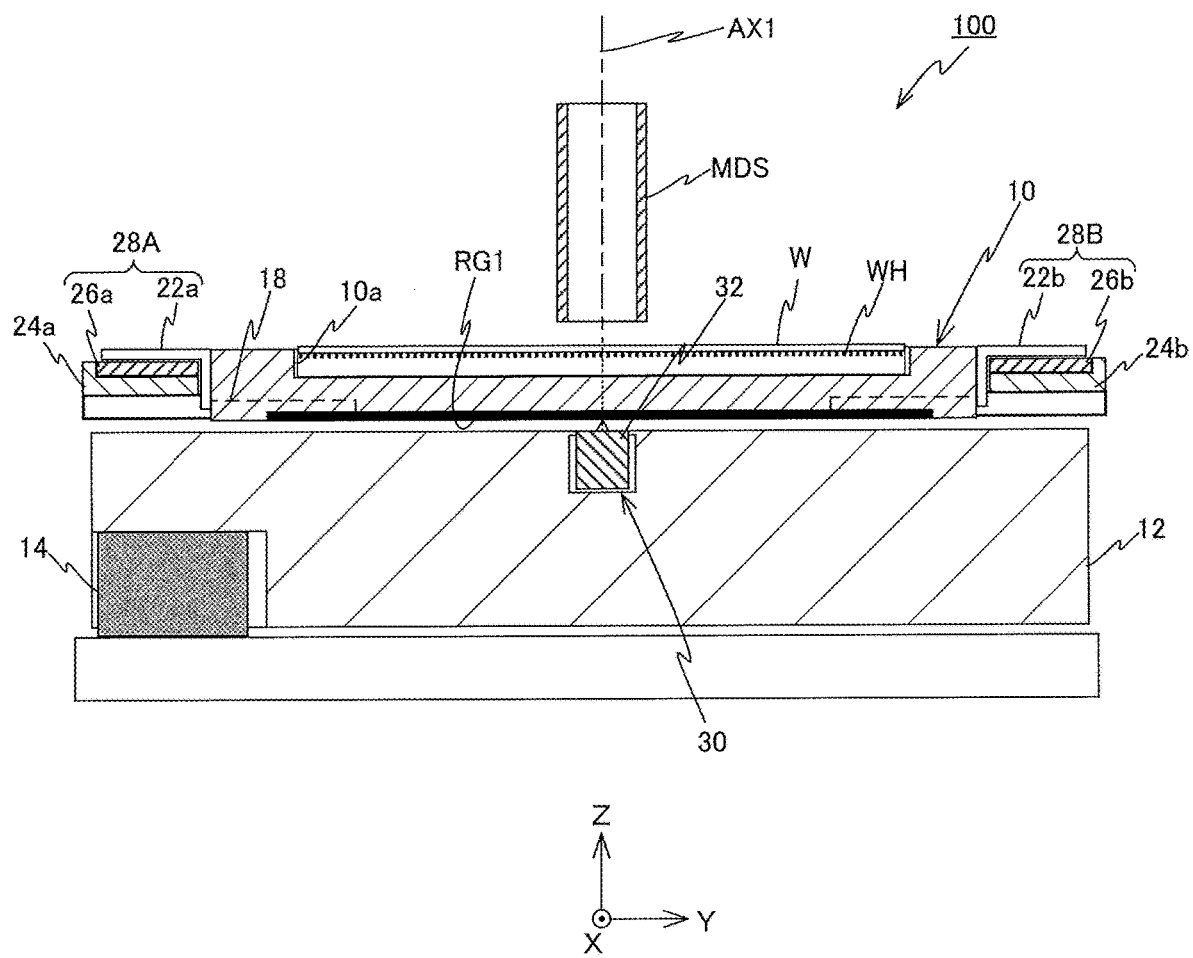
FIG. 6 is a partly omitted cross-sectional view of the measurement device when a cross-section is taken in the YZ plane that passes through optical axis AX1 of the mark detection system.

FIG. 5A shows a partly omitted front view (a view when viewed from the −Y direction) of measurement device $100_i$ in FIG. 4, and FIG. 5B shows a partly omitted cross-sectional view of measurement device $100_i$ when a cross-section is taken in the XZ plane that passes through optical axis AX1. Also, FIG. 6 shows a partly omitted cross-sectional view of measurement device $100_i$ when a cross-section is taken in the YZ plane that passes through optical axis AX1.

Measurement device $100_i$, as is shown in FIG. 4, is equipped with; a surface plate 12 having an upper surface almost parallel to the XY plane orthogonal to optical axis AX1, a wafer slider (hereinafter shortly referred to as a slider) 10 arranged on surface plate 12 that can move in predetermined strokes in the X-axis and the Y-axis directions with respect to surface plate 12 while holding a wafer W and can also move finely (fine displacement) in the Z-axis, the θx, the θy and the θz directions, a drive system 20 (refer to FIG. 9) that drives slider 10, a first position measurement system 30 (not shown in FIG. 4, refer to FIGS. 6 and 9) that measures position information of slider 10 with respect to surface plate 12 in each of the X-axis, the Y-axis, the Z-axis, the θx, the θy and the θz directions (hereinafter referred to as directions of six degrees of freedom), a measurement unit 40 that has mark detection system MDS for detecting a mark on wafer W mounted on (held by) slider 10, a second position measurement system 50 (refer to FIG. 9) that measures relative position information between mark detection system MDS (measurement unit 40) and surface plate 12, and a controller $60_i$ (not shown in FIG. 4, refer to FIG. 9) that acquires measurement information according to the first position measurement system 30 and measurement information according to the second position measurement system 50 and obtains position information of a plurality of marks on wafer W held by slider 10 using mark detection system MDS, while controlling drive of slider 10 by drive system 20.

Surface plate 12 consists of a rectangular parallelepiped member having a rectangular shape in a planar view, and its upper surface is finished so that the degree of flatness is extremely high to form a guide surface on movement of slider 10. As the material for surface plate 12, a material of low thermal expansion coefficient also called a zero thermal expansion material is used, such as, e.g. an invar alloy, an ultra-low expansion steel, or an ultra-low expansion glass ceramics.

In surface plate 12, a total of three cutout shaped spaces 12a whose bottom section is open is formed, one in the center in the X-axis direction of a surface on the −Y side, and one each on both ends in the X-axis direction of a surface on the +Y side. Of the three spaces 12a, FIG. 4 shows space 12a formed on the surface on the −Y side. Inside each of the spaces 12a, a vibration isolator 14 is arranged. Surface plate 12 is supported at three points so that its upper surface is almost parallel to the XY plane, by three vibration isolators 14 on an upper surface parallel to an XY plane of a base frame 16 having a rectangular shape in a planar view installed on floor surface F. Note that the number of vibration isolators 14 is not limited to three.

Slider 10, as is shown in FIG. 6, has one each, or a total of four air hydrostatic bearings (air bearings) 18 attached to the four corners of the bottom surface in a state where each of the bearing surfaces is almost flush with the lower surface of slider 10, and by static pressure (pressure within gap) between a bearing surface of pressurized air which blows out toward surface plate 12 from these four air bearings 18 and the upper surface (guide surface) of surface plate 12, slider 10 is supported by levitation via a predetermined clearance (air-gap, gap), such as a clearance of around several μm, on the upper surface of surface plate 12. In the embodiment, as the material for slider 10, a zero thermal expansion glass (e.g., Zerodur of Schott AG) is used, which is a kind of zero thermal expansion material.

In the upper part of slider 10, a recess section 10a is formed, having a predetermined depth with a circular shape in a planar view whose inner diameter is slightly larger than the diameter of wafer W, and inside recess section 10a, a wafer holder WH whose diameter is almost the same as that of wafer W is arranged. As wafer holder WH, while a vacuum chuck, an electrostatic chuck, or a mechanical chuck may be used, as an example, a vacuum chuck of a pin chuck method is to be used. Wafer W is held by suction by wafer holder WH, in a state where its upper surface is almost flush with the upper surface of slider 10. In wafer holder WH, a plurality of suction ports is formed, and the plurality of suction ports is connected to a vacuum pump 11 (refer to FIG. 9) via a vacuum piping system (not shown). And, operation such as on/off of vacuum pump 11 is controlled by controller $60_i$. Note that one of slider 10 and wafer holder WH or both may be called "a first substrate holding member."

Figure 9:
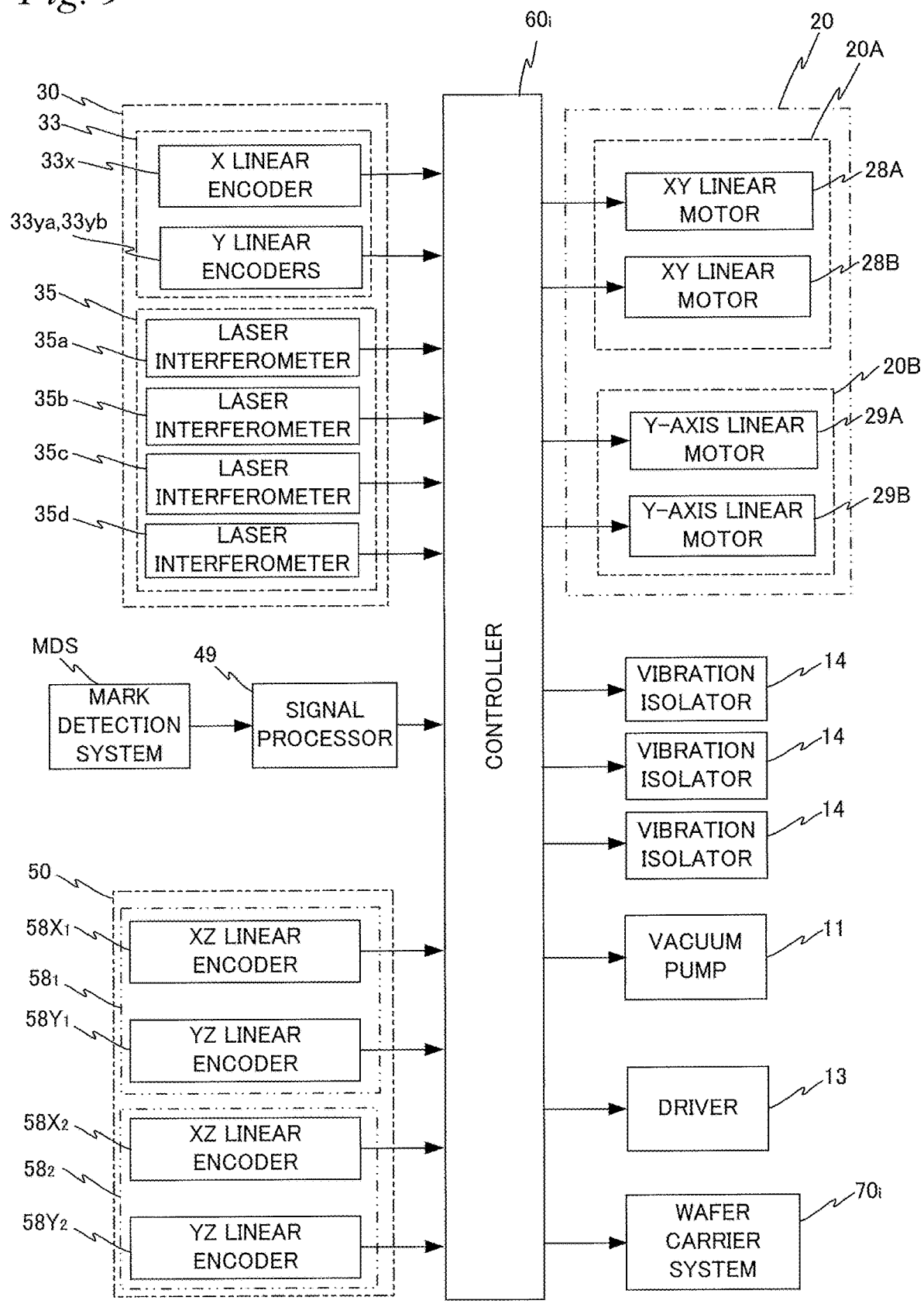
FIG. 9 is a block diagram showing an input output relation of a controller which mainly structures a control system of the measurement device.

Also, in slider 10, a vertical movement member (not shown) is provided that moves vertically, for example, via three circular openings formed in wafer holder WH, and loads the wafer onto wafer holder WH as well as unloads the wafer from wafer holder WH together with wafer carrying system $70_i$ (not shown in FIG. 4, refer to FIG. 9). A driver 13 that moves the vertical movement member is controlled by controller $60_i$ (refer to FIG. 9).

In the embodiment, as wafer holder WH, as an example, a wafer holder that can hold by suction a 300 mm wafer having a diameter of 300 mm is to be used. Note that in the case wafer carrying system $70_i$ has a non-contact holding member that holds the wafer on wafer holder WH by suction in a non-contact manner from above, such as a Bernoulli chuck or the like, the vertical movement member does not have to be provided in slider 10, and therefore, the circular opening for the vertical movement member also does not have to be formed in wafer holder WH.

As is shown in FIGS. 5B and 6, on the lower surface of slider 10 in an area slightly larger than wafer W, a two-dimensional grating (hereinafter simply referred to as a grating) RG1 is arranged horizontally (parallel to the surface of wafer W). Grating RG1 includes a reflective diffraction grating whose periodic direction is in the X-axis direction (X diffraction grating) and a reflective diffraction grating whose periodic direction is in the Y-axis direction (Y diffraction grating). The pitch between the grid lines of the X diffraction grating and the Y diffraction grating is set, for example, to 1 μm.

Vibration isolator 14 is an active type vibration isolation system (so-called AVIS (Active Vibration Isolation System)), and is equipped with an accelerometer, a displacement sensor (e.g., a capacitive sensor), an actuator (e.g., a voice coil motor), and an air mount which functions as an air damper and the like. Vibration isolator 14 can attenuate vibration of relatively high frequency with the air mount (air damper) and can also isolate vibration (control vibration) with the actuator. Accordingly, vibration isolator 14 can prevent vibration traveling through surface plate 12 and base frame 16. Note that a hydraulic power damper may be used, instead of the air mount (air damper).

Here, the reason why the actuator is provided in addition to the air mount is because since the internal pressure of the gas within the gas chamber of the air mount is high, control response can be secured only to around 20 Hz, therefore, when control of high response is necessary, the actuator has to be controlled according to the output of the accelerometer not shown. However, fine vibration such as floor vibration is isolated by the air mount.

The upper end surface of vibration isolator 14 is connected to surface plate 12. Air (e.g., compressed air) can be supplied to the air mount via a gas supply port not shown, and the air mount expands/contracts in predetermined strokes (e.g., around 1 mm) in the Z-axis direction according to the amount of gas (pressure change of the compressed air) filled inside the air mount. Therefore, by vertically moving individually from below the three places of surface plate 12 using the air mounts that each of the three vibration isolators 14 have, position in the Z-axis direction, the θx direction, and the θy direction of surface plate 12 and slider 10 supported by levitation on the surface plate can be adjusted arbitrarily. Also, the actuator of vibration isolator 14 not only moves surface plate 12 in the Z-axis direction, but also can move the surface plate in the X-axis direction and the Y-axis direction. Note that movement quantity in the X-axis direction and the Y-axis direction is smaller than the movement quantity in the Z-axis direction. The three vibration isolators 14 are connected to controller $60_i$ (refer to FIG. 9). Note that each of the three vibration isolators 14 may be equipped with an actuator that can move surface plate 12 not only in the X-axis direction, the Y-axis direction, and the Z-axis direction, but also in, for example, directions of six degrees of freedom. Controller $60_i$ controls the actuators of the three vibration isolators 14 real time at all times, so that position in directions of six degrees of freedom of surface plate 12 to which a head section 32 of the first position measurement system 30 to be described later on is fixed maintains a desired positional relation with respect to mark detection system MDS, based on relative position information between mark detection system MDS (measurement unit 40) and surface plate 12 measured by the second position measurement system 50. Note that feedforward control can be performed on each of the three vibration isolators 14. For example, controller $60_i$ may perform feedforward control on each of the three vibration isolators 14 based on measurement information of the first position measurement system 30. Note that control of vibration isolator 14 by controller $60_i$ is to be described further later on.

Drive system 20, as is shown in FIG. 9, includes a first driver 20A that moves slider 10 in the X-axis direction and a second driver 20B that moves slider 10 in the Y-axis direction integrally with the first driver 20A.

As it can be seen from FIGS. 4 and 6, on a side surface at the −Y side of slider 10, a pair of movers 22a each consisting of a magnet unit (or a coil unit) having an inverted L-shape in a side view is fixed at a predetermined spacing in the X-axis direction. On a side surface at the +Y side of slider 10, as is shown in FIG. 6, a pair of movers 22b (mover 22b at the +X side is not shown) each consisting of a magnet unit (or a coil unit) is fixed at a predetermined spacing in the X-axis direction. Although the pair of movers 22a and the pair of movers 22b are placed symmetrical, they have a structure similar to each other.

Movers 22a and 22b are arranged a predetermined distance apart in the Y-axis direction structuring a part of a frame shaped movable stage 24 rectangular in a planar view as is shown in FIGS. 4 to 6, and are supported in a non-contact manner on an upper surface substantially parallel to the XY plane of a pair of plate members 24a and 24b each extending in the X-axis direction. That is, at a lower surface of movers 22a and 22b (a surface that face plate members 24a and 24b, respectively), air bearings (not shown) are provided, respectively, and by a levitation force (static pressure of pressurized air) that these air bearings generate with respect to plate members 24a and 24b, movers 22a and 22ba are supported in a non-contact manner from below by movable stage 24. Note that self-weight of slider 10 to which each pair of movers 22a and 22b are fixed is supported by the levitation force that the four air bearings 18 generate with respect to surface plate 12, as is previously described.

On the upper surface of each of the pair of plate members 24a and 24b, as is shown in FIGS. 4 to 6, stators 26a and 26b consisting of a magnet unit (or a coil unit) are placed in an area excluding both ends in the X-axis direction.

Electromagnetic interaction between the pair of movers 22a and stator 26a generates a drive force (electromagnetic force) for driving the pair of movers 22a in the X-axis direction and a drive force (electromagnetic force) for driving the pair of movers 22a in the Y-axis direction, and electromagnetic interaction between the pair of movers 22b and stator 26b generates a drive force (electromagnetic force) for driving the pair of movers 22b in the X-axis direction and a drive force (electromagnetic force) for driving the pair of movers 22b in the Y-axis direction. That is, the pair of movers 22a and stator 26a structure an XY linear motor 28A that generates a drive force in the X-axis direction and the Y-axis direction, the pair of movers 22b and stator 26b structure an XY linear motor 28B that generates a drive force in the X-axis direction and the Y-axis direction, and XY linear motor 28A and XY linear motor 28B structure the first driver 20A that drives slider 10 with predetermined strokes in the X-axis direction as well as finely drive the slider in the Y-axis direction (refer to FIG. 9). The first driver 20A can drive slider 10 in the θz direction by making the magnitude of each of the drive forces in the X-axis direction generated by XY linear motor 28A and XY linear motor 28B different. The first driver 20A is controlled by controller $60_i$ (refer to FIG. 9). In the embodiment, while the first driver 20A generates not only a drive force in the X-axis direction but also a drive force in the Y-axis direction from the relation of structuring a coarse/fine movement drive system that drives slider 10 in the Y-axis direction with the first driver 20A as well as the second driver to be described later on, the first driver 20A does not necessarily have to generate the drive force in the Y-axis direction.

Movable stage 24 has the pair of plate members 24a and 24b and a pair of connecting members 24c and 24d placed a predetermined distance apart in the X-axis direction each extending in the Y-axis direction. A step section is formed at both ends in the Y-axis direction of connecting members 24c and 24d. And, in a state where one end and the other end in the longitudinal direction of plate member 24a are mounted on the step sections at the −Y side of each of the connecting members 24c and 24d, connecting members 24c and 24d and plate member 24a are integrated. Also, in a state where one end and the other end in the longitudinal direction of plate member 24b are mounted on the step sections at the +Y side of each of the connecting members 24c and 24d, connecting members 24c and 24d and plate member 24b are integrated (refer to FIG. 5B). That is, in this manner the pair of plate members 24a and 24b is connected with the pair of connecting members 24c and 24d to structure the frame shaped movable stage 24.

As is shown in FIGS. 4 and 5A, near both ends in the X-axis direction on the upper surface of base frame 16, a pair of linear guides 27a and 27b is fixed, extending in the Y-axis direction. Inside one of the linear guides 27a positioned at the +X side, a stator 25a (refer to FIG. 5B) of a Y-axis linear motor 29A consisting of a coil unit (or a magnet unit) that covers almost the total length in the Y-axis direction is housed on the upper surface and a surface near the −X side. Facing the upper surface and the surface near the −X side of linear guide 27a, a mover 23a is placed consisting of a magnet unit (or coil unit) having an L-shaped cross sectional surface that structures Y-axis linear motor 29A along with stator 25a. To the lower surface and the surface at the +X side of mover 23a that face the upper surface and the surface at the −X side of linear guide 27a, respectively, air bearings are fixed that blow out pressurized air to the opposing surface. Of the air bearings, especially as the air bearings fixed to the surface at the +X side of mover 23a, vacuum preloaded air bearings are used. The vacuum preloaded air bearings maintain a clearance (void, gap) in the X-axis direction between mover 23a and linear guide 27a at a constant value by balancing the static pressure of the pressurized air and the vacuum preload force between the bearing surface and linear guide 27a.

On the upper surface of mover 23a, a plurality of X guides 19 consisting of, for example, two rectangular solid members, are fixed spaced apart at a predetermined distance in the Y-axis direction. Each of the two X guides 19 is engaged in a non-contact manner with a slide member 21 having an inversed U sectional shape that structures a uniaxial guide device along with X guide 19. Air bearings are provided at each of the three surfaces of slide member 21 that face X guide 19.

The two slide members 21, as is shown in FIG. 4, are each fixed to the lower surface (surface at the −Z side) of connecting member 24c.

The other linear guide 27b positioned at the −X side houses inside a stator 25b of a Y-axis linear motor 29B consisting of a coil unit (or a magnet unit), and is structured similar to linear guide 27a except for being symmetric (refer to FIG. 5B). Facing the upper surface and the surface near the +X side of linear guide 27b, a mover 23b is placed consisting of a magnet unit (or coil unit) which is symmetric but has an L-shaped cross sectional surface similar to mover 23a that structures Y-axis linear motor 29B along with stator 25b. Facing each of the upper surface and the surface at the +X side of linear guide 27b, air bearings are fixed to each of the lower surface and the surface at the −X side of mover 23b, and especially as the air bearings fixed to the surface at the −X side of mover 23b, vacuum preloaded air bearings are used. By the vacuum preloaded air bearings, the clearance (void, gap) in the X-axis direction between mover 23b and linear guide 27b is kept at a constant value.

Between the upper surface of mover 23b and the bottom surface of connecting member 24d, as is previously described, two uniaxial guide devices structured by X guide 19 and slide member 21 that engages with X guide 19 in a non-contact manner are provided.

Movable stage 24 is supported from below by movers 23a and 23b via two each of (a total of four) uniaxial guide devices on the +X side and the −X side, and is movable in the X-axis direction on mover 23a and 23b. Therefore, by the first driver 20A previously described, when slider 10 is driven in the X-axis direction, reaction force of the drive force acts on movable stage 24 in which stators 26a and 26b are provided and movable stage 24 moves in a direction opposite to slider 10 according to the momentum conservation law. That is, the movement of movable stage 24 prevents (or effectively suppresses) generation of vibration caused by the reaction force of the drive force in the X-axis direction to slider 10. That is, movable stage 24 functions as a counter mass when slider 10 moves in the X-axis direction. However, movable stage 24 does not necessarily have to function as a counter mass. Note that a counter mass may be provided to prevent (or effectively suppress) generation of vibration caused by the drive force to drive slider 10 in the Y-axis direction with respect to movable stage 24, although it is not provided here in particular since slider 10 only moves finely in the Y-axis direction with respect to movable stage 24.

Y-axis linear motor 29A generates a drive force (electromagnetic force) that drives mover 23a in the Y-axis direction by electromagnetic interaction between mover 23a and stator 25a, and Y-axis linear motor 29B generates a drive force (electromagnetic force) that drives mover 23b in the Y-axis direction by electromagnetic interaction between mover 23b and stator 25b.

The drive force in the Y-axis direction that Y-axis linear motors 29A and 29B generate acts on movable stage 24 via two each of the uniaxial guide devices at the +X side and the −X side. This allows slider 10 to be driven in the Y-axis direction integrally with movable stage 24. That is, in the embodiment, the four uniaxial guide devices, and the pair of Y-axis linear motors 29A and 29B structure a second driver 20B (refer to FIG. 9) that drives slider 10 in the Y-axis direction.

In the embodiment, the pair of Y-axis linear motors 29A and 29B is physically separated from surface plate 12 and is also separated in a vibratory manner by the three vibration isolators 14. Note that linear guides 27a and 27b in which stators 25a and 25b of the pair of Y-axis linear motors 29A and 29B provided may be structured movable in the Y-axis direction with respect to base frame 16, so that the linear guides may function as a counter mass when driving slider 10 in the Y-axis direction.

Measurement unit 40, as is shown in FIG. 4, has a unit main section 42 that has a cutout shaped space 42a having an opening at a bottom section formed at a surface on the −Y side, mark detection system MDS previously described connected to unit main section 42 in a state where a base end is inserted into space 42a, and a connection mechanism 43 that connects barrel section 41 at the tip of mark detection system MDS to unit main section 42.

Connection mechanism 43 includes a support plate 44 that supports barrel section 41 from the back side (the +Y side) via a mounting member (not shown), and a pair of support arms 45a and 45b whose one end each supports support plate 44 and the other end is each fixed to the bottom surface of unit main section 42.

In the embodiment, corresponding to the point that a sensitive agent (resist) is coated on the upper surface of the wafer held on slider 10, a system using a detection beam having a wavelength that is not sensitive to the resist is used as mark detection system MDS. As mark detection system MDS, for example, an FIA (Field Image Alignment) system of an image processing method is used that irradiates a broadband detection beam which does not expose the resist coated on the wafer on a target mark, images an image of the target mark formed on a light receiving surface by the reflection light from the target mark and an image of an index (not shown) (an index pattern on an index plate provided inside) using an imaging device (such as a CCD), and outputs their imaging signals. The imaging signals from mark detection system MDS are supplied to controller $60_i$ (refer to FIG. 9), via a signal processor 49 (not shown in FIG. 4, refer to FIG. 9). Mark detection system MDS has an alignment auto-focus function that adjusts the focal position of the optical systems.

Between barrel section 41 and support plate 44, as is shown in FIG. 4, a head mounting member 51 with a rough isosceles triangle shape is placed. In head mounting member 51, an opening section penetrating in the Y-axis direction in FIG. 4 is formed and barrel section 41 is attached to (fixed to) support plate 44 via the mounting member (not shown) inserted in the opening section. Head mounting member 51 also has its rear surface fixed to support plate 44. In this manner, barrel section 41 (mark detection system MDS), head mounting member 51, and support plate 44 are integrated with unit main section 42, via the pair of support arms 45a and 45b.

Inside unit main section 42, signal processor 49 and the like previously described are placed that performs processing on the imaging signals output as detection signals from mark detection system MDS, calculates position information of the target mark with respect to the detection center, and outputs the information to controller $60_i$. Unit main section 42 is supported from below via a plurality of, e.g., three vibration isolators 48, at three points, on a support frame 46 having a portal shape when viewed from the −Y side installed on base frame 16. Each vibration isolator 48 is an active type vibration isolation system (a so-called AVIS (Active Vibration Isolation System) and is equipped with an accelerometer, a displacement sensor (e.g., a capacitive sensor or the like), an actuator (e.g., a voice coil motor or the like), a mechanical damper such as an air damper or a hydraulic damper and the like, and vibration isolator 48 can attenuate relatively high frequency vibration with the mechanical damper as well as isolate vibration (control vibration) with the actuator. Accordingly, each vibration isolator 48 can avoid relatively high frequency vibration from traveling between support frame 46 and unit main section 42.

Note that mark detection system MDS is not limited to the FIA system, and for example, a diffracted light interference type alignment detection system may also be used that irradiates a coherent detection light on the subject mark, makes two diffracted lights (e.g., diffracted lights of the same order or diffracted lights diffracted in the same direction) generated from the target mark interfere with each other, and detects the interfered light and outputs the detection signals, instead of the FIA system. Or, the diffracted light interference type alignment system may be used with the FIA system and the two target marks may be detected simultaneously. Furthermore, as mark detection system MDS, a beam scan type alignment system that scans a measurement beam in a predetermined direction with respect to a target mark while slider 10 is moved in a predetermined direction may also be used. Also, in the embodiment, while mark detection system MDS has the alignment auto-focus function, instead of, or in addition to this, measurement unit 40 may be equipped with a focal position detection system such as a multi-point focal position detection system of an oblique incidence method having a structure similar to the one disclosed in, for example, U.S. Pat. No. 5,448,332.

The first position measurement system 30, as is shown in FIGS. 5B and 6, is placed within a recess section formed on the upper surface of surface plate 12 and has head section 32 fixed to surface plate 12. The upper surface of head section 32 faces the lower surface of slider 10 (forming surface of grating RG1). A predetermined clearance (void, gap), e.g., a clearance of several mm, is formed between the upper surface of head section 32 and the lower surface of slider 10.

The first position measurement system 30, as is shown in FIG. 9, is equipped with an encoder system 33 and a laser interferometer system 35. Encoder system 33 can acquire position information of slider 10, by irradiating a plurality of beams from head section 32 on a measurement section (forming surface of grating RG1) on the lower surface of slider 10 as well as receiving a plurality of return beams (e.g., a plurality of diffracted beams from grating RG1) from the measurement section on the lower surface of slider 10. Encoder system 33 includes an X linear encoder 33*x* which measures position in the X-axis direction of slider 10 and a pair of Y linear encoders 33*ya* and 33*yb* which measure position in the Y-axis direction of slider 10. In encoder system 33, a head of a diffraction interference type is used that has a structure similar to the encoder head disclosed in, for example, U.S. Pat. No. 7,238,931, U.S. Patent Application Publication No. 2007/288121 and the like (hereinafter shortly referred to as an encoder head as appropriate). Note that while a head includes a light source, a light receiving system (including a photodetector), and an optical system, in the embodiment, of these parts, only at least the optical system has to be placed inside the housing of head section 32 facing grating RG1, and at least one of the light source and the light receiving system may be placed outside of the housing of head section 32.

Figure 7A:
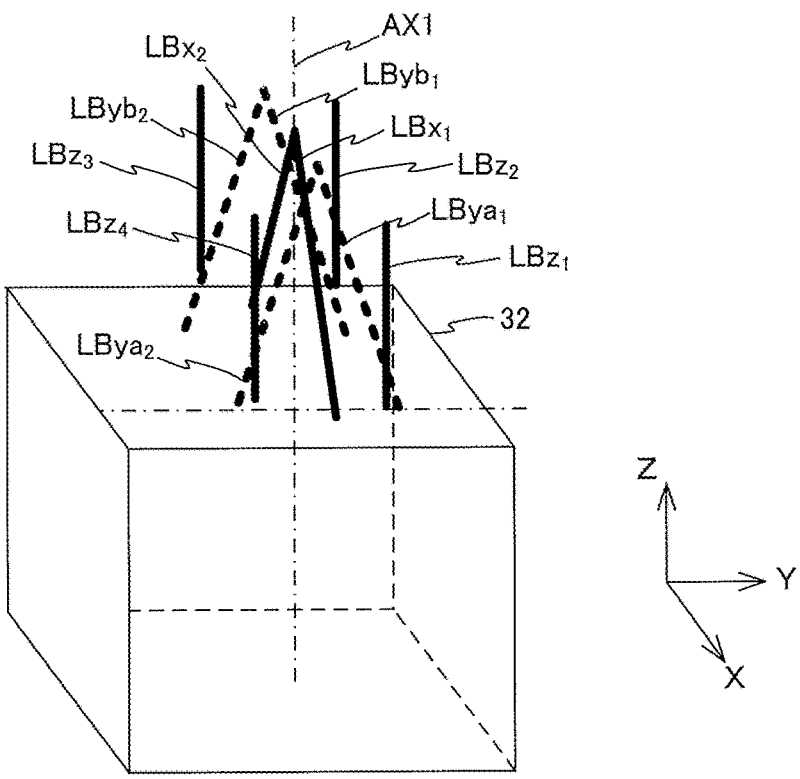
FIG. 7A is a perspective view showing a head section of a first position measurement system.
Figure 7B:
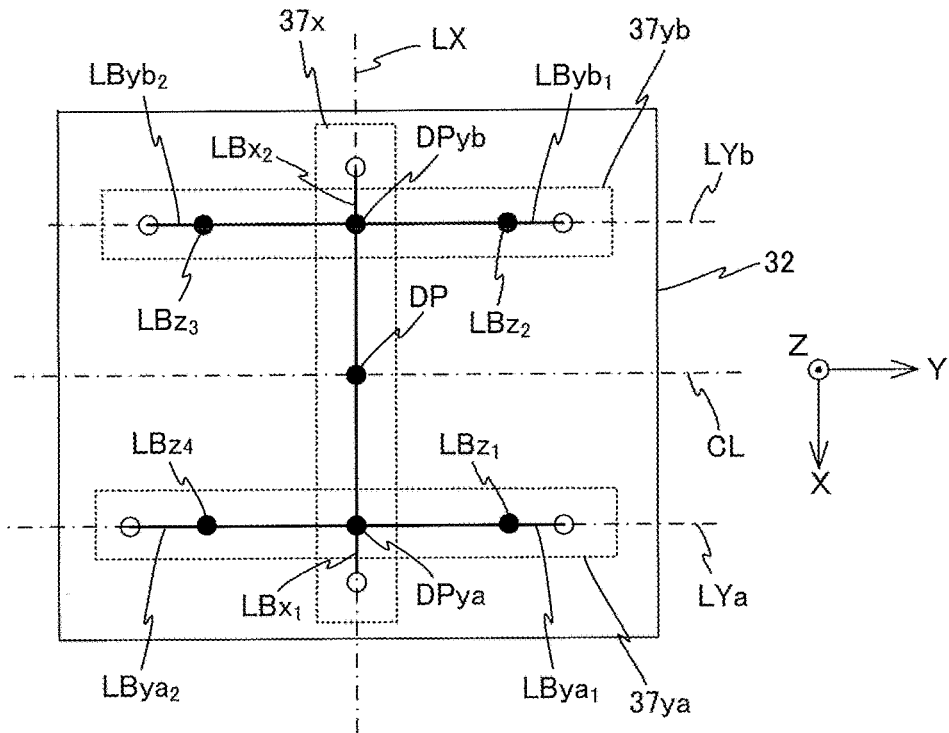
FIG. 7B is a planar view (when viewed from a +Z direction) showing the head section of the first position measurement system.

FIG. 7A shows head section 32 in a perspective view, and FIG. 7B shows the upper surface of head section 32 in a planar view when viewed from a +Z direction. Encoder system 33 measures the position in the X-axis direction of slider 10 with one X head 37*x*, and measures the position in the Y-axis direction with a pair of Y heads 37*ya* and 37*yb* (refer to FIG. 7B). That is, X linear encoder 33*x* previously described is structured by X head 37*x* which measures the position in the X-axis direction of slider 10 using an X diffraction grating of grating RG1, and the pair of Y linear encoders 33*ya* and 33*yb* is structured by the pair of Y heads 37*ya* and 37*yb* which measures the position in the Y-axis direction of slider 10 using a Y diffraction grating of grating RG1.

As is shown in FIGS. 7A and 7B, X head 37*x*, which is arranged along a straight line LX which passes through the center of head section 32 and is parallel to the X-axis, irradiates measurement beams $LBx_1$ and $LBx_2$ (indicated by a solid line in FIG. 7A) from two points (refer to white circles in FIG. 7B) equidistant from a straight line CL which passes through the center of head section 32 and is parallel to the Y-axis on the same irradiation point on grating RG1. The irradiation points of measurement beams $LBx_1$ and $LBx_2$, that is, detection points of X head 37*x* (refer to reference code DP in FIG. 7B), coincides with the detection center of mark detection system MDS in regards to position in the X-axis direction and the Y-axis direction.

Here, measurement beams $LBx_1$ and $LBx_2$ are beams on which polarized beam splitting is performed by a polarized beam splitter (not shown) on a beam from a light source, and when measurement beams $LBx_1$ and $LBx_2$ are irradiated on grating RG1, diffracted beams of a predetermined order of these measurement beams $LBx_1$ and $LBx_2$ diffracted by the X diffraction grating, e.g., a first order diffraction beam (a first diffraction beam), are each returned by a reflection mirror via a lens and a quarter wavelength plate (not shown), and by the beams passing through the quarter wavelength plate twice the polarization direction is rotated by 90 degrees which allows the beams to pass through the original optical path and re-enter the polarized beam splitter where the beams are coaxially synthesized, and then by the photodetector (not shown) receiving the interference light of the first order diffraction beams of measurement beams $LBx_1$ and $LBx_2$, position in the X-axis direction of slider 10 is measured.

As is shown in FIG. 7B, the pair of Y heads 37*ya* and 37*by* is placed, one on the +X side and one on the −X side of straight line CL. Y head 37*ya*, as is shown in FIGS. 7A and 7B, irradiates measurement beams $LBya_1$ and $LBya_2$ each indicated by broken lines in FIG. 7A on a common irradiation point on grating RG1 from two points (refer to white circles in FIG. 7B) equidistant from straight line LX on a straight line LYa. The irradiation point of measurement beams $LBya_1$ and $LBya_2$, that is, detection point of Y head 37*ya* is indicated by reference code DPya in FIG. 7B.

Y head 37*yb* irradiates measurement beams $LByb_1$ and $LByb_2$ from two points (refer to white circles in FIG. 7B) symmetric to outgoing points of measurement beams $LBya_1$ and $LBya_2$ of Y head 37*ya* with respect to straight line CL, on a common irradiation point DPyb on grating RG1. As is shown in FIG. 7B, detection points DPya and DPyb of each of the Y heads 37*ya* and 37*yb* are placed on straight line LX parallel to the X-axis.

Measurement beams $LBya_1$ and $LBya_2$ are also beams of the same beam split by polarization by the polarized beam splitter, and position in the Y-axis direction of slider 10 is measured by interference light of a predetermined order of these measurement beams $LBya_1$ and $LBya_2$ diffracted by the Y diffraction grating, e.g., a first order diffraction beam (a second diffraction beam) being photo-detected by the photodetector (not shown) similarly to the description above. For measurement beams $LByb_1$ and $LByb_2$ as well, similar to measurement beams $LBya_1$ and $LBya_2$, position in the Y-axis direction of slider 10 is measured by interference light of a first order diffraction beam (a second diffraction beam) being photo-detected by the photodetector (not shown).

Here, controller $60_i$ decides the position in the Y-axis direction of slider 10 based on an average of the measurement values of the two Y heads 37ya and 37yb. Accordingly, in the embodiment, the position in the Y-axis direction of slider 10 is measured with a midpoint DP of detection points DPya and DPyb serving as a substantial measurement point. Midpoint DP coincides with the irradiation point on grating RG1 of measurement beams $LBx_1$ and $LBX_2$.

That is, in the embodiment, for measuring position information in the X-axis direction and Y-axis direction of slider 10, the device has a common detection point, and controller $60_i$ controls the actuators of the three vibration isolators 14 real time, so that the position of the detection point within the XY plane coincides with the detection center of mark detection system MDS, for example, at a nm level. Control of the actuators of these three vibration isolators 14 is performed, based on relative position information between mark detection system MDS (measurement unit 40) and surface plate 12 measured by the second position measurement system 50. Accordingly, in the embodiment, by using encoder system 33, controller $60_i$ can always perform measurement of position information within the XY plane of slider 10 directly under (rear surface side of slider 10) the detection center of mark detection system MDS when measuring the alignment marks on wafer W mounted on slider 10. Controller $60_i$ also measures the rotation quantity in the $\theta z$ direction of slider 10, based on a difference between measurement values of the pair of Y heads 37ya and 37yb.

Laser interferometer system 35 can acquire position information of slider 10 by making a measurement beam enter the measurement section (the surface on which grating RG1 is formed) on the lower surface of slider 10, and also receiving the return beam (e.g., reflection light from a surface on which grating RG1 is formed). Laser interferometer system 35, as is shown in FIG. 7A, makes four measurement beams $LBz_1$, $LBz_2$, $LBz_3$, and $LBz_4$ enter the lower surface of slider 10 (the surface on which grating RG1 is formed). Laser interferometer system 35 is equipped with laser interferometers 35a to 35d (refer to FIG. 9) that irradiate the four measurement beams $LBz_1$, $LBz_2$, $LBz_3$, and $LBz_4$, respectively. In the embodiment, four Z heads are structured by laser interferometers 35a to 35d.

In laser interferometer system 35, as is shown in FIGS. 7A and 7B, four measurement beams $LBz_1$, $LBz_2$, $LBz_3$, and $LBz_4$ are emitted parallel to the Z-axis from four points corresponding to the four vertices of a square whose center is detection point DP and has two sides parallel to the X-axis and two sides parallel to the Y-axis. In this case, the outgoing points (irradiation points) of measurement beams $LBz_1$ and $LBz_4$ are at equal distances from straight line LX on straight line LYa, and the outgoing points (irradiation points) of the remaining measurement beams $LBz_2$ and $LBz_3$ are at equal distances from straight line LX on a straight line LYb. In the embodiment, the surface on which grating RG1 is formed also functions as a reflection surface of each measurement beam from laser interferometer system 35. Controller $60_i$ measures information on the position in the Z-axis direction and the rotation quantity in the $\theta x$ direction and the $\theta y$ direction of slider 10, using laser interferometer system 35.

Note that as it is obvious from the description above, although slider 10 is not positively driven by drive system 20 previously described with respect to surface plate 12 in the Z-axis, the $\theta x$ and the $\theta y$ directions, because slider 10 is supported by levitation on surface plate 12 by the four air bearings placed at the four corners of the bottom surface, the position of slider 10 actually changes on surface plate 12 in each of the Z-axis, the $\theta x$ and the $\theta y$ directions. That is, slider 10 is actually movable with respect to surface plate 12 in each of the Z-axis, the $\theta x$ and the $\theta y$ directions. Displacement in each of the $\theta x$ and $\theta y$ directions in particular causes a measurement error (Abbe error) in encoder system 33. Taking such points into consideration, position information in each of the Z-axis, the $\theta x$ and the $\theta y$ directions of slider 10 is measured by the first position measurement system 30 (laser interferometer system 35).

Note that for measurement of information on position in the Z-axis direction and the rotation quantity in the $\theta x$ direction and the $\theta y$ direction of slider 10, since the beams only have to be incident on three different points on the surface where grating RG1 is formed, the Z heads, e.g., laser interferometers, required should be three. Note that a cover glass to protect grating RG1 can be provided on the lower surface of slider 10, and on the surface of the cover glass, a wavelength selection filter may be provided that allows each measurement beam from encoder system 33 to pass and prevents each measurement beam from laser interferometer system 35 from passing.

As it can be seen from the description so far, controller $60_i$ can measure the position in directions of six degrees of freedom of slider 10 by using encoder system 33 and laser interferometer system 35 of the first position measurement system 30. In this case, in encoder system 33, influence of air fluctuation can almost be ignored since the optical path lengths of the measurement beams in the air are extremely short, and optical path lengths of the two measurement beams $LBx_1$ and $LBx_2$ irradiated on grating RG1 from X head 73x, optical path lengths of the two measurement beams $LBya_1$ and $LBya_2$ irradiated on grating RG1 from Y head 37ya, and optical path lengths of the two measurement beams $LByb_1$ and $LByb_2$ irradiated on grating RG1 from Y head 37yb are almost equal with each other. Accordingly, position information within the XY plane (including the $\theta z$ direction) of slider 10 can be measured with high precision by encoder system 33. Also, because the substantial detection point on grating RG1 in the X-axis direction and the Y-axis direction by encoder system 33 and the detection point on the lower surface of slider 10 in the Z-axis direction by laser interferometer system 35 each coincide with the detection center of mark detection system MDS within the XY plane, generation of the so-called Abbe error which is caused by shift within the XY plane between the detection point and the detection center of mark detection system MDS can be suppressed to a level that can be ignored. Accordingly, controller $60_i$ can measure the position in the X-axis direction, the Y-axis direction, and the Z-axis direction of slider 10 without Abbe error caused by shift in the XY plane between the detection point and the detection center of mark detection system MDS with high precision by using the first position measurement system 30.

However, for the Z-axis direction parallel to optical axis AX1 of mark detection system MDS, position information in the XY plane of slider 10 is not necessarily measured at a position at the surface of wafer W by encoder system 33, that is, the Z position of the placement surface of grating RG1 and the surface of wafer W do not necessarily coincide. Therefore, in the case grating RG1 (that is, slider 10) is inclined with respect to the XY plane, when slider 10 is positioned based on measurement values of each of the encoders of encoder system 33, as a result, a positioning error (a kind of Abbe error) corresponding to the inclination with respect to the XY plane of grating RG1 occurs due to a Z position difference ΔZ (that is, position displacement in the Z-axis direction between the detection point by encoder system 33 and the detection center (detection point) by mark detection system MDS) between the placement surface of grating RG1 and the surface of wafer W. However, this positioning error (position control error) can be acquired by a simple calculation by using difference ΔZ, pitching quantity θx, and rolling quantity θy, and using this as an offset and by setting the position of slider 10 based on position information after correction in which measurement values of (each encoder of) encoder system 33 are corrected by the offset amount, the kind of Abbe error described above no longer affects the measurement. Or, instead of correcting the measurement values of (each encoder of) encoder system 33, one or a plurality of information for moving the slider such as a target position to where slider 10 should be positioned may be corrected, based on the above offset.

Note that in the case grating RG1 (that is, slider 10) is inclined with respect to the XY plane, head section 32 may be moved so that a positioning error due to the inclination does not occur. That is, in the case an inclination has been measured in grating RG1 (that is, slider 10) with respect to the XY plane by the first position measurement system 30 (e.g., interferometer system 35), surface plate 12 that holds head section 32 may be moved, based on position information acquired using the first position measurement system 30. Surface plate 12, as is described above, can be moved using vibration isolators 14.

Also, in the case grating RG1 (that is, slider 10) is inclined with respect to the XY plane, position information of the mark acquired using mark detection system MDS may be corrected, based on the positioning error caused by the inclination.

The second position measurement system 50, as is shown in FIGS. 4, 5A, and 5B, has a pair of head sections 52A and 52B provided at the lower surface of one end and the other end in the longitudinal direction of head mounting member 51 previously described, and scale members 54A and 54B that are placed facing head sections 52A and 52B. The upper surface of scale members 54A and 54B is to be the same height as the surface of wafer W held by wafer holder WH. On each of the upper surfaces of scale members 54A and 54B, reflection type two-dimensional gratings RG2a and RG2b are formed. Two-dimensional gratings (hereinafter shortly referred to as gratings) RG2a and RG2b both include a reflective diffraction grating (X diffraction grating) whose periodic direction is in the X-axis direction and a reflective diffraction grating (Y diffraction grating) whose periodic direction is in the Y-axis direction. The pitch between the grid lines of the X diffraction grating and the Y diffraction grating is set to, for example, 1 μm.

Scale members 54A and 54B consist of a material having a low thermal expansion, e.g., a zero thermal expansion material, and are each fixed on surface plate 12 via support members 56, as is shown in FIGS. 5A and 5B. In the embodiment, dimensions of scale members 54A and 54B and support members 56 are decided so that gratings RG2a and RG2b face head sections 52A and 52B with a gap of around several mm in between.

Figure 8:
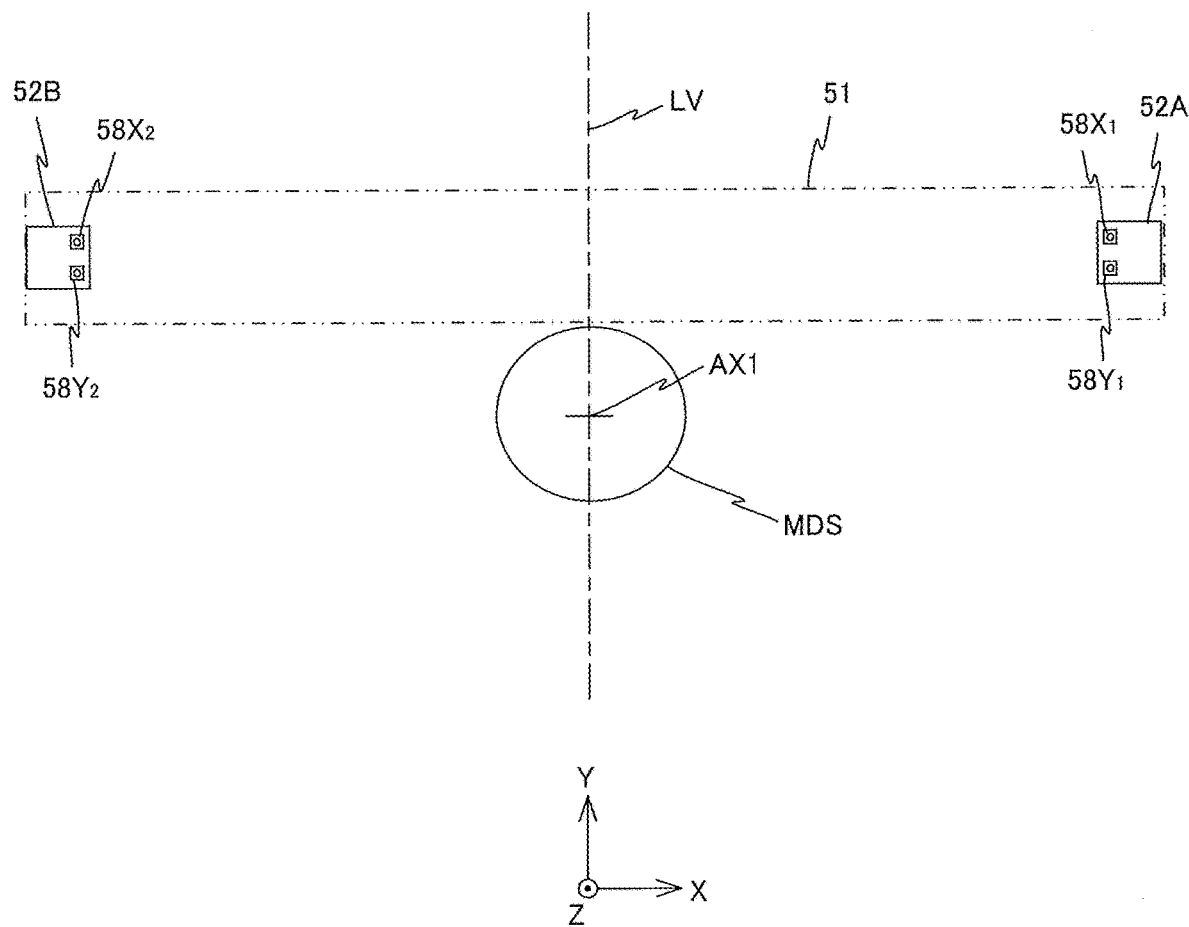
FIG. 8 is a view used to explain a structure of a second position measurement system.

As is shown in FIG. 8, one head section 52A fixed to the lower surface at the end on the +X side of head mounting member 51 includes an XZ head $58X_1$ whose measurement direction is in the X-axis and the Z-axis directions and a YZ head $58Y_1$ whose measurement direction is in the Y-axis and the Z-axis directions housed in the same housing. XZ head $58X_1$ (to be more accurate, an irradiation point on grating RG2a of the measurement beam emitted by XZ head $58X_1$) and YZ head $58Y_1$ (to be more accurate, an irradiation point on grating RG2a of the measurement beam emitted by YZ head $58Y_1$) are placed on the same straight line parallel to the Y-axis.

The other head section 52B is placed symmetric to head section 52A with respect to a straight line (hereinafter called a reference axis) LV which passes through optical axis AX1 of mark detection system MDS and is parallel to the Y-axis, however, the structure is similar to that of head section 52A. That is, head section 52B has XZ head $58X_2$ and YZ head $58Y_2$ placed symmetric to XZ head $58X_1$ and YZ head $58Y_1$ with respect to reference axis LV, and the irradiation points of the measurement beams irradiated on grating RG2b from each of the XZ head $58X_2$ and YZ head $58Y_2$ set on the same straight line parallel to the Y-axis As each of the XZ heads $58X_1$ and $58X_2$ and the YZ heads $58Y_1$ and $58Y_2$, an encoder head having a structure similar to the displacement measurement sensor head disclosed in, for example, U.S. Pat. No. 7,561,280 can be used.

Head sections 52A and 52B structure an XZ linear encoder which measures position in the X-axis direction (X position) and position in the Z-axis direction (Z position) of gratings RG2a and RG2b and a YZ linear encoder which measures position in the Y-axis direction (Y position) and Z position, using scale members 54A and 54B, respectively. Gratings RG2a and RG2b, here, are formed on the upper surface of scale members 54A and 54B which are each fixed on surface plate 12 via support members 56, and head sections 52A and 52B are provided at head mounting member 51 which is integral with mark detection system MDS. As a result, head sections 52A and 52B measure the position (positional relation between mark detection system MDS and surface plate 12) of surface plate 12 with respect to mark detection system MDS. In the description below, for the sake of convenience, XZ linear encoder and YZ linear encoder will be described as XZ linear encoders $58X_1$ and $58X_2$ and YZ linear encoders $58Y_1$ and $58Y_2$ (refer to FIG. 9), using the same reference code as XZ heads $58X_1$ and $58X_2$ and YZ heads $58Y_1$ and $58Y_2$.

In the embodiment, XZ linear encoder $58X_1$ and YZ linear encoder $58Y_1$ structure a four-axis encoder $58_1$ (refer to FIG. 9) that measures position information in each of the X-axis, the Y-axis, the Z-axis, and the θx directions with respect to mark detection system MDS of surface plate 12. Similarly, XZ linear encoder $58X_2$ and YZ linear encoder $58Y_2$ structure a four-axis encoder $58_2$ (refer to FIG. 9) that measures position information in each of the X-axis, the Y-axis, the Z-axis, and the θx directions with respect to mark detection system MDS of surface plate 12. In this case, position information in the θy direction of surface plate 12 with respect to mark detection system MDS is obtained (measured), based on position information in the Z-axis direction with respect to mark detection system MDS of surface plate 12 measured by each of the four-axis encoders $58_1$ and $58_2$, and position information in the θz direction of surface plate 12 with respect to mark detection system MDS is obtained (measured), based on position information in the Y-axis direction with respect to mark detection system MDS of surface plate 12 measured by each of the four-axis encoders $58_1$ and $58_2$.

Accordingly, four-axis encoder $58_1$ and four-axis encoder $58_2$ structure the second position measurement system 50 which measures position information in directions of six degrees of freedom of surface plate 12 with respect to mark detection system MDS, namely, measures information on relative position in directions of six degrees of freedom between mark detection system MDS and surface plate 12. The information on relative position in directions of six degrees of freedom between mark detection system MDS and surface plate 12 measured by the second position measurement system 50 is supplied at all times to controller 60$_i$, and based on this information on relative position, controller 60$_i$ controls the actuators of the three vibration isolators 14 real time so that the detection point of the first position measurement system 30 is in a desired position relation with respect to the detection center of mark detection system MDS, or to be more specific, the position in the XY plane of the detection point of the first position measurement system 30 coincides with the detection center of mark detection system MDS such as at a nm level, and the surface of wafer W on slider 10 also coincides with the detection position of mark detection system MDS. In this case, for example, straight line CL previously described coincides with reference axis LV. Note that if the detection point of the first position measurement system 30 can be controlled to be in a desired position relation with respect to the detection center of mark detection system MDS, the second position measurement system 50 does not have to measure the information on relative position in all directions of six degrees of freedom.

As is obvious from the description on the first position measurement system 30 described earlier and the description on the second position measurement system 50, in measurement device 100$_i$, the first position measurement system 30 and the second position measurement system 50 structure a position measurement system that measures position information in directions of six degrees of freedom of slider 10 with respect to mark detection system MDS.

FIG. 9 shows a block diagram of an input output relation of controller 60$_i$ which mainly structures a control system of measurement device 100$_i$ according to the embodiment. Controller 60$_i$ includes a workstation (or a microcomputer) or the like, and has overall control over each part of measurement device 100$_i$. As is shown in FIG. 9, measurement device 100$_i$ is equipped with wafer carrying system 70$_i$ that has a part of the system placed inside a chamber along with component parts shown in FIG. 4. Wafer carrying system 70$_i$, as is previously described, consists of, for example, a horizontal multi-joint arm robot.

Next, a series of operations when processing a single lot of wafers in measurement device 100$_i$ according to the embodiment having the structure described above is described based on a flowchart in FIG. 10 that corresponds to a processing algorithm of controller 60$_i$.

As a premise, wafer W serving as a measurement target of measurement device 100$_i$ is to be a 300 mm wafer, and on wafer W, by exposure performed earlier on the previous layers, a plurality of, e.g., I (as an example, I=98) divided areas called shot areas (hereinafter called shots) are formed placed in a matrix shape, and on street lines surrounding each shot or street lines inside each shot (in the case a plurality of chips are made in one shot), a plurality of types of marks, such as search alignment marks (search marks) for search alignment, wafer alignment marks (wafer marks) for fine alignment and the like are to be provided. The plurality of types of marks is formed, along with the shots. In the embodiment, as search marks and wafer marks, two-dimensional marks are to be used.

Also, measurement device 100$_i$ is able to set a plurality of measurement modes having mark detection conditions by mark detection system MDS that are mutually different. As an example of the plurality of measurement modes, an A mode and a B mode can be set, and in the A mode, one each of a wafer mark is to be detected in all shots for all wafers, while in the B mode, a plurality of wafer marks is to be detected in all shots for the first predetermined number of wafers in a lot, and according to detection results of the wafer marks, wafer marks to be detection targets are decided for each shot for the remaining wafers in the lot and the shots decided are to be detected.

Also, by an operator of measurement device 100$_i$, information necessary for alignment measurement to wafer W is to be input in advance via an input device (not shown) and stored in a memory of controller 60$_i$. Here, the information necessary for alignment measurement includes various information such as, thickness information of wafer W, flatness information of wafer holder WH, and design information of shots and of arrangement of alignment marks on wafer W. Note that setting information of the measurement mode is to be input in advance, for example, by the operator via an input device (not shown).

Figure 10:
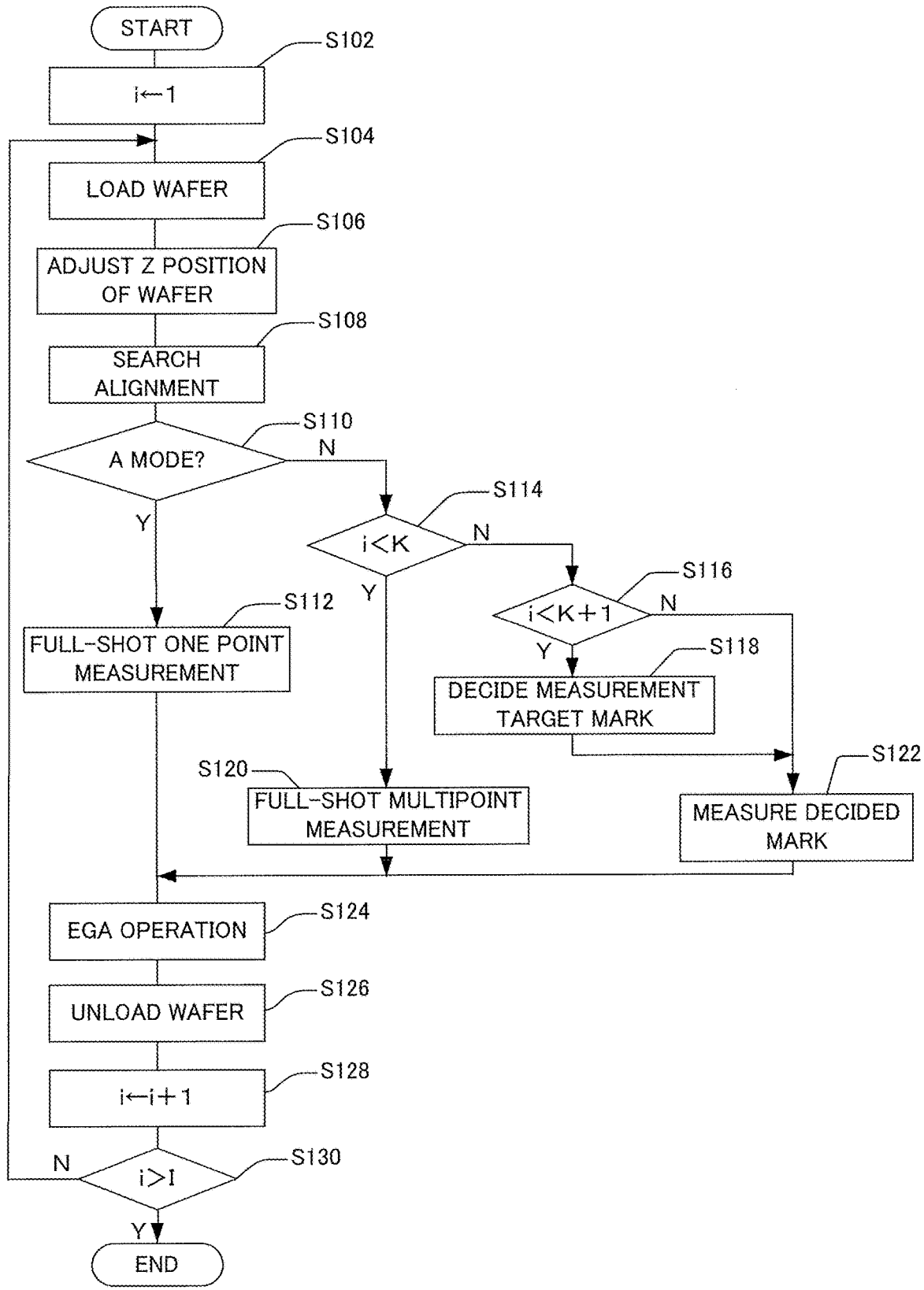
FIG. 10 is a flowchart corresponding to a processing algorithm of the controller when wafers in one lot are processed.

A processing algorithm corresponding to a flowchart in FIG. 10 starts, for example, when the operator or host computer 2000 instructs the measurement to be started. On this operation, the plurality of wafers (e.g., 25 slices of wafers) included in one lot is to be housed within a wafer carrier inside chamber 101$_i$ of measurement device 100$_i$. Other than this, concurrently with the measurement processing by measurement device 100$_i$, each of the wafers of the one lot may be carried sequentially into measurement device 100$_i$. For example, under the control of measurement system controller 530 that controls robot 516, carrier member 524 and carrier member 526 and the like, a wafer in one lot inside a predetermined FOUP 520 may be taken out sequentially by robot 516 and then carried to a predetermined delivery position between measurement device 100$_i$ by carrier member 524. In this case, the processing algorithm corresponding to the flowchart in FIG. 10 starts when measurement system controller 530 gives instructions to controller 60$_i$ and robot 516 to start carriage.

Note that, in the case exposure apparatus 200 and measurement system 500 are connected, instructions for starting measurement may be given from exposure controller 220 of exposure apparatus 200 to measurement system controller 530, without going through host computer 2000.

Note that measurement device 100$_i$ is equipped with a bar code reader (not shown), and identification information of each wafer, e.g., wafer number, lot number and the like, is appropriately read by the bar code reader during the carriage of the wafer by wafer carrying system 70$_i$ (refer to FIG. 9). In the description below, to simplify the explanation, description related to reading the identification information for each wafer using the bar code reader is to be omitted. Note that each of the measurement devices 100$_i$ does not have to be equipped with the bar code reader. For example, the bar code reader may be arranged in carrying system 521.

First of all, in step S102, a count value i of a counter that shows the number of a wafer in a lot is initialized to 1 (i←1).

In the next step, S104, wafer W is loaded onto slider 10. This loading of wafer W is performed by wafer carrying system 70$_i$ and the vertical movement member on slider 10, under the control of controller 60$_i$. Specifically, wafer W is carried from the wafer carrier (or the delivery position) to an area above slider 10 at the loading position by wafer carrying system 70$_i$, and then by the vertical movement member being moved upward by a predetermined amount by driver 13, wafer W is delivered to the vertical movement member. Then, after wafer carrying system $70_i$ has been withdrawn from above slider 10, by the vertical movement member being moved downward by driver 13, wafer W is mounted on wafer holder WH on slider 10. Then, vacuum pump 11 is turned on, so that wafer W loaded on slider 10 is vacuum chucked at wafer holder WH. Note that in the case each of the plurality of wafers included in one lot is sequentially carried into measurement device $100_i$ concurrently with the measurement processing by measurement device $100_i$, prior to the loading of the wafer described above, robot 516 sequentially takes out the plurality of wafers in the predetermined FOUP 520 one by one, and the wafers are delivered to carrier member 524 by robot 516 and then carried by carrier member 524 to a predetermined delivery position between measurement device $100_i$ to be delivered to wafer carrying system $70_i$.

In the next step, S106, position (Z position) in the Z-axis direction of wafer W is adjusted. Prior to this adjustment of the Z position, controller $60_i$ controls the internal pressure (drive force in the Z-axis direction that vibration isolator 14 generates) of the air mounts of the three vibration isolators 14 based on relative position information between mark detection system MDS and surface plate 12 regarding the Z-axis direction, the θy direction, and the θx direction measured by the second position measurement system 50, and surface plate 12 is set so that its upper surface becomes parallel to the XY plane and the Z position is at a predetermined reference position. Wafer W is considered to have uniform thickness. Accordingly, in step S106, controller $60_i$ moves surface plate 12 in the Z-axis direction and adjusts the Z position of the surface of wafer W, by adjusting the drive force in the Z-axis direction that the three vibration isolators 14 generates, such as the internal pressure (amount of compressed air) of the air mounts, so that the surface of wafer W is set within a range in which focal position of the optical system is adjustable by the auto-focus function of mark detection system MDS, based on thickness information of wafer W in the memory. Note that controller $60_i$ may perform adjustment of the Z position of the wafer surface based on detection results (output) of the focal position detection system in the case measurement unit 40 is equipped with a focal position detection system. For example, mark detection system MDS may be equipped with a focal position detection system that detects position in the Z-axis direction of the surface of wafer W via an optical element (objective optical element) at the tip. Also, the adjustment of the Z position of the surface of wafer W based on the detection results of the focal position detection system can be performed by moving slider 10 along with surface plate 12, which is moved using vibration isolators 14. Note that a drive system 20 having a structure that can move in slider 10 not only in a direction within the XY plane but also in the Z-axis direction, the θx direction, and the θy direction may be employed, and drive system 20 may be used to move slider 10. Note that Z position adjustment of the wafer surface may include tilt adjustment of the wafer surface. By using drive system 20 to adjust tilt of the wafer surface, in the case an error (a kind of Abbe error) caused by a difference ΔZ of the Z position between the placement surface of grating RG1 and the surface of wafer W, at least one of the measures described above should be performed.

In the next step, S108, search alignment of wafer W is performed. Specifically, for example, at least two search marks positioned in peripheral sections almost symmetrical to the center of wafer W are detected, using mark detection system MDS. Controller $60_i$ controls movement of slider 10 by drive system 20, and while positioning each of the search marks within a detection area (detection field) of mark detection system MDS, acquires measurement information by the first position measurement system 30 and measurement information by the second position measurement system 50, and obtains position information of each search mark, based on detection signals when the search marks formed on wafer W is detected using mark detection system MDS and measurement information by the first position measurement system 30 (or measurement information by the second position measurement system 50).

More specifically, controller $60_i$ obtains position coordinates on a reference coordinate system of the two search marks, based on detection results of mark detection system MDS (relative positional relation between the detection center (index center) of mark detection system MDS obtained from detection signals and each search mark) output from signal processor 49 and measurement values of the first position measurement system 30 (and measurement values of the second position measurement system 50) at the time of detection of each search mark. That is, controller $60_i$ obtains the position coordinates on the reference coordinate system of the two search marks, based on relative positional relation between the detection center (index center) of mark detection system MDS obtained from detection signals of mark detection system MDS and each search mark, measurement values of the first position measurement system 30, and measurement values of the second position measurement system 50 at the time of detection of each search mark. Here, the reference coordinate system is to be an orthogonal coordinate system set by measurement axes of the first position measurement system 30.

Thereafter, a residual rotation error of wafer W is calculated from the position coordinates of the two search marks, and slider 10 is finely rotated so that this rotation error becomes almost zero. This completes the search alignment of wafer W. Note that since wafer W is actually loaded on slider 10 in a state where pre-alignment has been performed, the center position displacement of wafer W is small enough to be ignored, and the residual rotation error is extremely small.

In the next step, S110, a judgment is made of whether or not the measurement mode that has been set is the A mode. Then, in the case the judgment in this step S110 is affirmed, that is, when A mode has been set, the processing then proceeds to step S112.

In step S112, alignment measurement (full-shot one point measurement, or in other words, full-shot EGA measurement) is performed, that is, one wafer mark is measured for each of the 98 shots. Specifically, controller $60_i$ obtains position coordinates on the reference coordinate system of wafer marks on wafer W, that is, position coordinates of the shots, similarly to the measurement of position coordinates of each search alignment mark at the time of search alignment described earlier. However, in this case, different from the time of search alignment, measurement information of the second position measurement system 50 is used without exception when calculating position coordinates of the shots. The reason, as is described earlier, is that controller $60_i$ controls the actuators of the three vibration isolators 14 real time based on measurement information of the second position measurement system 50, so that position within the XY plane of detection points of the first position measurement system 30 coincides with the detection center of mark detection system MDS, for example, at a nm level, and also the surface of wafer W on slider 10 coincides with the detection position of mark detection system MDS. However, at the time of detection of the wafer marks, since there is no assurance that the position within the XY plane of the detection points of the first position measurement system 30 coincides with the detection center of mark detection system MDS at, for example, a nm level, it is necessary to calculate the position coordinates of the shots, taking into consideration position displacement between the detection point and the detection center as an offset. For example, by correcting the detection results of mark detection system MDS or the measurement values of the first position measurement system 30 using the offset described above, position coordinates on the reference coordinate system of the wafer marks on wafer W to be calculated can be corrected.

Here, on this full-shot one point measurement, controller $60_i$ moves slider 10 (wafer W) in a direction in at least one of the X-axis direction and the Y-axis direction via drive system 20 based on measurement information of the first position measurement system 30 and measurement information of the second position measurement system 50, and positions the wafer mark within a detection area of mark detection system MDS. That is, the full-shot one point measurement is performed, moving slider 10 within the XY plane with respect to mark detection system MDS by a step-and-repeat method.

Note that in the case measurement unit 40 is equipped with a focal position detection system, controller $60_i$ may perform adjustment of the Z position of the wafer surface, based on detection results (output) of the focal position detection system, similarly to the description in step S106.

On alignment measurement (full-shot one point measurement) to all wafers in step S112, when slider 10 is moved within the XY plane, while an offset load acts on surface plate 12 with the movement, in the embodiment, controller $60_i$ individually performs feedforward control on the three vibration isolators 14 so that the influence of the offset load is canceled out according to the X, Y coordinate positions of the slider included in the measurement information of the first position measurement system 30, and individually controls the drive force in the Z-axis direction that each of the vibration isolators 14 generates. Note that controller $60_i$ may individually perform feedforward control of the three vibration isolators 14 so that the influence of the offset load is canceled out by predicting the offset load acting on surface plate 12 based on information on a known moving route of slider 10, without using the measurement information of the first position measurement system 30. Also, in the embodiment, since information on unevenness (hereinafter called holder flatness information) of a wafer holding surface (a surface set by the upper end of a plurality of pins of a pin chuck) of wafer holder WH is to be obtained in advance by experiment or the like, on alignment measurement (e.g., full-shot one point measurement), when slider 10 is moved, controller $60_i$ finely adjusts the Z position of surface plate 12 by performing feedforward control of the three vibration isolators 14 so that an area including wafer marks subject to measurement on the wafer W surface is smoothly positioned within a range of the focal depth of the optical system of mark detection system MDS, based on the holder flatness information. Note that one of the feedforward control to cancel out the influence of the offset load acting on surface plate 12 and the feedforward control based on the holder flatness information described above, or both of the feedforward controls do not have to be executed.

Note that in the case magnification of mark detection system MDS is adjustable, the magnification may be set low on search alignment, and the magnification may be set high on alignment measurement. Also, in the case center position displacement and residual rotation error of wafer W loaded on slider 10 are small enough to be ignored, step 108 may be omitted.

In the full-shot one point measurement in step S112, actual measurement values are to be detected of position coordinates of the sample shot areas (sample shots) in the reference coordinate system used in the EGA operation to be described later on. Sample shots, among all shots on wafer W, refer to specific shots of a plurality of numbers (at least three) decided in advance to be used in the EGA operation which will be described later on. Note that in the full-shot one point measurement, all shots on wafer W are to be sample shots. After step S112, the processing proceeds to step S124.

Meanwhile, in the case the judgment made in step S110 is negative, that is, in the case B mode is set, the processing moves to step S114 in which the judgment is made of whether count value i is smaller than a predetermined number K (K denotes a natural number specified in advance that satisfies 1<K<I, e.g., 4) or not. Note that count value i is incremented in step S128 to be described later on. Then, in the case the judgment in this step S114 is affirmed, the processing then moves to step S120 in which full-shot multipoint measurement is performed. Here, full-shot multipoint measurement means that the plurality of wafer marks is measured for all the shot areas on wafer W. The plurality of wafer marks which serves as a measurement target is specified in advance. For example, a plurality of wafer marks which is arranged in a shape of a shot (shape error from an ideal grid) that can be obtained by statistical calculation may be the measurement target. Since the procedure for measurement is similar to the case of full-shot one point measurement in step S112 except for the point that the number of marks of the measurement targets is different, details thereabout will be omitted. After step S120, the processing moves to step S124.

Meanwhile, in the case the judgment made in step S114 is negative, the processing moves to step S116 in which the judgment is made of whether count value i is smaller than K+1 or not. Here, since the judgment in this step S116 is affirmed when count value i is i≥K and i<k+1, it becomes the case when i=K.

In the case the judgment made in step S116 is affirmed, the processing proceeds to step S118 in which wafer marks that are to be measurement targets are decided for each shot area, based on detection results of the wafer marks with respect to K−1 pieces (e.g., three in the case K=4) wafers W on which measurement has been performed. Specifically, a judgment is made for each shot on whether detection of one wafer mark is enough, or a plurality of wafer marks should be detected. In the latter case, a judgment is also made on which wafer marks are to be the measurement targets. For example, the judgment is made on whether a plurality of wafer marks should be detected for each shot or detection of one wafer mark is enough, by obtaining a difference (an absolute value) between an actual position and a design position for each of the plurality of wafer marks for each shot, and seeing if a difference between the maximum value and the minimum value of the difference exceeds a threshold value or not. In the former case, the wafer marks to be detected are decided, for example, so that the marks include a wafer mark whose difference (absolute value) between the actual position and the design position becomes maximal and a wafer mark whose difference becomes minimal. After step S118, the processing proceeds to step S122.

Meanwhile, in the case the judgment in step S116 is negative, the processing then moves to step S122. Here, the case in which the judgment in step S116 is negative is when count value i satisfies K+1≤i, and before this without fail, count value i=K and in step S118, the wafer marks that are to be the measurement targets are decided for each shot area.

In step S122, the wafer marks that are decided to be measurement targets for each shot in step S118 are measured. Since the procedure for measurement is similar to the case of full-shot one point measurement in step S112 except for the point that the number of marks of the measurement targets is different, details thereabout will be omitted. After step S122, the processing moves to step S124.

As is obvious from the description so far, in the case of B mode, full-shot multipoint measurement is performed on the wafers from the first wafer in a lot to the K−1$^{th}$ wafer (e.g., the third wafer), and from the K$^{th}$ wafer (the fourth wafer) to the I$^{th}$ wafer (the 25th wafer), measurement of wafer marks decided for each shot is performed, based on results of the full-shot multipoint measurement of the first K−1 (e.g., three) wafers.

In step S124, EGA operation is performed using position information of wafer marks measured in any of the steps of steps S112, S120, and S122. EGA operation, refers to a statistical calculation performed after measurement (EGA measurement) of wafer marks described above for obtaining a coefficient of a model formula which expresses a relation between a position coordinate of a shot and a correction amount of the position coordinate of the shot using a statistical calculation such a least squares method, based on data on a difference between a design value and the actual measurement value of a position coordinate of a sample shot.

In the embodiment, as an example, the following model formula is used to calculate the correction amount from the design value of the position coordinate of the shot.

$$\begin{aligned} dx &= a_0 + a_1 \cdot X + a_2 \cdot Y + a_3 \cdot X^2 + a_4 \cdot X \cdot Y + a_5 \cdot Y^2 + \\ & \quad a_6 \cdot X^3 + a_7 \cdot X^2 Y + a_8 \cdot X \cdot Y^2 + a_9 \cdot Y^3 \ldots \\ dy &= b_0 + b_1 \cdot X + b_2 \cdot Y + b_3 \cdot X^2 + b_4 \cdot X \cdot Y + b_5 \cdot Y^2 + \\ & \quad b_6 \cdot X^3 + b_7 \cdot X^2 \cdot Y + b_8 \cdot X \cdot Y^2 + b_9 \cdot Y^3 \ldots \end{aligned} \quad (1)$$

Here, dx and dy are correction amounts in the X-axis direction and the Y-axis direction from design values of position coordinates of a shot, and X and Y are design position coordinates of the shot in a wafer coordinate system whose origin is set at the center of wafer W. That is, formula (1) described above is a polynomial expression of design position coordinates X and Y of each shot in the wafer coordinate system whose origin is the center of the wafer, and is a model formula that expresses a relation between position coordinates X and Y and the correction amounts (alignment correction component) dx and dy of the position coordinates of the shot. Note that in the embodiment, since rotation between the reference coordinate system and the wafer coordinate system is canceled by the search alignment described earlier, the description below will be made describing the coordinate systems as the reference coordinate system, without making any distinction in particular between the reference coordinate system and the wafer coordinate system.

When using model formula (1), correction amount of the position coordinates of a shot can be obtained from coordinate positions X and Y of the shot of wafer W. However, to calculate this correction amount, coefficients $a_0, a_1, \ldots, b_0, b_1, \ldots$ have to be obtained. After EGA measurement, coefficients $a_0, a_1, \ldots, b_0, b_1, \ldots$ of formula (1) described above are obtained using statistical calculation such as the least squares method, based on data on a difference between the design value and the actual measurement value of the position coordinate of the sample shot.

After coefficients $a_0, a_1, \ldots, b_0, b_1, \ldots$ of formula (1) are decided, by substituting design position coordinates X and Y of each shot (divided area) in the wafer coordinate system into model formula (1) whose coefficients have been decided, and obtaining correction amounts dx and dy of the position coordinates of each shot, a true arrangement (not only linear components but also including nonlinear components as deformation components) can be obtained for the plurality of shots (divided areas) on wafer W.

Now, in the case of wafer W on which exposure has already been performed, the waveform of detection signals obtained from the measurement results is not always favorable for all wafer marks due to the influence of the process so far. When positions of wafer marks having such unfavorable measurement results (waveform of detection signals) are included in the EGA operation described above, position error of the wafer marks having such unfavorable measurement results (waveform of detection signals) has an adverse effect on the calculation results of coefficients $a_0, a_1, \ldots, b_0, b_1, \ldots$.

Therefore, in the embodiment, signal processor 49 is to send only measurement results of the wafer marks with favorable measurement results to controller $60_i$, and controller $60_i$ is to execute the EGA operation described above, using positions of all the wafer marks whose measurement results have been received. Note that orders of the polynomial expression in formula (1) described above are not limited in particular. Controller $60_i$ associates the results of EGA operation with identification information (e.g., wafer number, lot number) of the wafers and stores the results as an alignment history data file in an inner or outer storage device. Note that information other than the results of the EGA operation (e.g., information on marks used in the EGA operation) may also be included in the alignment history data file.

When the EGA operation is finished in step S124, the processing proceeds to step S126 where wafer W is unloaded from slider 10. This unloading is performed by wafer carrying system $70_i$ and the vertical movement member on slider 10 under the control of controller $60_i$, in a procedure opposite to the loading procedure in step S104. Note that in the case each of the wafers in one lot is sequentially carried into measurement device $100_i$ and is sequentially carried out from measurement device $100_i$ concurrently with the measurement processing by measurement device $100_i$, wafer W which has finished measurement is to be delivered to carrier member 526 by wafer carrying system $70_i$, carried to the unloading side wafer delivery position described earlier by carrier member 526, and then is to be returned into the predetermined FOPU 520 by robot 516.

In the next step S128, after count value i of the counter is incremented by 1 (i←i+1), the processing proceeds to step S130 in which the judgment is made of whether count value i is larger than a total number I of the wafers in the lot or not. Then, in the case the judgment in this step S130 is negative, the judgment is made that processing to all the wafers in the lot is not yet complete, therefore, the processing returns to step S104, and thereinafter the processing from step S104 to step S130 is repeated until the judgment in step S130 is affirmed.

Then, when the judgment in step S130 is affirmed, this completes the series of processing in this routine, according to the judgment that the processing to all the wafers in the lot has been completed.

As is obvious from the description so far, according to measurement device $100_i$, position information (coordinate position information) of at least one each of the wafer marks is measured for each of I (e.g., 98) shots on wafer W upon alignment measurement, and by using this position information in statistical calculation such as the least squares method, coefficients $a_0, a_1, \ldots, b_0, b_1, \ldots$ of formula (1) above are obtained. Accordingly, it becomes possible to accurately obtain deformation components of a wafer grid not only for linear components but also for nonlinear components. Here, the wafer grid refers to a grid which is formed when the center of shots on wafer W arranged according to a shot map (data concerning an arrangement of shots formed on wafer W) are connected. Obtaining correction amounts (alignment correction components) dx and dy of position coordinates of the shots for a plurality of shots is none other than obtaining deformation components of the wafer grid. Note that in the description, the wafer grid will be referred to shortly as a "grid," or also as an "arrangement of shot area (or shot)."

In measurement system 500 according to the embodiment, measurement processing in accordance with the flowchart described earlier can be performed concurrently by the three measurement devices $100_1$ to $100_3$. That is, by measurement devices $100_1$ to $100_3$, position measurement of at least one wafer mark with respect to all shots of each wafer can be performed on each lot of wafers housed in the wafer carrier; a total of three lots of wafers, within a measurement processing time required for substantially one lot, and it becomes possible to accurately obtain deformation components of the wafer grid not only for linear components but also for nonlinear components. Note that also in the case of performing carry-in of the wafer to each measurement device $100_i$ and carry-out of the wafer that has been measured from each measurement device $100_i$ concurrently with the measurement processing, processing can be performed concurrently on each lot inside the three FOUPs 520 carried to each of the three loading ports 514; a total of three lots of wafers, and to the three lots of wafers, position measurement of at least one wafer mark with respect to all shots of each wafer becomes possible in a measurement processing time of substantially one lot, and it becomes possible to accurately obtain deformation components of the wafer grid not only for linear components but also for nonlinear components.

Information on the wafer grid of each wafer that has been obtained, e.g., data on deformation components of the wafer grid of each wafer that has been obtained (data of model formula (1) after coefficients $a_0, a_1, \ldots, b_0, b_1, \ldots$ have been determined), is sent to measurement system controller 530 as a part of alignment history data file for each wafer by controller $60_i$ of measurement device $100_i$. Measurement system controller 530 stores the information on the wafer grid of each wafer that has been received, e.g., an alignment history data file including data on deformation components of the wafer grid of each wafer that has been received (data of model formula (1) after coefficients $a_0, a_1, \ldots, b_0, b_1, \ldots$ have been determined), for example, in an internal storage device for each wafer.

Measurement system controller 530 sends information on the wafer grid (alignment history data file) for each of a plurality of wafers included in one lot to host computer 2000, when measurement of all the wafers included in the lot has been completed. Needless to say, the information on the wafer grid (alignment history data file) sent from measurement system 500 also includes data on nonlinear components of the wafer grid.

Note that controller $60_i$ of measurement device $100_i$ may be connected to host computer 2000 via LAN 1500, and the information on the wafer grid (alignment history data file) may be sent from controller $60_i$ to host computer 2000, without going through measurement system controller 530.

Also, in the embodiment described above, while the information on the wafer grid is to be sent (output) from measurement system 500, the information (data) sent from the measurement system is not limited to this, and for example, coordinate position information of a plurality of wafer marks measured by measurement device $100_i$ may be sent (output) as a part of the alignment history data file for each wafer.

Figure 11:
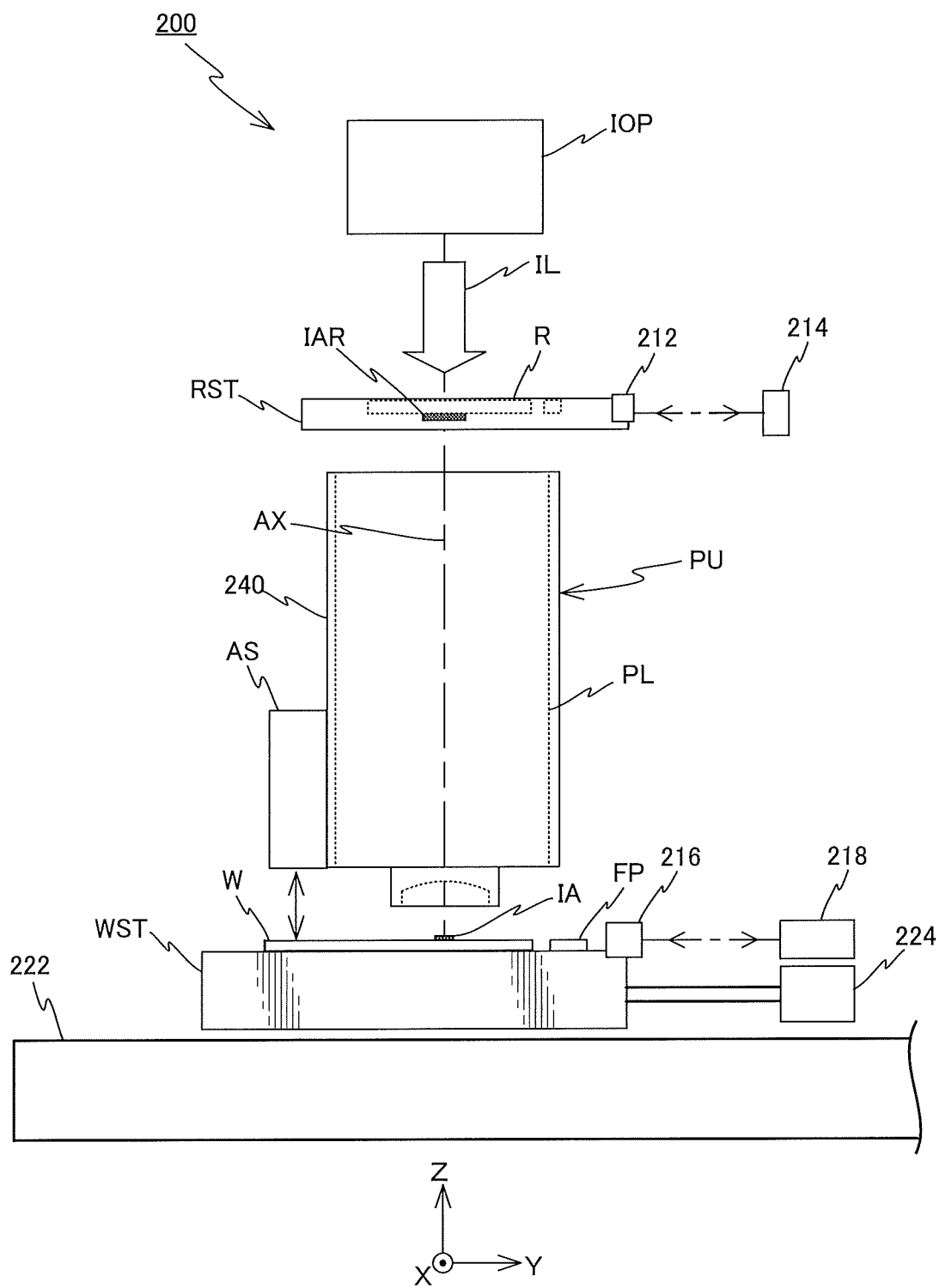
FIG. 11 is a view schematically showing an exposure apparatus shown in FIG. 1.

Exposure apparatus 200 that structures a part of substrate processing system 1000, as an example, is a projection exposure apparatus (scanner) of a step-and-scan method. FIG. 11 shows component parts inside the chamber of exposure apparatus 200, with the component parts partly omitted.

Exposure apparatus 200, as is shown in FIG. 11, is equipped with an illumination system IOP, a reticle stage RST that holds a reticle R, a projection unit PU that projects an image of a pattern formed on reticle R on wafer W coated with a sensitive agent (resist), a wafer stage WST that moves within the XY plane holding wafer W, a control system for these parts and the like. Exposure apparatus 200 is equipped with a projection optical system PL that has an optical axis AX in the Z-axis direction, parallel to optical axis AX1 of mark detection system MDS described earlier.

Illumination system IOP includes a light source and an illumination optical system connected to the light source via a light transmitting optical system, and illuminates a slit shaped illumination area IAR set (limited) by a reticle blind (masking system) on reticle R extending narrowly in the X-axis direction (orthogonal direction of the page surface in FIG. 11) with an almost uniform illuminance. The structure of illumination system IOP is disclosed in, for example, U.S. Patent Application Publication No. 2003/0025890 and the like. Here, as illumination light IL, an ArF excimer laser beam (wavelength 193 nm) is used as an example.

Reticle stage RST is arranged below illumination system IOP in FIG. 11. Reticle stage RST can be finely moved within a horizontal plane (XY plane) on a reticle stage surface plate not shown by a reticle stage drive system 211 (not shown in FIG. 11, refer to FIG. 12) which includes a linear motor and the like, and can also be moved in predetermined strokes in a scanning direction (the Y-axis direction which is the lateral direction within the page in FIG. 11).

On reticle stage RST, reticle R is mounted that has a pattern area formed on a surface on the −Z side (pattern surface) and a plurality of marks formed whose positional relation with the pattern area is known. Position information (including rotation information in the θz direction) within the XY plane of reticle stage RST is constantly detected by a reticle laser interferometer (hereinafter referred to as "reticle interferometer") 214 via a movable mirror 212 (or a reflection surface formed on an end surface of reticle stage RST), at a resolution of, for example, around 0.25 nm. Measurement information of reticle interferometer 214 is supplied to exposure controller 220 (refer to FIG. 12). Note that measurement of the position information within the XY plane of reticle stage RST described above may be performed by an encoder, instead of reticle laser interferometer 214.

Projection unit PU is arranged below reticle stage RST in FIG. 11. Projection unit PU includes a barrel 240, and projection optical system PL held within barrel 240. Projection optical system PL, for example, is double telecentric, and has a predetermined projection magnification (e.g., ¼ times, ⅕ times, ⅛ times or the like). Reticle R is arranged so that its pattern surface almost coincides with a first surface (object plane) of projection optical system PL, and wafer W whose surface is coated with a resist (sensitive agent) is arranged on a second surface (image plane) side of projection optical system PL. Therefore, when illumination area IAR on reticle R is illuminated with illumination light IL from illumination system IOP, illumination light IL having passed through reticle R forms a reduced image (a reduced image of a part of the circuit pattern) of the circuit pattern of reticle R within illumination area IAR on an area (hereinafter also called an exposure area) IA on wafer W conjugate with illumination area IAR, via projection optical system PL. Then, by reticle stage RST and wafer stage WST being synchronously driven, reticle R is relatively moved in the scanning direction (the Y-axis direction) with respect to illumination area IAR (illumination light IL) and wafer W is relatively moved in the scanning direction (the Y-axis direction) with respect to exposure area IA (illumination light IL), so that scanning exposure of a shot area (divided area) on wafer W is performed and the pattern of reticle R is transferred onto the shot area.

As projection optical system PL, as an example, a refraction system is used consisting of a plurality of only refraction optical elements (lens elements), e.g., around 10 to 20, arranged along optical axis AX parallel to the Z-axis direction. Of the plurality of lens elements structuring projection optical system PL, the plurality of lens elements on the object surface side (reticle R side) is a movable lens that can be shifted in the Z-axis direction (the optical axis direction of projection optical system PL) and is movable in a tilt direction (that is, the θx direction and the θy direction) with respect to the XY plane, by driving elements not shown, such as, for example, a piezoelectric element and the like. Then, by an image forming characteristic correction controller 248 (not shown in FIG. 11, refer to FIG. 12) independently adjusting applied voltage with respect to each driving element based on instructions from exposure controller 220, each of the movable lenses is moved individually so that various image forming characteristics (magnification, distortion aberration, astigmatism, coma aberration, curvature of field and the like) are to be adjusted. Note that instead of, or in addition to moving the movable lenses, a structure may be employed in which an airtight chamber is provided in between specific lens elements which are adjacent inside barrel 240, and the pressure of gas inside the airtight chamber is controlled by image forming characteristic correction controller 248, or a structure may be employed in which a center wavelength of illumination light IL can be shifted by image forming characteristic correction controller 248. Such structures may also allow the image forming characteristics of projection optical system PL to be adjusted.

Wafer stage WST is moved on a wafer stage surface plate 222 in predetermined strokes in the X-axis direction and the Y-axis direction by a stage drive system 224 (indicated as a block for convenience in FIG. 11) which includes a planar motor, a linear motor or the like, and is also finely moved in the Z-axis direction, the θx direction, the θy direction, and the θz direction. On wafer stage WST, wafer W is held by vacuum chucking or the like via a wafer holder (not shown). In the embodiment, the wafer holder is to be able to hold a 300 mm wafer by suction. Note that, instead of wafer stage WST, a stage device can be used that is equipped with a first stage which moves in the X-axis direction, the Y-axis direction and the θz direction, and a second stage which finely moves in the Z-axis direction, the θx direction, and the θy direction on the first stage. Note that one of wafer stage WST and the wafer holder of wafer stage WST or both may be called "a second substrate holding member."

Position information (including rotation information (yawing amount (rotation amount θz in the θz direction), pitching amount (rotation amount θx in the θx direction), and rolling amount (rotation amount θy in the θy direction)) within the XY plane of wafer stage WST is constantly detected by a laser interferometer system (hereinafter shortly referred to as "interferometer system") 218 via a movable mirror 216 (or a reflection surface formed on an end surface of wafer stage WST) at a resolution of, for example, around 0.25 nm. Note that measurement of the position information within the XY plane of wafer stage WST may be performed by an encoder system, instead of interferometer system 218.

Figure 12:
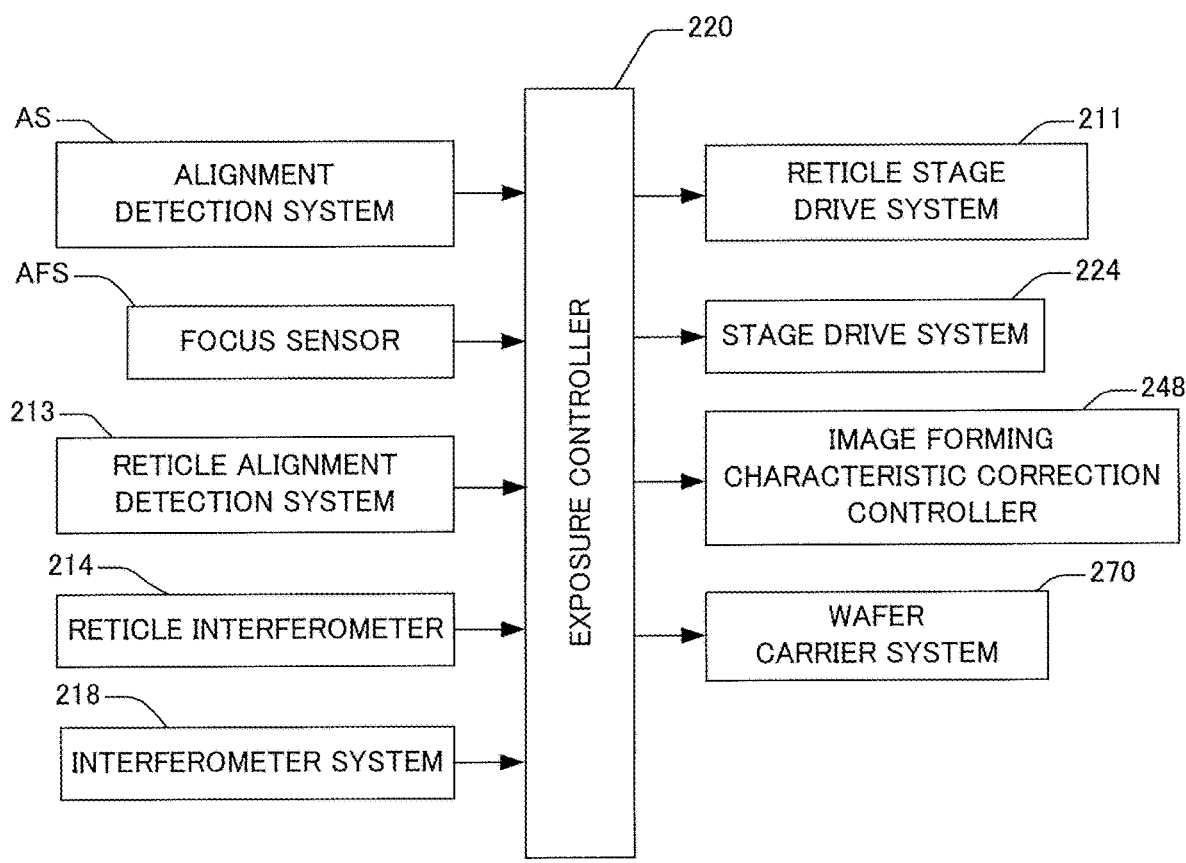

Measurement information of interferometer system 218 is supplied to exposure controller 220 (refer to FIG. 12). Exposure controller 220 controls the position (including rotation in the θz direction) within the XY plane of wafer stage WST via stage drive system 224, based on measurement information of interferometer system 218.

Also, although it is omitted in FIG. 11, position in the Z-axis direction and tilt amount of the surface of wafer W is measured by a focus sensor AFS (refer to FIG. 12) consisting of a multi-point focal point detection system of an oblique incidence method disclosed in, for example, U.S. Pat. No. 5,448,332 and the like. Measurement information of this focus sensor AFS is also supplied to exposure controller 220 (refer to FIG. 12).

Also, on wafer stage WST, a fiducial plate FP is fixed whose surface is at the same height as the surface of wafer W. On the surface of this fiducial plate FP, a first fiducial mark used for base line measurement and the like of an alignment detection system AS and a pair of second fiducial marks detected with a reticle alignment detection system to be described later on are formed.

On a side surface of barrel 240 of projection unit PU, alignment detection system AS is provided that detects alignment marks formed on wafer W or the first fiducial mark. As alignment detection system AS, as an example, an FIA (Field Image Alignment) system is used, which is a kind of an image forming alignment sensor of an image processing method that measures a mark position by irradiating a broadband (wide band) light such as a halogen lamp on a mark and performing image processing on an image of this mark. Note that instead of alignment detection system AS of the image processing method, or along with alignment detection system AS, a diffracted light interference type alignment system may also be used.

In exposure apparatus 200, furthermore above reticle stage RST, a pair of reticle alignment detection systems 213 (not shown in FIG. 11, refer to FIG. 12) that can simultaneously detect a pair of reticle marks at the same Y position on reticle R mounted on reticle stage RST is provided spaced apart by a predetermined distance in the X-axis direction. Detection results of the marks by reticle alignment detection system 213 are supplied to exposure controller 220.

FIG. 12 shows an input output relation of exposure controller 220 in a block diagram. As is shown in FIG. 12, other than each of the components described above, exposure apparatus 200 is equipped with a wafer carrying system 270 and the like that carries the wafers, connected to exposure controller 220. Exposure controller 220 includes a microcomputer, a workstation or the like, and has overall control over the whole apparatus including each of the components described above. Wafer carrying system 270, for example, consists of a horizontal multi-joint arm robot.

Referring back to FIG. 1, although it is omitted in the drawing, C/D 300 is equipped with, for example, a coating section in which coating of a sensitive agent on a wafer is performed, a developing section in which the wafer can be developed, a baking section that performs pre-bake (PB) and pre-develop bake (post-exposure bake: PEB), and a wafer carrying system (hereinafter referred to as a C/D inner carrying system for the sake of convenience). C/D 300 is furthermore equipped with a temperature controlling section 330 that can control the temperature of the wafer. Temperature controlling section 330 is normally a cooling section, and is equipped, for example, with a flat plate (temperature controlling device) called a cool plate. The cool plate is cooled, for example, by circulating cooling water. Other than this, thermoelectric cooling by the Peltier effect may be used in some cases.

Overlay measuring instrument 400 measures overlay displacement, by measuring relative positional relation between an image (resist images) of a first mark transferred on exposure of an underlying layer which structures an overlay measuring mark (registration mark) formed along with each shot on wafer W that has finished development in C/D 300 and an image of a second mark transferred on exposure of a current layer. Here, as a set of the first mark image and the corresponding second mark image, for example, a resist image of a box-in-box mark consisting of an external box mark and an in-box mark arranged on the inner side of the external box can be used.

Analysis device 3000 performs various analyses and operations, in accordance with instructions from host computer 2000. In one example, analysis device 3000, for example, performs an operation according to a predetermined program, based on measurement results of overlay displacement from overlay measuring instrument 400, and calculates correction values which are to be fed back to exposure apparatus 200.

In substrate processing system 1000 according to the embodiment, exposure apparatus 200 and C/D 300 both are equipped with a bar code reader (not shown) similarly to measurement device $100_i$, and while wafers are being carried by each of wafer carrying system 270 (refer to FIG. 12) and the C/D inner carrying system (not shown), the bar code reader appropriately reads identification information of each wafer, such as wafer number, lot number and the like. In the description below, to simplify the explanation, description related to reading the identification information for each wafer using the bar code reader is to be omitted.

In substrate processing system 1000, multiple wafers are processed continuously, by both measurement system 500 and a lithography system including exposure apparatus 200 and C/D 300. In substrate processing system 1000, measurement processing described earlier on the wafer which is the measurement target described earlier by measurement system 500 and processing by the lithography system with respect to the wafer that has undergone measurement by measurement system 500 are performed independent of each other. Therefore, while there is a restriction that the processing by the lithography system is performed on wafers which have completed measurement by measurement system 500, the total processing sequence can be decided so that the throughput of the entire substrate processing system becomes maximum.

Hereinafter, an operation flow will be described of a case in which processing is continuously performed on multiple wafers by the lithography system including exposure apparatus 200 and C/D 300.

Firstly, the C/D inner carrying system (e.g., a SCARA robot) takes out a first wafer (described as $W_1$) from a wafer carrier placed within a chamber of C/D 300 and carries in the wafer to the coating section. In accordance with the carry-in, the coating section begins coating of resist. When the coating of resist is completed, the C/D inner carrying system takes out wafer $W_1$ from the coating section, and carries the wafer into the baking section. In accordance with the carry-in, heating processing (PB) of wafer $W_1$ begins at the baking section. Then, when PB of the wafer is completed, the C/D inner carrying system takes out wafer $W_1$ from the baking section, and carries the wafer into temperature controlling section 330. In accordance with the carry-in, cooling of wafer $W_1$ using the cool plate inside temperature controlling section 330 begins. This cooling is performed with the target temperature being a temperature which does not have any influence inside exposure apparatus 200, generally, the target temperature of an air conditioning system of exposure apparatus 200 which is decided, for example, in a range of 20 to 25 degrees. Normally, at the point when the wafer is delivered to temperature controlling section 330, the temperature of the wafer is within a range of ±0.3 [° C.], however, temperature controlling section 330 adjusts the temperature to a range of ±10 [mK] to the target temperature.

Then, when the cooling (temperature control) inside temperature controlling section 330 is completed, wafer $W_1$ is mounted on a loading side substrate mounting section of a substrate delivery section provided in between C/D 300 and exposure apparatus 200 by the C/D inner carrying system.

Inside C/D 300, a series of operations on wafers similar to the ones described above as in resist coating, PB, cooling, and carrying operation of the wafers described above that accompanies the series of operations are repeatedly performed, and the wafers are sequentially mounted on the loading side substrate mounting section. Note that practically by providing two or more each of the coating section and the C/D inner carrying system inside the chamber of C/D 300, parallel processing on a plurality of wafers becomes possible and the time required for pre-exposure processing can be shortened.

Wafer $W_1$ mounted on the loading side substrate mounting section described earlier is carried to a predetermined waiting position inside exposure apparatus 200 by wafer carrying system 270. However, the first wafer, wafer $W_1$, is loaded immediately onto wafer stage WST by exposure controller 220, without waiting at the waiting position. This loading of the wafer is performed under the control of exposure controller 220 similarly to the loading performed in measurement device $100_i$ described earlier, using the vertical movement member (not shown) on wafer stage WST and wafer carrying system 270. After the loading, search alignment similarly to the one described earlier and wafer alignment of the EGA method where shots of, e.g., around 3 to 16 are to be alignment shots are performed to the wafer on wafer stage WST, using alignment detection system AS. On wafer alignment by the EGA method, alignment history data file of the wafer (target wafer) subject to wafer alignment and exposure in exposure apparatus 200 is supplied from host computer 2000 to exposure controller 220 of exposure apparatus 200, along with identification information (e.g., wafer number, lot number) and the like of the target wafer. The alignment history data that exposure apparatus 200 has acquired from host computer 2000 includes wafer grid information of each wafer measured by measurement system 500, and exposure controller 220 performs wafer alignment as in the description below according to the information on measurement mode included in the acquired alignment history data, after a predetermined preparatory operation. Note that exposure controller 220 and measurement system controller 530 may communicate alignment history data and the like, without going through host computer 2000.

Here, the reason of performing wafer alignment of the EGA method where shots of, e.g., around 3 to 16 are to be alignment shots in exposure apparatus 200 will be described, prior to specifically describing the wafer alignment.

Correction amounts (coefficients $a_0, a_1, \ldots, b_0, b_1, \ldots$ of formula (1) described above) of position coordinates of shots on wafer W obtained by measurement device $100_i$ are used, for example, for positioning of the wafer with respect to the exposure position on exposure of wafer W by exposure apparatus 200. However, wafer W whose correction amounts of position coordinates have been measured with measurement device $100_i$ by exposure apparatus 200 is housed inside FOUP 520 after being unloaded from slider 10 of measurement device $100_i$ as is described earlier, and FOUP 520 is carried into C/D 300 by the OHT and other carrying systems. Then, after wafer W is coated with resist by C/D 300, wafer W is loaded on wafer stage WST of exposure apparatus 200 for exposure. In this case, with wafer holder WH on slider 10 and the wafer holder on wafer stage WST of exposure apparatus 200, holding state of wafer W differs due to individual difference between the wafer holders even if the same type of wafer holder is used. Therefore, even if shot of wafer W position coordinates correction amounts (coefficients $a_0, a_1, \ldots, b_0, b_1, \ldots$ of formula (1) described above) of position coordinates of shots on wafer W are obtained with measurement device $100_i$, all the coefficients $a_0, a_1, \ldots, b_0, b_1, \ldots$ cannot be used as it is. However, it can be considered that low-order components (linear components) of the first-order or less of the correction amounts of the position coordinates of the shots are affected by the different holding state of wafer W for each wafer holder, and high-order components of the second-order or more are hardly affected. This is because high-order components of the second-order or more are considered to be components that occur due to deformation of wafer W induced mainly by the process, and it is safe to consider that the components have no relation to the holding state of the wafer by the wafer holders.

Based on such consideration, coefficients $a_3, a_4, \ldots, a_9, \ldots$, and $b_3, b_4, \ldots, b_9, \ldots$ of high-order components obtained taking a certain amount of time for wafer W by measurement device $100_i$ can be used without any changes also as coefficients of high-order components of the correction amounts of the position coordinates of wafer W in exposure apparatus 200. Accordingly, on wafer stage WST of exposure apparatus 200, performing only a simple EGA measurement (e.g., measurement of around 3 to 16 wafer marks) to obtain linear components of the correction amounts of the position coordinates of wafer W is enough.

First of all, a case will be described in which information on mode A is included in the alignment history data of the target wafer. In this case, a number of wafer marks corresponding to the number of alignment shots are selected as detection targets from wafer marks included in the alignment history data whose position information is measured (marks whose position information is used when calculating the correction amounts) by measurement device $100_i$, and the wafer marks serving as the detection targets are detected using alignment detection system AS, and based on the detection results and the position (measurement information according to interferometer system 218) of wafer stage WST at the time of detection, position information of each wafer mark of the detection targets is obtained, and using the position information, EGA operation is performed and each coefficient of the following formula (2) is obtained.

$$\left. \begin{array}{l} dx = c_0 + c_1 \cdot X + c_2 \cdot Y \\ dy = d_0 + d_1 \cdot X + d_2 \cdot Y \end{array} \right\} \quad (2)$$

Then, exposure controller 220 replaces coefficients ($c_0, c_1, c_2, d_0, d_1, d_2$) obtained here with coefficients ($a_0, a_1, a_2, b_0, b_1, b_2$) included in the data of deformation components of the wafer grid of the target wafer, and by using a polynomial expression on design position coordinates X and Y of each shot in a wafer coordinate system whose origin is the center of the wafer expressed by the following formula (3) which includes the coefficients after replacement, obtains correction amounts (alignment correction components) dx and dy of the position coordinates of each shot, and decides target positions (hereinafter called positioning target position for convenience) for positioning each shot to the exposure position (projection position of the reticle pattern) on exposure of each shot for correcting the wafer grid, based on the correction amounts. Note that in the embodiment, while exposure is performed not by a static exposure method but by a scanning exposure method, the target positions are referred to as positioning target position for convenience.

$$\left. \begin{array}{l} dx = c_0 + c_1 \cdot X + c_2 \cdot Y + a_3 \cdot X^2 + a_4 \cdot X \cdot Y + a_5 \cdot Y^2 + \\ \quad a_6 \cdot X^3 + a_7 \cdot X^2 Y + a_8 \cdot X \cdot Y^2 + a_9 \cdot Y^3 \ldots \\ dy = d_0 + d_1 \cdot X + d_2 \cdot Y + b_3 \cdot X^2 + b_4 \cdot X \cdot Y + b_5 \cdot Y^2 + \\ \quad b_6 \cdot X^3 + b_7 \cdot X^2 \cdot Y + b_8 \cdot X \cdot Y^2 + b_9 \cdot Y^3 \ldots \end{array} \right\} \quad (3)$$

Note that since rotation between the reference coordinate system (stage coordinate system) and the wafer coordinate system is canceled by the search alignment also in exposure apparatus 200, distinction between the reference coordinate system and the wafer coordinate system does not have to be made in particular.

Next, a case will be described in which information on B mode is included in the alignment history data of the target wafer. In this case, exposure controller 220 decides the positioning target position for each shot to correct the wafer grid according to a procedure similar to the case described above when information on A mode is included. However, in this case, in the alignment history data, of a plurality of wafer marks for some shots and one wafer mark for each of the remaining shots, wafer marks whose detection signals are good are included as wafer marks whose position information is used for calculating the correction amounts.

Therefore, in addition to deciding the positioning target position of each shot described above, exposure controller 220 selects a number of wafer marks necessary to obtain shape of shots from the plurality of wafer marks for some shots described above, and obtains shape of shots, for example, by performing a statistical calculation (also called in-shot multi-point EGA operation) which applies a least squares method to a model formula [Mathematical 7] disclosed in U.S. Pat. No. 6,876,946, using position information (actual measurement values) of those wafer marks. Specifically, of the 10 parameters in the model formula of [Mathematical 7] disclosed in U.S. Pat. No. 6,876,946 described above, chip rotation (θ), chip rectangular degree error (w), chip scaling (rx) in the x direction, and chip scaling (ry) in the y direction are obtained. Note that a detailed description for in-shot multi-point EGA operation is omitted, since the details are disclosed in the U.S. patent described above.

Then, exposure controller 220 performs exposure by a step-and-scan method to each shot on wafer $W_1$, while performing position control of wafer stage WST according to the positioning target position. Here, in the case shape of shots has also been obtained by in-shot multi-point EGA measurement, at least one of; relative scanning angle between reticle stage RST and wafer stage WST, scanning speed ratio between reticle stage RST and wafer stage WST, relative position of at least one of reticle stage RST and wafer stage WST with respect to the projection optical system, image forming characteristics (aberration) of projection optical system PL, and wavelength of illumination light (exposure light) IL, is adjusted during scanning exposure, to deform the projected image of projection optical system PL of the pattern of reticle R to match the shape of shots obtained. Here, adjustment of the image forming characteristics (aberration) of projection optical system PL and adjustment of the center wavelength of illumination light IL are performed by exposure controller 220, via image forming characteristic correction controller 248.

Then, before exposure to the wafer on wafer stage WST (in this case, wafer $W_1$) is completed, a second wafer $W_2$ is mounted on the loading side substrate mounting section of the substrate delivery section by the C/D inner carrying system, and is carried to the predetermined waiting position inside exposure apparatus 200 where it is kept waiting at the waiting position.

Then, when exposure of wafer $W_1$ is completed, wafer $W_1$ and wafer $W_2$ are exchanged on wafer stage WST, and wafer alignment and exposure similar to the description earlier is performed on wafer $W_2$ that has been exchanged. Note that in the case carriage of wafer $W_2$ to the waiting position is not completed by the time exposure to the wafer on the wafer stage (in this case, wafer $W_1$) is completed, the wafer stage is to wait near the waiting position while holding the wafer that has been exposed.

Concurrently with the wafer alignment to wafer $W_2$ that has been exchanged described above, wafer $W_1$ that has been exposed is carried to an unloading side substrate mounting section of the substrate delivery section by wafer carrying system 270.

In the manner described earlier, the wafer that has been exposed mounted on the unloading side substrate mounting section of the substrate delivery section by wafer carrying system 270 is carried into the baking section by the C/D inner carrying system, and PEB is performed by a baking apparatus inside the baking section. Inside the baking section, a plurality of wafers can be housed at the same time.

Meanwhile, the wafer that has completed PEB is taken out from the baking section by the C/D inner carrying system, and is carried into the developing section, and developing is started by a developing apparatus inside the developing section.

Then, when development of the wafer is completed, the wafer is taken out from the developing section by the C/D inner carrying system, and is carried into FOUP 520 used at the time of carry-in, or to a predetermined housing stage inside a wafer carrier different from FOUP 520. Hereinafter, inside C/D 300, to the wafers from the second wafer onward that have been exposed, PEB, development, and wafer carriage are to be repeatedly performed in a procedure similar to wafer $W_1$.

As is described so far, with substrate processing system 1000 according to the embodiment, alignment measurement of the target wafer can be performed by measurement device $100_i$ of measurement system 500 independently from the processing operation of the target wafer by exposure apparatus 200 including the simple EGA measurement and exposure described earlier, which allows an efficient processing that hardly lowers throughput of wafer processing by exposure apparatus 200. Also, as the entire substrate processing system 1000, by concurrently performing alignment and exposure processing by exposure apparatus 200 to a wafer in a certain lot on which measurement processing has been performed in advance with measurement device $100_i$ of measurement system 500 and measurement processing to a wafer in another lot with measurement device $100_i$ of measurement system 500, it becomes possible to perform an efficient processing that hardly lowers throughput of wafer processing. Moreover, with measurement device $100_i$ of measurement system 500, concurrently with wafer alignment and exposure operation to wafers of a certain lot in exposure apparatus 200, full-shot EGA in which all shots serve as sample shots can be performed on wafers of another lot.

Also, with measurement device $100_i$ of measurement system 500, full-shot EGA in which all shots serve as sample shots or full-shot EGA that includes multipoint EGA for at least a part of the shots (hereinafter collectively referred to as alignment measurement according to mode setting) is performed prior to operations of wafer alignment and exposure by exposure apparatus 200 on wafers of the same lot that has undergone processing process (such as; etching, oxidation/diffusion, film deposition, ion implantation, and flattening (CMP)) in a pre-process of wafer processing, and alignment history data including wafer grid information (e.g., data on deformation components of the wafer grid) is acquired for each wafer obtained in the alignment measurement. The alignment history data for each wafer that has been acquired is stored in the internal storage device for each wafer by measurement system controller 530. Accordingly, with exposure apparatus 200, wafer alignment and exposure can be performed on the target wafer, effectively using alignment history data for the target wafer including wafer grid information obtained using measurement system controller 530. That is, in substrate processing system 1000 according to the embodiment, it can be said that alignment history data including wafer grid information (e.g., data on deformation components of the wafer grid) on the target wafer obtained in the pre-measurement processing in measurement device $100_i$ of measurement system 500 is substantially transferred (supplied) in a feed-forward manner to exposure apparatus 200.

Also, since coefficients of high-order components in the model formula obtained in the full-shot EGA in the pre-measurement processing in measurement device $100_i$ can be employed in exposure apparatus 200 without any changes, exposure apparatus 200 only has to obtain coefficients of low-order components of the model formula described above by performing alignment measurement in which several shots serve as alignment shots, and by using this coefficients of low-order components and coefficients of the high-order components acquired in measurement device $100_i$, not only coefficients (undetermined coefficients) of model formula (1) but also coefficients (undetermined coefficients) of high-order component can also be determined, and then by using this model formula (1) whose undetermined coefficients have been determined (that is, formula (3) described above) and design values (X, Y) of the arrangement of the plurality of shots on the wafer, correction amounts from design positions of each shot can be obtained, which allows correction amounts of high accuracy to be acquired similarly to the case when coefficients of low-order components and high-order components of model formula (1) are obtained in exposure apparatus 200. Then, based on the correction amounts and the design values of the arrangement of the plurality of shots on the wafer, the positioning target positions of each shot on exposure can be calculated. Accordingly, by controlling the position of wafer stage WST according to this target position, positioning of each shot can be performed with high accuracy with respect to the exposure position (projection position of the reticle pattern). This allows overlay accuracy of the image of the reticle pattern and the pattern formed in each shot area on the wafer to be improved, without any decrease in the throughput of exposure apparatus 200.

Also, with measurement device $100_i$ according to the embodiment, controller $60_i$ acquires position information of slider 10 with respect to surface plate 12 and relative position information between mark detection system MDS and surface plate 12 using the first position measurement system 30 and the second position measurement system 50 while controlling the movement of slider 10 with drive system 20, and also obtains position information of a plurality of marks formed on wafer W using mark detection system MDS. Accordingly, with to measurement device $100_i$, position information of the plurality of marks formed on wafer W can be obtained with high accuracy.

Also, with measurement device $100_i$ according to the embodiment, controller $60_i$ constantly acquires measurement information (relative position information between surface plate 12 and mark detection system MDS) by the second position measurement system 50, and controls the position of surface plate 12 in directions of six degrees of freedom via (the actuators of) the three vibration isolators 14 real time, so that the positional relation between the detection center of mark detection system MDS and the measurement point of the first position measurement system which detects position information of slider 10 in directions of six degrees of freedom with respect to surface plate 12 is maintained to a desired relation at a nm level. Also, controller $60_i$ acquires measurement information (position information of slider 10 with respect to surface plate 12) from the first position measurement system 30 and measurement information from the second position measurement system 50 (relative position information between surface plate 12 and mark detection system MDS) while controlling the movement of slider 10 by drive system 20, and obtains position information of the plurality of wafer marks, based on detection signals at the time when marks formed on wafer W are detected using mark detection system MDS, measurement information by the first position measurement system 30 obtained at the time when marks formed on wafer W are detected using mark detection system MDS, and measurement information by the second position measurement system 50 obtained at the time when marks formed on wafer W are detected using mark detection system MDS. Therefore, according to measurement device $100_i$, position information of the plurality of marks formed on wafer W can be obtained with high accuracy.

Note that, for example, in the case of performing position control of wafer W (wafer stage WST) on exposure based on the position information of the marks that are measured, without performing EGA operation using the position information of the marks that are measured, for example, measurement information by the second position measurement system 50 described above does not have to be used when calculating the position information of the marks. However, in this case, measurement information by the second position measurement system 50 obtained when detecting the marks formed on wafer W using mark detection system MDS may be offset and used, for example, to correct information used for moving wafer W, such as, positioning target position of wafer W (wafer stage WST). Or, movement of reticle R (reticle stage RST) at the time of exposure may be controlled, taking into consideration the offset described above.

Also, with measurement device $100_i$ according to the embodiment, since the first position measurement system 30 which measures position information in directions of six degrees of freedom of slider 10 on which wafer W is mounted and held detects at least wafer marks on wafer W with mark detection system MDS, the first position measurement system can continue to irradiate the measurement beam on grating RG1 from head section 32 in the range that slider 10 moves. Accordingly, the first position measurement system 30 can measure the position information continuously in the entire range within the XY plane that slider 10 moves for mark detection. Accordingly, for example, in the manufacturing stage (including the start-up stage of the apparatus in a semiconductor manufacturing plant) of measurement device $100_i$, by performing origin setting of the orthogonal coordinate system (reference coordinate system) set by the measurement axes of the first position measurement system 30, it becomes possible to manage an absolute position of slider 10, and as a consequence, an absolute position of the marks (not only search marks and wafer marks, but includes other marks, such as, overlay measurement marks (registration marks) and the like) formed on wafer W held on slider 10 obtained from the position information of slider 10 and the detection results of mark detection system MDS on the reference coordinate system. Note that in the description, "absolute position" refers to coordinate positions on the reference coordinate system.

As is obvious from the description so far, with substrate processing system 1000 according to the embodiment, since the system is equipped with measurement system 500, even in the case exposure apparatus 200 only has the function of performing a simple EGA (e.g., acquiring position information of around 3 to 16 wafer marks using alignment detection system AS) to obtain linear components of the correction amounts of the position coordinates of the wafer within a predetermined amount of time (amount of time allowed to maintain required high throughput), by performing the simple EGA measurement, deformation of the wafer grid can be obtained with high precision using the low-order components of deformation of the wafer grid and the high-order components of deformation of the wafer grid obtained in advance by measurement system 500, obtained, for example, by full-point EGA. Accordingly, by measurement system 500, grid correction function of exposure apparatus 200 can be substantially improved. Accordingly, it becomes possible to perform exposure on a wafer with high precision by the exposure apparatus that does not have the latest grid correction function, with high throughput, or without reducing the throughput.

Note that with substrate processing system 1000 according to the embodiment described above, while the case has been described in which measurement device $100_i$, C/D 300, and exposure apparatus 200 are equipped with a bar code reader, instead of the bar code reader, the system may be equipped with a writing/reading device of a RFID tag which is a wireless IC tag. In such a case, by attaching the RFID tag to each wafer, measurement device $100_i$ writing the alignment history data described earlier into the RFID tag for each wafer using the writing/reading device, and another device such as, for example, exposure apparatus 200 reading the alignment history data from the RFID tag of a target wafer using the writing/reading device, feedforward transfer of the alignment history data for the target wafer described earlier can be easily realized.

Also, with substrate processing system 1000 according to the embodiment described above, the case has been described in which exposure apparatus 200 obtains the coefficients of the low-order components of the first-order or less of the model formula described above, and uses these coefficients of the low-order components and the coefficients of the high-order components of the second-order or more of the model formula described above acquired by measurement device $100_i$. However, this usage is not limited, and for example, coefficients of components of the second-order or less of the model formula described above may be obtained from the detection results of the alignment marks in exposure apparatus 200, and these coefficients of the components of the second-order or less and coefficients of the high-order components of the third-order or more of the model formula described above acquired by measurement device $100_i$ may be used. Or, for example, coefficients of components of the third-order or less of the model formula described above may be obtained from the detection results of the alignment marks in exposure apparatus 200, and these coefficients of the component of the third order or less and coefficients of the high-order components of the fourth-order or more of the model formula described above acquired by measurement device $100_i$ may be used. That is, coefficients of components of the $(N-1)^{th}$ order (N is a whole number of two or more) or less of the model formula described above may be obtained from the detection results of the alignment marks in exposure apparatus 200, and these coefficients of the component of the $(N-1)^{th}$ order or less and coefficients of the high-order components of the $N^{th}$-order or more of the model formula described above acquired by measurement device $100_i$ may be used.

Note that in the embodiment described above, while measurement device $100_i$ is to obtain coordinates $a_3$, $a_4$, $a_5$ ... and $b_3$, $b_4$, $b_5$ ..., of the high-order components of the second-order or more and coordinates $a_0$, $a_1$, $a_2$, $b_0$, $b_1$, $b_2$ of the low-order components of the first-order or less of the model formula (1) expressing a relation between design position coordinates X and Y of each shot in the wafer coordinate system (coincides with the reference coordinate system) and correction amounts (alignment correction components) dx and dy of the position coordinates of the shots, since the coefficients of the low-order components can be obtained in exposure apparatus 200, measurement device $100_i$ does not necessarily have to obtain the coefficients of the low-order components.

Note that in the embodiment described above, in the case measurement device $100_i$ is set to B mode and position information of a plurality of wafer marks is measured for some shots, exposure apparatus 200 obtains by an in-shot multi-point EGA operation, chip rotation (θ), chip rectangular degree error (w), chip scaling (rx) in the x direction, and chip scaling (ry) in the y direction, and obtains the shape of shots from the information. However, the description is not limited to this, and for example, even in the case measurement device $100_i$ is set to A mode and the position information of the wafer marks is measured for one shot each in all shots on the wafer, it is possible for exposure apparatus 200 to estimate deformation of shots (change in the shape of shots). This will be described in the description below.

The wafer grid on wafer W is to be deformed induced by process, and while the individual shots also deform slightly due to the process, the deformation is considered to be in accordance with the deformation of the wafer grid. Variation components of the wafer grid can be divided into the following four variation components that are independent from one another, and each variation component brings about deformation of shots described below.

(1) Variation component of dx in the X-axis direction
Change of magnification in the X-axis direction
(2) Variation component of dx in the Y-axis direction
Rotation around the Y-axis
(3) Variation component of dy in the X-axis direction
Change of magnification in the Y-axis direction
(4) Variation component of dy in the Y-axis direction
Rotation around the X-axis Therefore, in the embodiment, the variation components (1) to (4) described above are to be calculated, and deformation of the shots on wafer W is to be estimated based on the variation components.

Now, as for the method of estimating variation of shots, there are roughly the following two methods.

(A) Deforming shots according to a value obtained from partial differentiations relative to X and Y of formula (3), after coefficients (undetermined coefficients) have been determined for the formula.

(B) Approximating the wafer grid to a primary model formula, and deforming shots according to coefficients of the model formula. Here, the wafer grid can be calculated, by substituting each of the design position coordinates X and Y of each shot into formula (3) after coefficients (undetermined coefficients) have been determined for the formula to obtain correction amounts (shot position coordinate correction amounts dx and dy) from design values of the arrangement of the plurality of shot areas on the wafer, or, to obtain deformation components of the wafer grid, and then using the correction amounts and the design values of the position coordinates of the shots for calculation.

In the following description, a method of correcting shapes of shots by the estimating method in (A) will be referred to as a higher-order partial derivative correction, and a method of correcting shapes of shots by the estimating method in (B) will be referred to as a first-order approximate correction. Even if the wafer grid is the same, deformation state of the shots turns out differently when using the method in (A) and using the method in (B).

Figure 13A:
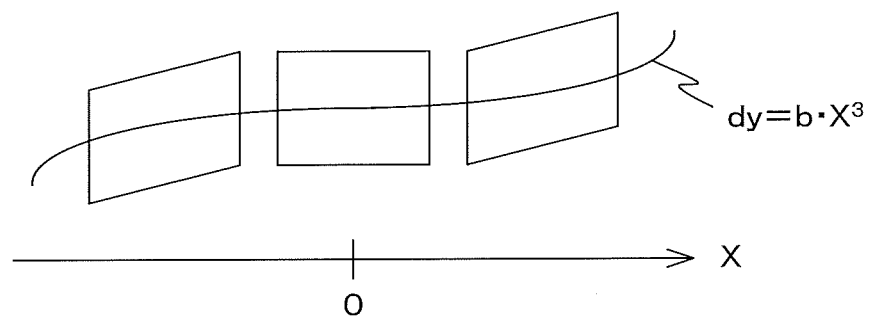
FIG. 13A is a view used to explain an example of higher-order partial derivative correction.
Figure 13B:
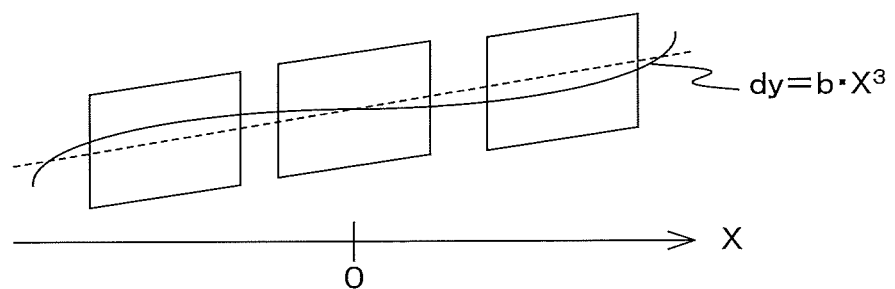
FIG. 13B is a view used to explain an example of a first-order approximate correction.

FIGS. 13A and 13B schematically show an example of a difference between the higher-order partial derivative correction and the first-order approximate correction. Here, to simplify the description, Y component in the wafer grid is to be $dy=b_6 \cdot X^3$. FIG. 13A shows three shots that are corrected by the higher-order partial derivative correction. In the case of performing the higher-order partial derivative correction, rotation with respect to the Y-axis of each shot turns out to follow $dy'=3b_6 \cdot X^2$, which is a partial derivative of $dy=b_6 \cdot X^3$.

In this case, of the three shots, deformation amount of the shot in the center becomes zero. Meanwhile, FIG. 13B shows three shots that are corrected by the first-order approximate correction. In the first-order approximate correction, alignment of the EGA method is performed again using a first-order model formula, and shapes of shots are corrected using coefficients of the first-order related to rotation with respect to the Y-axis in the model formula. In the case of performing this first-order approximate correction, as is shown in FIG. 13B, of the three shots, the shot in the center is also primarily deformed, and as a whole, deformation of each shot becomes uniform.

As is shown in FIGS. 13A and 13B, while deformation of shots turn out to be local along the wafer grid in the periphery of the shots in the higher-order partial derivative correction, in the first-order approximate correction, deformation becomes uniform for all shots on wafer W. For example, the method to be chosen can be specified by an exposure recipe, and a user may be able to appropriately select the method according to the specifications required in the semiconductors to be manufactured. Also in the case of performing such estimation of deformation of shots, similar to the description earlier, exposure controller 220 adjusts at least one of; relative scanning angle between reticle stage RST and wafer stage WST, scanning speed ratio between reticle stage RST and wafer stage WST, relative position of at least one of reticle stage RST and wafer stage WST with respect to the projection optical system, image forming characteristics (aberration) of projection optical system PL, and wavelength of illumination light (exposure light) IL, during scanning exposure, so that the projected image of projection optical system PL of the pattern of reticle R is deformed to match the shape of shots obtained.

Note that in substrate processing system 1000 according to the embodiment, in the case measurement unit 40 of measurement device $100_i$ is equipped with the multi-point focal point detection system describe earlier, measurement device $100_i$ may perform a flatness measurement (also called focus mapping) along with the wafer alignment measurement. In this case, by using results of the flatness measurement, focus leveling control of wafer W at the time of exposure becomes possible without exposure apparatus 200 having to perform the flatness measurement.

Also, at least one of measurement devices $100_1$, $100_2$, and $100_3$ may be a measurement device having functions different from other measurement devices. For example, one measurement device may be a measurement device equipped with a multi-point focal point detection system for performing unevenness (flatness) measurement of the wafer surface, or may be a wafer shape measurement apparatus. Or, measurement system 500 may be equipped with two, or four or more measurement devices.

Note that in the embodiment above, while the subject is to be a 300 mm wafer, the subject is not limited to this, and the wafer may have a 450 mm wafer that has a diameter of 450 mm. Separately from exposure apparatus 200, since measurement device $100_i$ can perform wafer alignment, for example, full-point EGA measurement becomes possible without lowering the throughput of exposure processing, even if the wafer is a 450 wafer.

Note that in the embodiment above, to simplify the description, while either A mode or B mode was set as the measurement mode of measurement device $100_i$, B mode does not have to be set. Also, a C mode in which a first number of wafer marks being two or more is are detected for all shots on all wafer within the lot, and a mode (referred to as a D mode) in which for all wafers in the lot, two or more second number of wafer marks are detected for a part of shots, such as for example, shots which are specified in advance that are located in the peripheral section of the wafers, and for the remaining shots, one wafer mark each is detected, may be provided. Furthermore, according to the detection results of the wafer marks for the first predetermined number of wafers in the lot, an E mode may be provided where either the A mode, the C mode, or the D mode is to be selected for the remaining wafers in the lot.

Also, as the measurement mode of measurement device $100_i$, for all wafers in the lot, one or more wafer marks may be measured for a part of the shots, such as for example, 90% or 80% of the shots, or, for shots positioned in the center section of the wafer, one or more wafer marks may be measured for shots that have a spacing in between.

Note that in measurement device $100_i$ according to the embodiment described above, while the case has been described where the X-axis direction and the Y-axis direction serve as periodic directions in each of gratings RG1, RG2a, and RG2b, the description is not limited to this, and in the grating section (two-dimensional grating) that the first position measurement system 30 and the second position measurement system 50 are each equipped with, the periodic direction only has to be two directions that intersect each other in the XY plane.

Also, the structure of measurement device $100_i$ described in the embodiment above is a mere example. For example, the measurement device only has to be structured so that the device has a stage (slider 10) movable with respect to base member (surface plate 12), and position information of the plurality of marks on the substrate (wafer) held on the stage can be measured. Accordingly, the measurement device does not necessarily have to be equipped with, for example, the first position measurement system 30 and the second position measurement system 50.

Also, it is a matter of course that the structure of head section 32 of the first position measurement system 30 described in the embodiment above and the arrangement of the detection points are mere examples. For example, the position of the detection points of mark detection system MDS and the detection center of head section 32 does not have to match in at least one of the X-axis direction and the Y-axis direction. Or, the arrangement of the head section of the first position measurement system 30 and grating RG1 (grating section) may be opposite. That is, the head section may be provided at slider 10, and the grating section may be provided at surface plate 12. Also, the first position measurement system 30 does not necessarily have to be equipped with encoder system 33 and laser interferometer system 35, and the first position measurement system 35 may be structured only by the encoder system. The first position measurement system may be structured by an encoder system which measures position information of slider 10 in directions of six degrees of freedom with respect to surface plate 12 by irradiating a beam on grating RG1 of slider 10 from the head section and receiving the return beam (diffraction beam) from the grating. In this case, the structure of the head section does not matter in particular. For example, a pair of XZ heads that irradiates two points arranged the same distance apart in the X-axis direction with respect to a predetermined point on grating RG1 with a detection beam and a pair of YZ heads that irradiates two points arranged the same distance apart in the Y-axis direction with respect to a predetermined point with a detection beam may be provided, or a pair of three-dimensional heads that irradiates each of the two points arranged apart in the X-axis direction of grating RG1 with a detection beam, and an XZ head or a YZ head that irradiates a point whose position in the Y-axis direction is different from the two points described above with a detection beam may be provided. The first position measurement system 30 does not necessarily have to be capable of measuring position information of slider 10 in directions of six degrees of freedom with respect to surface plate 12, and for example, and may only be capable of measuring position information in the X, the Y, and the θz directions. Also, the first position measurement system which measures the position information of slider 10 with respect to surface plate 12 may be arranged in between surface plate 12 and slider 10. Also, the first measurement system used for measuring the absolute position described earlier of slider 10 does not necessarily have to be equipped with the encoder system that irradiates grating RG1 of slider 10 with a beam from the head section described earlier, and may be structured by other measurement devices such as an interferometer system that measures position information of slider 10 in directions of six degrees of freedom with respect to surface plate 12, or in directions of three degrees of freedom within a horizontal plane.

Similarly, the structure of the second position measurement system 50 described in the embodiment above is a mere example. For example, head sections 52A and 52B may be fixed to the surface plate 12 side and scales 54A and 54B may be provided integrally with mark detection system MDS. Also, while the example was described of the case in which the second position measurement system 50 is equipped with the pair of head sections 52A and 52B, the description is not limited to this, and the second position measurement system 50 may be equipped with only one head section, or may be equipped with three or more head sections. In any case, it is desirable for the second position measurement system 50 to be able to measure the positional relation between surface plate 12 and mark detection system MDS in directions of six degrees of freedom. However, the second position measurement system 50 does not necessarily have to be capable of measuring the positional relation in all of the directions of six degrees of freedom.

Note that in the embodiment above, the case has been described in which slider 10 is supported by levitation on surface plate 12 by the plurality of air bearings 18, and drive system 20 that drives slider 10 with respect to surface plate 12 in a non-contact manner is structured, including the first driver 20A that drives slider 10 in the X-axis direction and the second driver 20B that drives slider 10 integrally with the first driver 20A in the Y-axis direction. However, the description is not limited to this, and drive system 20 may employ a drive system having a structure in which slider 10 is moved in directions of six degrees of freedom on surface plate 12. Such a drive system may be structured as an example, using a magnetic levitation type planar motor. In such a case, air bearing 18 will not be necessary. Note that measurement device $100_i$ may be equipped with a drive system separate from vibration isolators 14 for moving surface plate 12.

Also, in the embodiment described above, while measurement system 500 is equipped with the EFEM system as carrier system 510, instead of the EFEM system, a carrier storage device may be installed that can store a plurality of (e.g., three) carriers (such as FOUP) along the Y-axis direction. In this case, measurement system 500 may be equipped with a plurality of loading ports provided adjacent to each of a plurality of measurement devices $100_i$, and a carrier carrying device which performs delivery of a carrier (such as FOUP) between the carrier storage device and a mounting section of the plurality of loading ports.

Second Embodiment

Next, a second embodiment will be described. In the embodiment, variation management of a wafer grid using measurement system 500 of substrate processing system 1000 and overlay measurement will be described.

As is described above, since measurement device $100_i$ is equipped with the first position measurement system 30, by performing origin setting of the orthogonal coordinate system (reference coordinate system) set by the measurement axes of the first position measurement system 30, it becomes possible to manage an absolute position of slider 10, and as a consequence, an absolute position of the wafer marks, such as overlay measurement marks (registration marks) formed on wafer W held on slider 10 obtained from the position information of slider 10 and the detection results of mark detection system MDS on the reference coordinate system. That is, measurement device $100_i$ can also be made to function as overlay measuring instrument 400.

Variation Management of Wafer Grid

Figure 14:
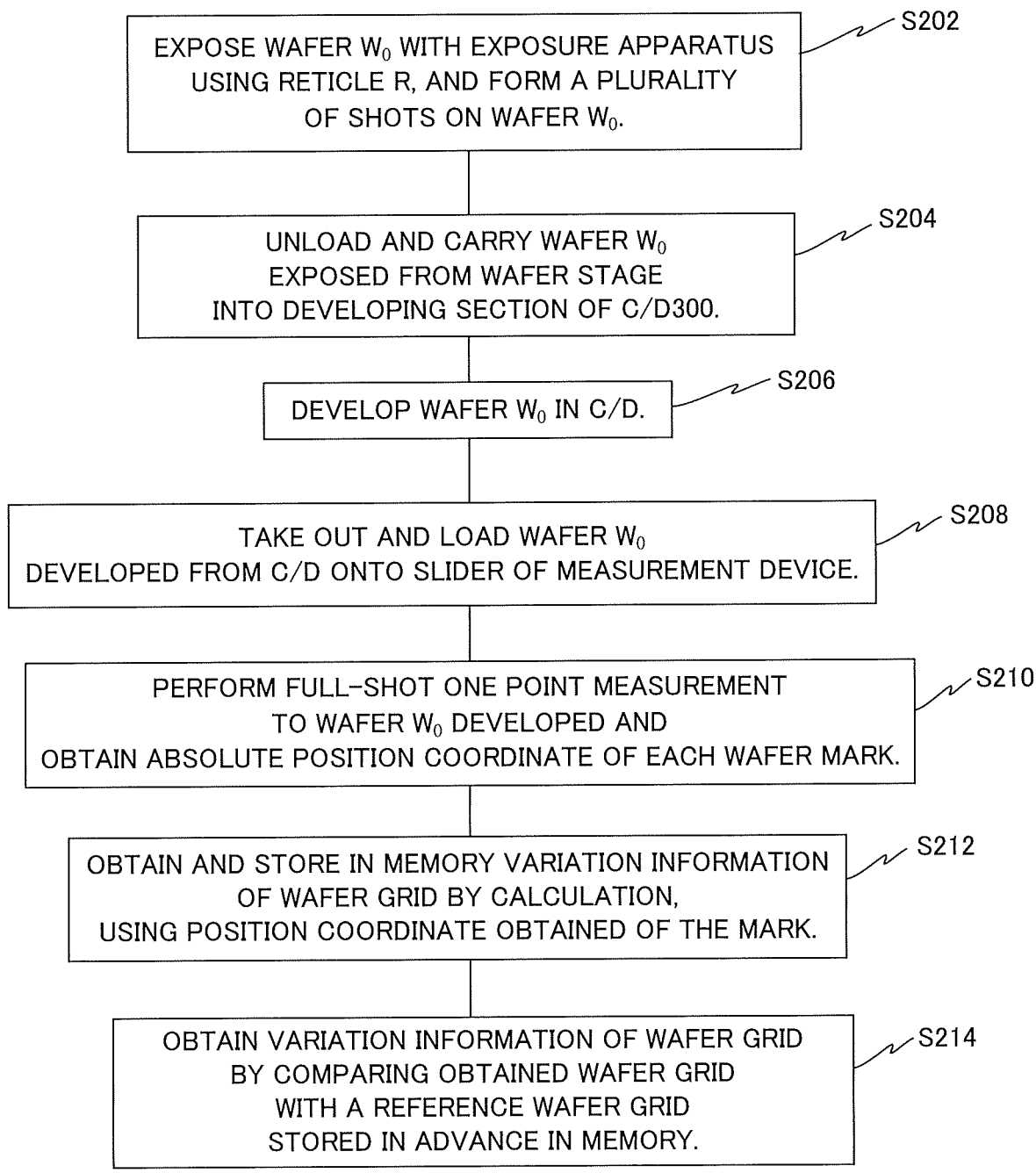
FIG. 14 is a view schematically showing a processing flow in a case a management method of a wafer grid induced by an exposure apparatus using a measurement device according to a second embodiment is applied to the substrate processing system in FIG. 1.

Next, a management method of a wafer grid induced by an exposure apparatus using a measurement device will be described, with the case of applying the method to substrate processing system 1000 as an example. FIG. 14 schematically shows a processing flow of a management method of a wafer grid in this case.

First of all, in step S202, exposure apparatus 200 performs exposure by a step-and-scan method using a product reticle R on a bare wafer (described as wafer $W_0$ for convenience) included in a lot. Here, in reticle R, along with a rectangular pattern area formed on its pattern surface, marks (become wafer marks transferred onto the wafer) and the like are to be formed in the periphery of, or inside the pattern area (in the case of arranging a plurality of chips in one shot). Here, wafer $W_0$ is a wafer which has not been exposed yet, and a resist is coated on its surface by C/D 300. Accordingly, alignment is not performed on exposure of wafer $W_0$, and reticle stage RST and wafer stage WST are moved and controlled by exposure controller 220 based on design values. By the exposure in this step S202, I (e.g., 98) rectangular pattern areas arranged in the shape of a matrix and a transferred image (latent image) of a mark corresponding to each shot whose positional relation between each shot is known on design are formed on the resist layer of the wafer $W_0$ surface.

Next, in step S204, wafer $W_0$ that has been exposed is unloaded from wafer stage WST, and is carried into the developing section of C/D 300. Specifically, wafer $W_0$ is carried by wafer carrying system 270 and is mounted on the unloading side substrate mounting section of the substrate delivery section provided in between C/D 300 and exposure apparatus 200. Then, wafer $W_0$ is carried into the developing section of C/D 300 by the C/D inner carrying system.

Next, in step S206, wafer $W_0$ is developed by the developing apparatus of the developing section of C/D 300. After this developing, on wafer $W_0$, I (e.g., 98) rectangular shots arranged in the shape of a matrix and a resist image (hereinafter appropriately shortened and described as a wafer mark) of a wafer mark corresponding to each shot whose positional relation between and each shot is known on design are formed.

Next, in step S208, a FOUP in which a plurality of wafers of a certain lot including wafer $W_0$ that has been developed is housed, is taken out from C/D 300, and is mounted on loading port 514 of measurement system 500, using OHT described above and the like. That is, wafer $W_0$ inside the FOUP taken out from C/D 300 is carried to measurement system 500 before the process processing (etching processing, or film deposition processing after the etching processing (including at least one of sputtering processing, CVD processing, and thermal oxidation processing)) to be performed after development processing is applied. Wafer $W_0$ housed in the FOUP is taken out from the FOUP using robot 516 and the like, and then is loaded onto slider 10 of measurement device 100$_i$, using carrying system 512 and the like.

Note that in the description below, while one wafer of the plurality of wafers housed in the FOUP is to be described as wafer $W_0$, a similar processing may be performed on all or a part of the plurality of wafers housed in the FOUP.

Next, in step S210, measurement device 100$_i$ performs full-shot one point measurement described earlier on wafer $W_0$ that has been developed, and the absolute position coordinates are obtained for each wafer mark. That is, controller 60$_i$ detects I wafer marks corresponding to each of the I (e.g., 98) shots using mark detection system MDS, while measuring the position information of slider 10 using the first position measurement system 30 (and the second position measurement system 50), and obtains the absolute position coordinates (X, Y) of the I wafer marks corresponding to each of the I shots on wafer $W_0$, based on detection results of each of the I wafer marks and the absolute position coordinates (X, Y) of slider 10 at the time of detection for each of the I wafer marks. On this operation, controller 60$_i$, based on measurement values in the θx direction and the θy direction of slider 10 measured by the first position measurement system 30, obtains the absolute position coordinates (X, Y) of the I wafer marks, with Abbe errors in the X-axis direction and the Y-axis direction of the first position measurement system 30 and the measurement values in the X-axis direction and the Y-axis direction of the second position measurement system 50 serving as offsets. Note that in step 210, although full-shot one point measurement is desirable, detection of wafer marks of a part of the shots does not have to be performed.

Next, in step S212, by controller 60$_i$, variation information of the arrangement (wafer grid) of I shots on wafer $W_0$ is obtained, using the absolute position coordinates of I marks that have been obtained. For example, controller 60$_i$ obtains the actual measurement values of the absolute position coordinates (X, Y) are obtained for each of the I shots from the absolute position coordinates of the I wafer marks, based on the known positional relation between the wafer marks and the shot center, and based on data of a difference between the actual measurement values of the absolute position coordinates (X, Y) for each of the I shots and design values of position coordinates (X, Y) for each shot, coefficients $a_0, a_1, \ldots, b_0, b_1, \ldots$ of formula (1) described earlier are obtained using statistical calculation such as the least squares method. Here, the coefficients $a_0, a_1, \ldots, b_0, b_1, \ldots$ obtained are substituted into formula (1), and formula (1) whose coefficients have been fixed is stored as variation information on the wafer grid in an internal memory (e.g., storage device of controller 60$_i$, or a storage device inside measurement system controller 530) of measurement system 500, or in an external storage device.

Or, based on the known positional relation between the wafer marks and the shot center, controller 60$_i$ may obtain the actual measurement values of the absolute position coordinates (X, Y) for each of the I shots from the absolute position coordinates of the I wafer marks, make a map consisting of data of a difference between the actual measurement values of the absolute position coordinates (X, Y) for each of the I shots and design values of position coordinates (X, Y) for each shot, and may use this map as variation information on the wafer grid.

Also, the actual measurement values of the absolute position coordinates (X, Y) for each of the I shots may be used as variation information on the wafer grid.

This makes it possible to obtain the variation amount of the wafer grid from the design values anytime, and to manage the variation amount.

The next step S214 is executed as necessary. In step S214, controller 60$_i$ compares the variation information from the design values of the wafer grid obtained in step S210 with the variation information on the wafer grid serving as a reference stored in advance in memory (or the storage device of measurement system controller 530), and obtains the difference therein. For example, variation amount of the wafer grid from the variation of the wafer grid serving as a reference is obtained. By this processing in step S214, it becomes possible to manage shot arrangement errors occurring due to errors of stage grid and the like between different exposure apparatuses, or shot arrangement errors occurring due to errors of stage grid and the like in the same exposure apparatus between different time points.

In the former case, prior to the processing in step S214, exposure is performed similarly to step S202 described earlier on a bare wafer which is in a lot separate from wafer $W_0$ using reticle R in a scanning stepper different from exposure apparatus 200, and by processing similar to steps S204 to S212 being performed on the wafer that has been exposed, variation information on the wafer grid serving as a reference is obtained and stored in memory (or in the storage device of measurement system controller 530).

In the latter case, prior to the processing in step S214, exposure is performed similarly to step S202 described earlier on a wafer other than wafer $W_0$ that is in the same lot as wafer $W_0$ or in a lot different from wafer $W_0$ using reticle R in exposure apparatus 200, and by processing similar to steps S203 to S212 being performed on the wafer, variation information on the wafer grid serving as a reference is obtained and stored in memory (or in the storage device of measurement system controller 530).

Note that measurement device 100$_i$ used to acquire variation information on the wafer grid of wafer $W_0$ may be the same, or may be different from measurement device 100$_i$ used to acquire variation information on the wafer grid serving as a reference.

As it is obvious from the description above, in the management method according to the embodiment, variation of the wafer grid induced by the apparatus can be managed, without using the reference wafer. Therefore, inconveniences as is described below that occur in the case of using the reference wafer can be avoided.

That is, in an operation using the reference wafer, since the reference wafer is to be used by a plurality of exposure apparatuses, this makes it difficult for the exposure apparatuses to be in possession of the reference wafer. Since not only one but a plurality of numbers of reference wafers are normally made, individual difference among the reference wafers needs to be secured. Also, the reference wafers may be damaged, or may deteriorate with use. Furthermore, in the management method of the wafer grid using the reference wafer, resist is coated on the reference wafer surface and exposure is performed, and after the necessary processing is completed, then the resist is removed and the reference wafer is cleaned. By repeating this process, the surface may be damaged. Also, the rear surface of the reference wafer may have traces of marks made by a chuck member (such as a pin chuck) that the wafer holder has, which may cause suction distortion in the reference wafer, which in turn may cause the wafer grid to distort.

Meanwhile, there are advantages like the ones below when the reference wafer is not used.

a. Measurement (correction) becomes feasible when variation of the wafer grid should be measured (should be corrected), without having to be concerned about the availability or the serial number of the reference wafer.

b. Since a bare wafer can be used instead of a reference wafer, quality control can be easily executed.

c. Wafer grid management becomes possible with product shot map and product reticle. That is, it becomes possible to manage the wafer grid using overlay measurement marks or alignment marks that are marked on the product reticle. As a consequence, the reticle used only for quality control will not be required. Also, quality control becomes possible with the product shot map itself, and moreover, since the variation amount of the wafer grid that occurs not only by location dependent errors, but also all error factors that occur due to scanning speed, acceleration, or other product exposure operations can be measured, by performing correction based on this measurement, it becomes possible to completely eliminate compromise that accompanies grid control using the reference wafer which will be described next.

a. Error of grid is coordinate dependent, having the same error when the place is the same. When position of a mark is measured, and the position is near a point where correction of the grid error has been performed, the error can be considered small.

b. Error of scanning speed, scanning acceleration or the like does not cause grid error. Supposing that grid error does occur, since the error is not an error that changes each time scanning is performed, only a one-time adjustment is enough and periodic maintenance is unnecessary.

Note that information on the wafer grid of wafer $W_0$ obtained in step 212 may be supplied (fed back) to exposure apparatus 200, and when exposure processing is performed after the lot including wafer $W_0$ by exposure apparatus 200 using reticle R on a bare wafer included in a lot different from the lot including wafer $W_0$, movement of stage WST of exposure apparatus 200 may be controlled so that variation (displacement from design values) of a wafer grid on the first layer becomes small. That is, positioning target position when exposure of each shot is performed with respect to the bare wafer included in another lot may be determined, using the information on the wafer grid of wafer $W_0$ obtained in step 212.

Also, in step 210, in the case the absolute position coordinates of two or more wafer marks are acquired for all shots on wafer $W_0$, and information related to shape and size of each shot can be acquired, the information may be supplied (fed back) to exposure apparatus 200, and image forming characteristic correction controller 248 may be controlled, or at least one of speed and direction of reticle stage RST may be controlled, so that the shape and size of each shot vary to a desired state.

Also, to perform exposure processing of a second layer (an upper layer whose lower layer is the first layer), variation information on the wafer grid of wafer $W_0$ may be acquired just before wafer $W_0$ having gone through various processes (including etching processing and film deposition processing) is carried into C/D 300 (or another C/D 300). In this case, as is described in the first embodiment, alignment history data of wafer $W_0$ including the variation information on the wafer grid that has been acquired may be supplied (fed forward) to exposure apparatus 200 which performs exposure processing on the second layer, or to another exposure apparatus, or the variation information on the wafer grid of wafer $W_0$ may be supplied (fed back) to exposure apparatus 200 and may be used when exposure processing is performed after the lot including wafer $W_0$ by exposure apparatus 200, using reticle R on a bare wafer included in a lot different from the lot including wafer $W_0$.

Overlay Measurement

Figure 15:
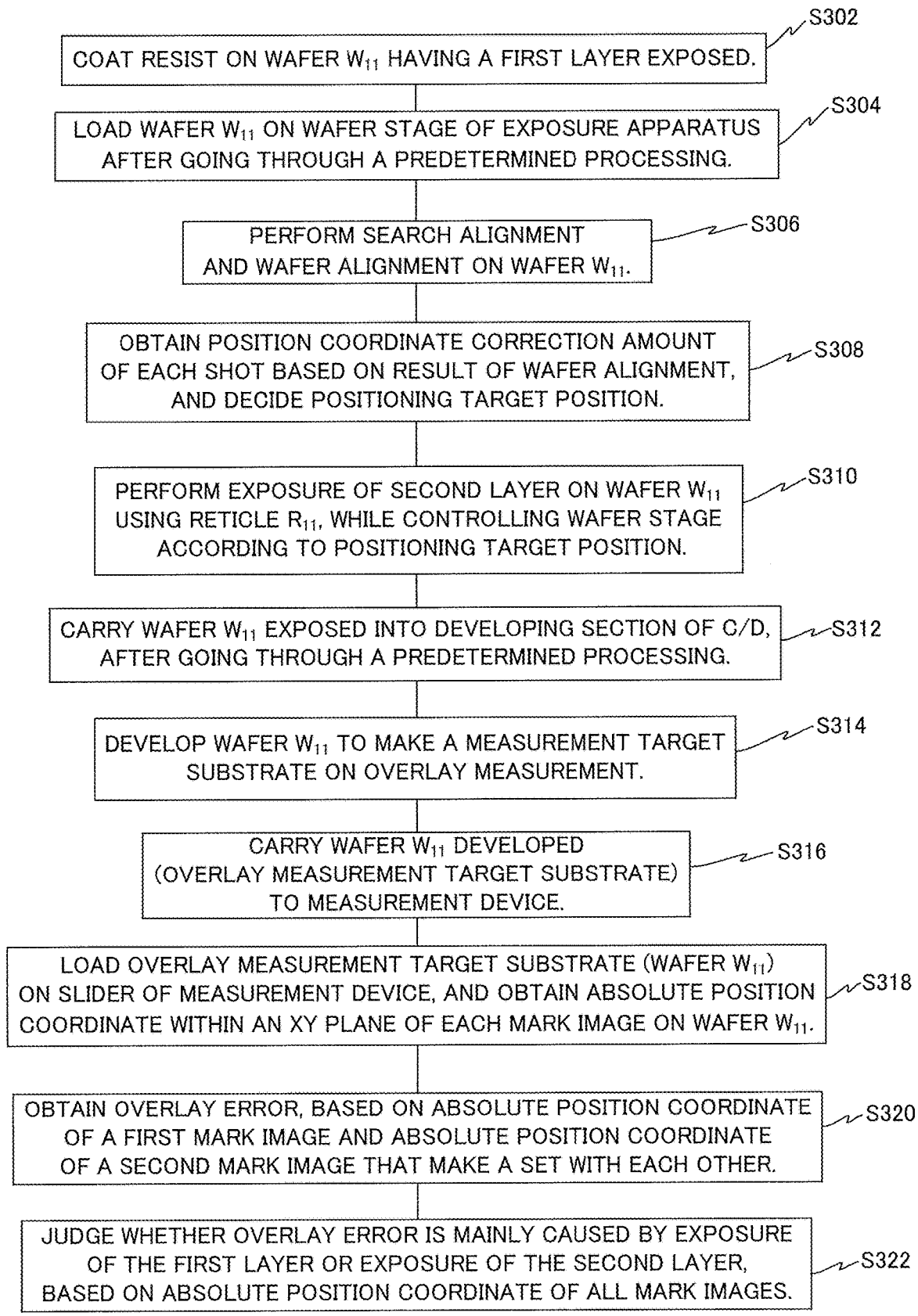
FIG. 15 is a view schematically showing a processing flow in a case an overlay measurement method using the measurement device according to the second embodiment is applied to the substrate processing system in FIG. 1.
Figure 16:
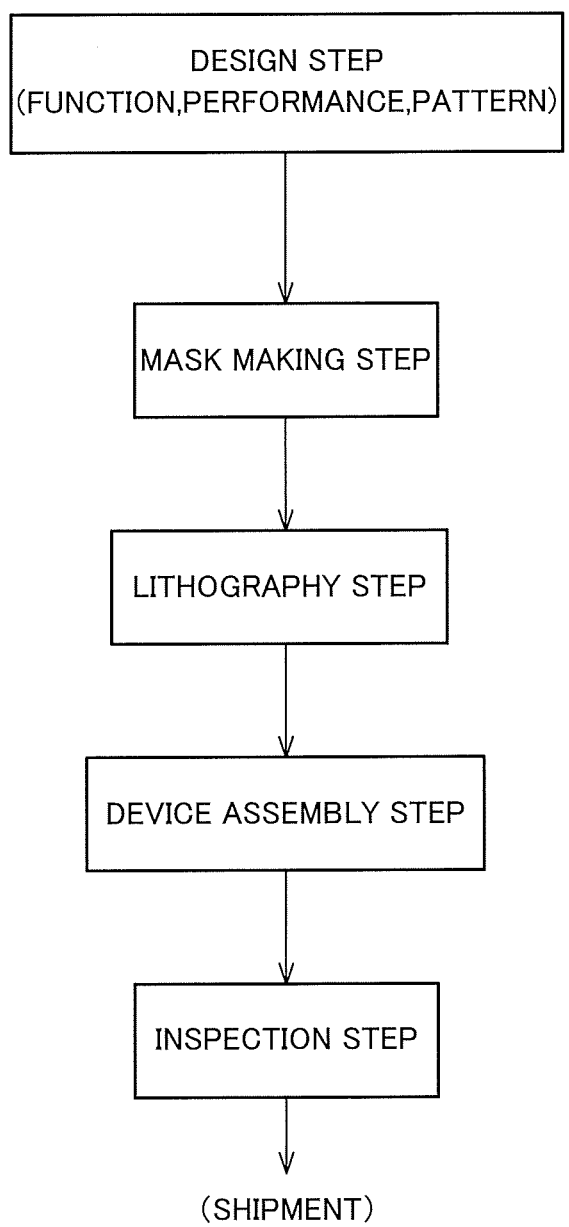
FIG. 16 is a view showing an example of a manufacturing process of a semiconductor device.

Next, a case will be described in which an overlay measurement method using a measurement device is applied to substrate processing system 1000 as an example. FIG. 15 schematically shows a flow of processing in the overlay measurement method in this case.

First of all, in step S302, a wafer (described as wafer $W_{11}$) included in a certain lot is carried into C/D 300, and in the coating section of C/D 300, by exposure apparatus 200 or an exposure apparatus different from exposure apparatus 200, e.g., a scanner or a stepper, resist coating is performed on wafer $W_{11}$ which has undergone exposure of the first layer (lower layer). On wafer $W_{11}$ before resist coating, by exposure of the lower layer, along with a plurality of, for example, I shots (I is, e.g., 98), a wafer mark whose designed positional relation with the shot is known and a first mark (to be precise, a resist image of the first mark (also appropriately referred to as a first mark image)) for overlay displacement measurement are formed, corresponding to each of the shots. In this case, designed positional relation is also known for each of the I first mark images.

Next, in step S304, wafer $W_{11}$ that has been coated with the resist is loaded onto wafer stage WST of exposure apparatus 200, after going through a predetermined processing process similar to wafer $W_1$ described earlier. Specifically, wafer $W_{11}$ is loaded onto wafer stage WST, after having undergone heating processing (PB) in the baking section, temperature control in temperature controlling section 330 and the like.

Next, in step S306, by exposure controller 220 of exposure apparatus 200, to wafer $W_{11}$ on wafer stage WST, search alignment similar to the one described earlier using alignment detection system AS and wafer alignment by the EGA method in which alignment shots are, e.g., around 3 to 16 shots are performed.

Note that prior to step S302, as is described in the first embodiment, information on the wafer grid of wafer $W_{11}$ is obtained by measurement device $100_i$ of measurement system 500, which is supplied to exposure controller 220 of exposure apparatus 200.

Next, in step S308, exposure controller 220 obtains correction amounts (alignment correction components) dx and dy of position coordinates of each shot expressed in formula (3) described earlier based on results of the wafer alignment, and decides positioning target position on exposure of each shot for correcting the wafer grid, based on the correction amounts.

Note that prior to step 302, positioning target position on exposure of each shot may be decided only by the results of wafer alignment by the EGA method using alignment detection system AS in which alignment shots are, e.g., around 3 to 16 shots, without obtaining information on the wafer grid of wafer $W_{11}$ by measurement device $100_i$ of measurement system 500.

Next, in step S310, exposure apparatus 200 performs exposure of a second layer (an upper layer whose lower layer is the first layer) by a step-and-scan method to each shot on wafer $W_{11}$, while controlling wafer stage WST according to the positioning target position. On this operation, exposure apparatus 200 performs exposure using a reticle (to be reticle $R_{11}$ for convenience) on which a second mark corresponding to the first mark image on wafer $W_{11}$ is formed. Accordingly, by this exposure of the second layer, the pattern area of reticle $R_{11}$ is overlaid and transferred with respect to I shots on wafer $W_{11}$, along with transferred images of I second marks being formed arranged in a positional relation corresponding to the positional relation of the I first marks.

Next, in step S312, wafer $W_{11}$ that has completed exposure of the second layer is carried into the developing section of C/D 300, after going through a processing process similar to wafer $W_1$ described earlier that has already been exposed. Specifically, wafer $W_{11}$ is carried to the unloading side substrate mounting section of the substrate delivery section by wafer carrying system 270, and is carried into the baking section of C/D 300 from the unloading side substrate mounting section by the C/D inner carrying system, and then PEB is performed by a baking apparatus inside the baking section. Wafer $W_{11}$ that has completed PEB is taken out from the baking section by the C/D inner carrying system, and then is carried into the developing section.

Next, in step S314, by the developing apparatus within the developing section, wafer $W_{11}$ on which a transferred image of a plurality of second marks is formed is developed. By this development, along with I shots, I sets of the first mark image and the corresponding second mark image are formed in predetermined positional relation on wafer $W_{11}$, which serve as a measurement target on overlay measurement. That is, the substrate serving as a measurement target on overlay measurement (overlay measurement target substrate) is made in this manner. Here, as a set of the first mark image and the corresponding second mark image, for example, a resist image of a box-in-box mark consisting of an external box mark and an in-box mark arranged on the inner side of the external box can be used.

Next, in step S316, a FOUP in which a plurality of wafers of a certain lot including wafer $W_{11}$ (overlay measurement target substrate) that has been developed is housed, is taken out from C/D 300, and is mounted on loading port 514 of measurement system 500, using OHT described above and the like. That is, wafer $W_{11}$ inside the FOUP taken out from C/D 300 is carried to measurement system 500 before the process processing (etching processing, or film deposition processing after the etching processing (including at least one of sputtering processing, CVD processing, and thermal oxidation processing)) performed after development processing is applied. Wafer $W_{11}$ housed in the FOUP is taken out from the FOUP using robot 516 and the like, and then is carried to measurement device $100_i$, using carrying system 512 and the like.

Note that in the description below, while one wafer of the plurality of wafers housed in the FOUP is described as wafer $W_{11}$, a similar processing may be performed on all or a part of the plurality of wafers housed in the FOUP.

Next, in step S318, wafer $W_{11}$ (overlay measurement target substrate) that has been developed carried by measurement device $100_i$ is loaded on slider 10 in the procedure described earlier, and the absolute position coordinates within the XY plane of the I sets of the first mark image and the second mark image are each obtained in the following manner. That is, controller $60_i$ detects each of the I first mark images and the I second mark images on wafer $W_{11}$ using mark detection system MDS, while measuring the position information of slider 10 using the first position measurement system 30 (and the second position measurement system 50), and obtains the absolute position coordinates within the XY plane of each of the I sets of the first mark image and I sets of the second mark image on wafer $W_{11}$, based on detection results of each of the I first mark images and the I second mark images and the absolute position coordinates (X, Y) of slider 10 at the time of detection for each mark image. On this operation, controller $60_i$, based on measurement values in the θx direction and the θy direction of slider 10 measured by the first position measurement system 30, obtains the absolute position coordinates within the XY plane of each of the I first mark images and the I second mark images, with Abbe errors in the X-axis direction and the Y-axis direction of the first position measurement system 30 and the measurement values in the X-axis direction and the Y-axis direction of the second position measurement system 50 serving as offsets.

Note that in step S318, the absolute position coordinates of K first mark images, which is less than I, and the absolute position coordinates of K second mark images may be obtained.

Next, in step S320, by controller $60_i$, overlay error (overlay displacement) between the first layer and the second layer is obtained, based on the absolute position coordinates of the first mark image and the absolute position coordinates of the second mark image that make a set with each other.

Next, in step S322, by controller $60_i$, a judgment is made, for example, in the following manner on whether exposure of the first layer or exposure of the second layer is the main cause of the overlay error, based on the absolute position coordinates of I first mark images and the absolute position coordinates of I second mark images. That is, controller $60_i$ obtains displacement amount $(\Delta X1_i, \Delta Y1_i)$ (i=1 to I) from design position coordinates of the first mark image and displacement amount $(\Delta X2_i, \Delta Y2_i)$ (i=1 to I) from design position coordinates of the second mark image, and for each of $\Delta X1_i$, $\Delta Y1_i$, $\Delta X2_i$, and $\Delta Y2_i$, obtains the sum total of i=1 to I, $\Sigma X1_i$, $\Sigma X2_i$, $\Sigma Y1_i$, and $\Sigma Y2_i$. Then, in the case of $\Sigma X1_i > \Sigma X2_i$ and $\Sigma Y1_i > \Sigma Y2_i$, controller $60_i$ decides that the overlay error is mainly caused by exposure of the first layer for both the X-axis direction and the Y-axis direction, and in the case of $\Sigma X1_i < \Sigma X2_i$ and $\Sigma Y1_i < \Sigma Y2_i$, controller $60i$ decides that the overlay error is mainly caused by exposure of the second layer for both the X-axis direction and the Y-axis direction. Also, in the case of $\Sigma X1_i > \Sigma X2_i$ and $\Sigma Y1_i < \Sigma Y2_i$, controller $60_i$ decides that the overlay error is mainly caused by exposure of the first layer in the X-axis direction and exposure of the second layer in the Y-axis direction, and in the case of $\Sigma X1_i < \Sigma X2_i$ and $\Sigma Y1_i > \Sigma Y2_i$, controller $60_i$ decides that the overlay error is mainly caused by exposure of the second layer in the X-axis direction and exposure of the first layer in the Y-axis direction.

Note that the deciding method described above is an example, and as long as controller $60_i$ makes the judgment of whether the main cause of the overlay error is in exposure of the first layer or exposure of the second layer based on the absolute position coordinates of the I first mark images and the absolute position coordinates of the I second mark images, the specific deciding method does not matter.

Data on the overlay error (overlay displacement) of wafer $W_{11}$ obtained by the overlay measurement method described above and data on judgment results of whether the main cause of the overlay error is in exposure of the first layer or exposure of the second layer are to be fed back to controller $60_i$, or to one of the exposure apparatus that performed the exposure of the first layer by measurement system controller 530 and exposure apparatus 200 that performed the exposure of the second layer.

For example, in the case the main factor of the overlay error is in exposure of the first layer, the data can be fed back to the exposure apparatus that has performed exposure on the first layer. Then, in the case the exposure apparatus performs an exposure processing similar to that of the first layer of wafer $W_{11}$ on a wafer included in a lot other than the lot including wafer $W_{11}$, a positioning target position may be decided so that the overlay error with the second layer is reduced, based on the data fed back.

Also, in the case the main factor of overlay error is in exposure of the second layer, the data can be fed back to exposure apparatus 200 that has performed exposure on the second layer. Then, in the case exposure apparatus 200 performs an exposure processing similar to that of the second layer of wafer $W_{11}$ on a wafer included in a lot other than the lot including wafer $W_{11}$, a positioning target position may be decided so that the overlay error with the first layer is reduced, based on the data fed back.

Note that feedback of data may be performed, via host computer 2000.

Also, in step 318, in the case the absolute position coordinates for two or more marks are acquired for all shots on wafer $W_{11}$, and first information related to shape and size of each shot on the first layer and second information related to shape and size of each shot on the second layer can be acquired, the first information may be supplied (fed back) to the exposure apparatus that has performed exposure on the first layer and the second information may be supplied (fed back) to exposure apparatus 200 that has performed exposure on the second layer. In this case, image forming characteristic correction controller 248 may be controlled, or at least one of speed and direction of reticle stage RST may be controlled, so that the shape and size of each shot on the second layer take the form of a desired state.

Note that in the description above, while the overlay error (overlay displacement) between the first layer and the second layer is obtained based on the absolute position coordinates of the first mark image and the absolute position coordinates of the second mark image, data on the absolute position coordinates of the first mark image and data on the absolute position coordinates of the second mark image may be output from measurement system 500 as information on overlay error between the first layer and the second layer (position displacement between the first layer and the second layer). In this case, data output from measurement system 500 may be supplied (fed back) to one of the exposure apparatus (exposure apparatus 200 or another exposure apparatus) that has performed exposure on the first layer and exposure apparatus 200 that has performed exposure on the second layer.

Also, each of the position displacement between the first mark image and the second mark image that form a set with each other may be obtained based on the absolute position coordinates of the first mark image and the absolute position coordinates of the second mark image, and the positional displacement may be output from measurement system 500 as information on overlay error between the first layer and the second layer (position displacement between the first layer and the second layer). Also in this case, data output from measurement system 500 may be supplied (fed back) to one of the exposure apparatus (exposure apparatus 200 or another exposure apparatus) that has performed exposure on the first layer and exposure apparatus 200 that has performed exposure on the second layer.

As is obvious from the description above, with the overlay measurement method performed in substrate processing system 1000 according to the second embodiment, measurement system 500 can measure each of the absolute position coordinates of the first mark image and the absolute position coordinates of the second mark image, and can measure overlay error based on these absolute position coordinates. Also, an unconventional significant effect can be obtained in which the main cause of the overlay error can be specified to exposure of the lower layer or to exposure of the upper layer.

Note that in the description above, while overlay displacement measurement marks (the first mark image and the second mark image) were used to obtain the overlay error between the first layer and the second layer, wafer marks (alignment marks) may also be used. That is, the overlay error between the first layer and the second layer may be obtained from the absolute position coordinates of I wafer marks of the first layer and the absolute position coordinates of I wafer marks of the second layer.

Note that since the overlay error (overlay displacement) between the first layer and the second layer is obtained in step S320 described above, step S322 may be executed as necessary.

Also, in the description above, while measurement device $100_i$ of measurement system 500 acquires the absolute position coordinates of the first mark image (or wafer mark of the first layer) and the absolute position coordinates of the second mark image (or wafer mark of the second layer) of wafer $W_{11}$ that has been developed after the exposure processing of the second layer, measurement device $100_i$ of measurement system 500 may acquire the absolute position coordinates of the first mark image (or wafer mark of the first layer) of wafer $W_{11}$ that has been developed after the exposure processing of the first layer and before the exposure processing of the second layer, and measurement device $100_i$ of measurement system 500 may acquire the absolute position coordinates of the second mark image (or wafer mark of the second layer) of wafer $W_{11}$ that has been developed after the exposure processing of the second layer. In this case, the overlay error of the first layer and the second layer may be obtained by measurement system 500 (controllers $60_i$ and 530), or may be obtained by another apparatus (e.g., host computer 2000). Also, measurement device $100_i$ used for acquiring the absolute position coordinates of the first mark image (or wafer mark of the first layer) and measurement device $100_i$ used for acquiring the absolute position coordinates of the second mark image (or wafer mark of the second layer) may be different.

Also, wafer $W_{11}$ may be carried into measurement system 500 just before wafer $W_{11}$ that has gone through various processes (including etching processing and film deposition processing) is carried into C/D 300 (or another coater/developer) so that exposure processing is performed on the following layer of the second layer, and measurement device $100_i$ of measurement system 500 may acquire both the absolute position coordinates of the first mark image (or wafer mark of the first layer) and the absolute position coordinates of the second mark image (or wafer mark of the second layer) of wafer $W_{11}$, or the absolute position coordinates of the second mark image (or wafer mark of the second layer) of wafer $W_{11}$. Also in this case, the overlay error (position displacement between the first layer and the second layer) may be obtained by measurement system 500, or information on the absolute position coordinates acquired by measurement system 500 may be supplied from measurement system 500, and another apparatus (e.g., host computer 2000) may obtain the overlay error between the first layer and the second layer (position displacement between the first layer and the second layer). Also, information on the overlay error (position displacement between the first layer and the second layer) obtained by measurement system 500, or information on the absolute position coordinates acquired by measurement system 500 may be supplied to exposure apparatus 200, or to another exposure apparatus.

Note that in the description above, while measurement system 500 acquires information on the overlay error between the first layer and the second layer, the description is not limited to this, and the overlay error may be acquired for an $m^{th}$ layer (lower layer, m is an integral number of 1 or more) and an $n^{th}$ layer (upper layer, n is an integral number of 2 or more and is larger than m). In this case, the $n^{th}$ layer does not have to be the following layer of the $m^{th}$ layer.

Note that in the second embodiment described above, measurement device $100_i$ used for variation management of the wafer grid described above and measurement device $100_i$ used for overlay measurement may be different.

Note that in substrate processing system 1000 according to the second embodiment described above, while both variation management and overlay measurement of the wafer grid described above are performed, performing only either one is also acceptable.

Also, in substrate processing system 1000 according to the second embodiment described above, while measurement system 500 is not connected in-line with exposure apparatus 200 and C/D 300, measurement system 500 may be connected in-line with either exposure apparatus 200 or with C/D 300, or with both exposure apparatus 200 and C/D 300. For example, C/D 300 and measurement system 500 may be connected in-line so that C/D 300 is arranged in between exposure apparatus 200 and measurement system 500. Or, measurement system 500 may be connected in-line with both exposure apparatus 200 and C/D 300 so that measurement system 500 is arranged in between exposure apparatus 200 and C/D 300. In this case, measurement system 500 does not have to be equipped with carrier system 510.

Also, in the first and second embodiments described above, measurement system 500 does not have to be equipped with a plurality of measurement devices $100_i$. That is, measurement system 500 may be equipped with one measurement device, e.g., only measurement device $100_1$.

Note that in the first and second embodiments described above (hereinafter shortly referred to as each embodiment described above), the case has been described in which signal processor 49 that processes detection signals of mark detection system MDS equipped in measurement device $100_i$ (i=any one of 1 to 4) sends measurement results only of wafer marks whose waveforms of detection signals obtained as detection results of mark detection system MDS are favorable to controller $60_i$, and controller $60_i$ performs EGA operation using the measurement results of such wafer marks, and as a consequence, exposure controller 220 performs EGA operation using a part of position information of position information on wafer marks selected from the plurality of wafer marks whose waveforms of detection signals obtained as detection results of mark detection system MDS are favorable. However, the description is not limited to this, and signal processor 49 may send to controller $60_i$ measurement results of remaining wafer marks that exclude wafer marks whose waveform of detection signals obtained as detection results of mark detection system MDS are defective. Also, judgment of whether detection signals obtained as detection results of mark detection system MDS are favorable or not may be made by controller $60_i$ instead of signal processor 49, and also in this case, controller $60_i$ performs the EGA operation described earlier using only measurement results of the wafer marks whose detection signals are decided favorable or of the remaining wafer marks that exclude wafer marks whose detection signals are decided defective. Then, it is desirable for exposure controller 220 to perform EGA operation described earlier using measurement results of a part of wafer marks selected from measurement results of wafer marks used for EGA operation by controller $60_i$.

Note that in each embodiment described above, while the case is described in which C/D 300 is in-line connected to exposure apparatus 200, instead of C/D 300, a coating apparatus (coater) that coats a sensitive agent (resist) on a substrate (wafer) may be in-line connected to exposure apparatus 200. In this case, the wafer after exposure is to be carried into a developing apparatus (developer) that is not in-line connected to the exposure apparatus. Or, instead of C/D 300, the developing apparatus (developer) that develops the substrate (wafer) that has been exposed may be in-line connected to exposure apparatus 200. In this case, a wafer on which resist is coated in advance at a different place is to be carried into the exposure apparatus.

In each embodiment described above, while the case has been described in which the exposure apparatus is a scanning stepper, the description is not limited to this, and the exposure apparatus may be a static type exposure apparatus, or may be a reduction projection exposure apparatus of a step-and-stitch method that synthesizes shot areas. Furthermore, the embodiments described above can also be applied to a multi-stage type exposure apparatus that is equipped with a plurality of wafer stages as is disclosed in, for example, U.S. Pat. Nos. 6,590,634, 5,969,441, 6,208,407, and the like. Also, the exposure apparatus is not limited to a dry type exposure apparatus previously described that performs exposure of wafer W without going through liquid (water), and the exposure apparatus may be a liquid immersion type exposure apparatus that exposes a substrate via liquid as is disclosed in, for example, European Patent Application Publication No. 1420298, International Publication WO 2004/055803, International Publication WO 2004/057590, U.S. Patent Application Publication No. 2006/0231206, U.S. Patent Application Publication No. 2005/0280791, U.S. Pat. No. 6,952,253 and the like. Also, the exposure apparatus is not limited to an exposure apparatus used for manufacturing semiconductor devices, and for example, may be an exposure apparatus for liquid crystals used for transferring a liquid crystal display device pattern onto a square glass plate.

Semiconductor devices are manufactured through exposing a sensitive object using a reticle (mask) on which a pattern is formed with an exposure apparatus that structures a part of the substrate processing system according to each embodiment described above, and through a lithography step in which the sensitive object that has been exposed is developed. In this case, highly integrated devices can be manufactured at high yield.

Note that other than the lithography step, the manufacturing process of semiconductor devices may include steps such as; a step for performing function/performance design of a device, a step for making a reticle (mask) based on this design step, a device assembly step (including a dicing process, a bonding process, and a package process), and an inspection step.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A measurement system used in a manufacturing line for micro-devices, the measurement system comprising:
    a plurality of measurement devices being separate from and outside of any exposure apparatus used in the manufacturing line, each of the plurality of measurement devices performing measurement processing on a substrate;
    a carrying system used to perform delivery of the substrate;
    a carrier system that has at least one carrier mounting section capable of mounting a carrier configured to contain a plurality of substrates, the carrier system being provided separately from any exposure apparatus and the carrying system; and
    a controller configured to control the plurality of measurement devices, wherein
    the plurality of measurement devices includes a first measurement device and a second measurement device both of which are a same type of measurement device and are configured to perform plural types of measurement processing on the substrate, the first measurement device acquires position information of a plurality of marks formed on the substrate and the second measurement device performs measurement of a different type from the measurement performed by the first measurement device on the substrate to acquire information different from the position information acquired by the first measurement device, and
    the carrying system performs the delivery of the substrate between the first and the second measurement devices so that the first and the second measurement devices perform measurement to the same substrate in series and also perform the delivery of the substrate to and from the carrier system.

2. The measurement system according to claim 1, wherein
    the carrier system has a plurality of the carrier mounting sections arranged along a first direction, and
    the plurality of measurement devices is arranged along a second direction that intersects the first direction.

3. The measurement system according to claim 1, wherein
    the first measurement device acquires the position information of the plurality of marks formed on the substrate on which substrate processing of at least one of resist coating before exposure, developing after exposure, cleaning, oxidation/diffusion, film deposition, etching, ion implantation, and CMP has been performed.

4. The measurement system according to claim 1, wherein
    the second measurement device is configured to measure flatness information of a surface of the substrate, and
    the first measurement device and the second measurement device sequentially perform measurement of the position information of the plurality of marks and measurement of the flatness information of the surface of the substrate, with the same substrate serving as a measurement target.

5. The measurement system according to claim 1, wherein
    the first measurement device acquires the position information of the plurality of marks formed on the substrate on which exposure and developing processing have been performed.

6. The measurement system according to claim 5, wherein
    the plurality of marks is formed on a first layer on the substrate.

7. The measurement system according to claim 6, wherein
    information that is obtained based on the position information of the plurality of marks acquired using the first measurement device is output.

8. The measurement system according to claim 7, wherein
    the information that is output includes arrangement information of a plurality of divided areas formed on the substrate along with the plurality of marks.

9. The measurement system according to claim 7, wherein
    the information that is output is provided to an exposure apparatus used for exposure of the first layer.

10. The measurement system according to claim 6, wherein
    the position information of the plurality of marks on the substrate acquired using the first measurement device is output.

11. The measurement system according to claim 10, wherein
    the position information that is output is provided to an exposure apparatus used for exposure of the first layer.

12. The measurement system according to claim 5, wherein
    the plurality of marks include a plurality of marks formed on an mth layer (m is an integral number of 1 or more) and a plurality of marks formed on an nth layer (n is an integral number of 2 or more and is larger than m) of the substrate.

13. The measurement system according to claim 12, wherein
    each of the position information of the plurality of marks formed on the mth layer and the position information of the plurality of marks formed on the nth layer is output.

14. The measurement system according to claim 12, wherein
    information obtained based on the position information of the plurality of marks formed on the mth layer and the position information of the plurality of marks formed on the nth layer is output.

15. The measurement system according to claim 14, wherein
    the plurality of marks formed on the mth layer includes a first mark, and the plurality of marks formed on the nth layer includes a second mark corresponding to the first mark, and
    the information that is output includes information related to positional displacement between the first mark and the second mark.

16. The measurement system according to claim 14, wherein
    the information that is output includes information related to overlay displacement between the mth layer and the nth layer.

17. The measurement system according to claim 16, wherein
    a determination is made of whether the overlay displacement is caused mainly by the mth layer or the nth layer, based on the position information of the plurality of marks formed on the mth layer and the position information of the plurality of marks formed on the nth layer.

18. The measurement system according to claim 5, wherein
acquiring the position information using the first measurement device is performed before substrate processing that is conducted after the developing processing is performed on the substrate.

19. The measurement system according to claim 18, wherein
the substrate processing includes etching processing.

20. The measurement system according to claim 18, wherein
the substrate processing includes film deposition processing.

21. The measurement system according to claim 1, wherein
the first measurement device comprises:
a stage that is movable and configured to hold the substrate;
a drive system that moves the stage;
a first position measurement system configured to acquire position information of the stage; and
a mark detection system that detects a mark formed on the substrate, wherein
the controller controls movement of the stage by the drive system and detects each of the plurality of marks formed on the substrate using the mark detection system, and obtains an absolute position coordinate of each of the plurality of marks, based on detection results of each of the plurality of marks and position information of the stage obtained using the first position measurement system at a time of detection of each of the plurality of marks.

22. The measurement system according to claim 21, wherein
the first position measurement system is configured to acquire the position information of the stage in at least directions of three degrees of freedom.

23. The measurement system according to claim 21, wherein
the first position measurement system has one of a measurement surface having a grating section and a head section which irradiates the measurement surface with a beam, the one of the measurement surface and the grating section being provided in the stage, and the first position measurement system acquiring position information of the stage by irradiating the measurement surface with the beam from the head section and receiving a return beam from the measurement surface of the beam.

24. The measurement system according to claim 23, further comprising:
a base member in which the head section is provided; and
a second position measurement system which acquires relative position information between the mark detection system and the base member, wherein
the controller controls movement of the stage by the drive system, based on the relative position information acquired using the second position measurement system and the position information acquired using the first position measurement system.

25. The measurement system according to claim 24, wherein
the base member supports the stage movable in directions of six degrees of freedom which includes a first direction and a second direction orthogonal to each other in a predetermined plane and a third direction perpendicular to the predetermined plane, and
the second position measurement system is configured to acquire the relative position information in the directions of six degrees of freedom between the mark detection system and the base member.

26. The measurement system according to claim 25, wherein
the controller uses the relative position information between the mark detection system and the base member within the predetermined plane obtained using the second position measurement system as a correction amount, when obtaining the absolute position coordinates of the plurality of marks.

27. The measurement system according to claim 25, wherein
the grating section has a two-dimensional grating having a first periodic direction and a second periodic direction that intersect with each other within the predetermined plane,
the return beam from the measurement surface includes a diffraction beam from the grating section, and
the head section has a first head that irradiates the measurement surface with a first beam and receives a first diffraction beam from the grating section to measure the position information of the stage in the first periodic direction, a second head that irradiates the measurement surface with a second beam and receives a second diffraction beam from the grating section to measure the position information of the stage in the second periodic direction, and at least three third heads that irradiate the measurement surface with a third beam and receives a beam from the grating section to measure the position information of the stage in the third direction.

28. The measurement system according to claim 27, wherein
an irradiation point on the measurement surface of the first beam from the first head and an irradiation point on the measurement surface of the second beam from the second head are set to a same detection point positioned below a detection area of the mark detection system, and an irradiation point on the measurement surface of each of the at least three third heads is set in a periphery of the detection point.

29. The measurement system according to claim 28, wherein
the detection point is positioned directly below a detection center of the mark detection system, and an axis perpendicular to the predetermined plane passes through the detection point and the detection center.

30. The measurement system according to claim 27, wherein
the first periodic direction and the second periodic direction are orthogonal to each other.

31. The measurement system according to claim 30, wherein
one of the first periodic direction and the second periodic direction coincides with the first direction, and the other of the first periodic direction and the second periodic direction coincides with the second direction.

32. The measurement system according to claim 21, wherein
the controller performs statistical calculation using a plurality of the absolute position coordinates of the marks obtained, and obtains a correction amount from design values of an arrangement of the plurality of divided areas on the substrate.

33. The measurement system according to claim 21, wherein
the plurality of marks and a plurality of divided areas whose correspondence relation with the plurality of marks is known are formed simultaneously on the substrate by an exposure using a mask performed by an exposure apparatus, and
the controller obtains the absolute position coordinates of the plurality of marks along with obtaining an error caused by the exposure apparatus in an arrangement of the plurality of divided areas, based on the absolute position coordinates of the plurality of marks.

34. The measurement system according to claim 1, wherein
the plurality of marks includes alignment marks.

35. The measurement system according to claim 1, wherein
the plurality of marks includes marks used for overlay displacement measurement.

36. A substrate processing system, comprising:
the measurement system according to claim 1; and
an exposure apparatus that has a substrate stage on which the substrate that has completed measurement of position information of the plurality of marks by the first measurement device included in the measurement system is mounted, and to the substrate mounted on the substrate stage, performs alignment measurement in which position information of a part of marks selected from a plurality of marks on the substrate is acquired and exposure in which the substrate is exposed with an energy beam.

37. A device manufacturing method comprising:
exposing a substrate using the exposure apparatus of the substrate processing system according to claim 36, and
developing the substrate which has been exposed.

* * * * *